US010431566B2

(12) United States Patent
Sasaki et al.

(10) Patent No.: US 10,431,566 B2
(45) Date of Patent: Oct. 1, 2019

(54) APPARATUSES COMPRISING SEMICONDUCTOR DIES IN FACE-TO-FACE ARRANGEMENTS

(71) Applicant: Micron Technology, Inc., Boise, ID (US)

(72) Inventors: Dai Sasaki, Tokyo Inagi (JP); Mitsuaki Katagiri, Tokyo Nishitokyo (JP); Satoshi Isa, Tokyo Hino (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/056,250

(22) Filed: Aug. 6, 2018

(65) Prior Publication Data
US 2019/0013294 A1 Jan. 10, 2019

Related U.S. Application Data

(63) Continuation of application No. 15/644,383, filed on Jul. 7, 2017, now Pat. No. 10,115,709.

(51) Int. Cl.
*H01L 25/065* (2006.01)
*H01L 23/528* (2006.01)
(Continued)

(52) U.S. Cl.
CPC .......... *H01L 25/0657* (2013.01); *H01L 22/32* (2013.01); *H01L 23/528* (2013.01);
(Continued)

(58) Field of Classification Search
CPC .. H01L 25/0657; H01L 25/0652; H02L 22/32
See application file for complete search history.

(56) References Cited

U.S. PATENT DOCUMENTS 9,607,967 B1    3/2017 Shih
9,899,361 B2 *  2/2018 Kim ................... H01L 25/18
(Continued)

FOREIGN PATENT DOCUMENTS

KR    10-1538573      7/2015
TW    201705392       2/2017
(Continued)

OTHER PUBLICATIONS

U.S. Appl. No. 15/344,211, filed Nov. 4, 2016 by Yuki Miura.

*Primary Examiner* — Quoc D Hoang
(74) *Attorney, Agent, or Firm* — Wells St. John P.S.

(57) ABSTRACT

Some embodiments include an apparatus having a first chip and a second chip. Each of the first and second chips comprises a multilevel wiring structure and a redistribution wiring layer over the multilevel wiring structure. The redistribution wiring layers include redistribution wiring and pads electrically coupled to the redistribution wiring. The first chip is mounted above the second chip so that the redistribution wiring layer of the first chip faces the redistribution wiring layer of the second chip. The pad of the first chip faces the pad of the second chip, and is vertically spaced from the pad of the second chip by an intervening insulative region. The redistribution wiring of the second chip is electrically coupled to the redistribution wiring of the first chip through a bonding region.

12 Claims, 39 Drawing Sheets

(51) Int. Cl.
  *H01L 23/00*    (2006.01)
  *H01L 21/66*    (2006.01)
  *H01L 23/525*   (2006.01)

(52) U.S. Cl.
  CPC ............ *H01L 24/06* (2013.01); *H01L 23/525* (2013.01); *H01L 24/16* (2013.01); *H01L 24/32* (2013.01); *H01L 24/48* (2013.01); *H01L 24/73* (2013.01); *H01L 2224/02371* (2013.01); *H01L 2224/0401* (2013.01); *H01L 2224/04042* (2013.01); *H01L 2224/05553* (2013.01); *H01L 2224/05554* (2013.01); *H01L 2224/06138* (2013.01); *H01L 2224/16145* (2013.01); *H01L 2224/32145* (2013.01); *H01L 2224/48106* (2013.01); *H01L 2224/48227* (2013.01); *H01L 2224/73207* (2013.01); *H01L 2224/73253* (2013.01); *H01L 2224/73265* (2013.01); *H01L 2225/0651* (2013.01); *H01L 2225/06513* (2013.01); *H01L 2225/06558* (2013.01); *H01L 2225/06562* (2013.01); *H01L 2225/06586* (2013.01); *H01L 2924/00014* (2013.01)

(56) References Cited

U.S. PATENT DOCUMENTS

| | | | |
|---|---|---|---|
| 9,966,361 | B1 | 5/2018 | Tuominen et al. |
| 10,115,709 | B1 * | 10/2018 | Sasaki ................. H01L 25/0657 |
| 2004/0251529 | A1 | 12/2004 | Lee et al. |
| 2014/0339704 | A1 | 11/2014 | Ahn et al. |
| 2015/0221601 | A1 | 8/2015 | Kim et al. |
| 2015/0357298 | A1 | 12/2015 | Jang et al. |
| 2016/0086921 | A1 | 3/2016 | Cho |
| 2016/0379960 | A1 | 12/2016 | Huang et al. |
| 2017/0033080 | A1 | 2/2017 | Chen et al. |
| 2017/0092617 | A1 | 3/2017 | Wu et al. |
| 2017/0141092 | A1 | 5/2017 | Kim et al. |
| 2018/0130739 | A1 | 5/2018 | Miura et al. |

FOREIGN PATENT DOCUMENTS

| | | |
|---|---|---|
| TW | 201721819 | 6/2017 |
| TW | 201724413 | 7/2017 |
| TW | 1017114136 | 12/2018 |
| TW | 1017114136 | 2/2019 |
| WO | WO 2017/052652 | 3/2017 |
| WO | PCT/US2018/025734 | 7/2018 |

* cited by examiner

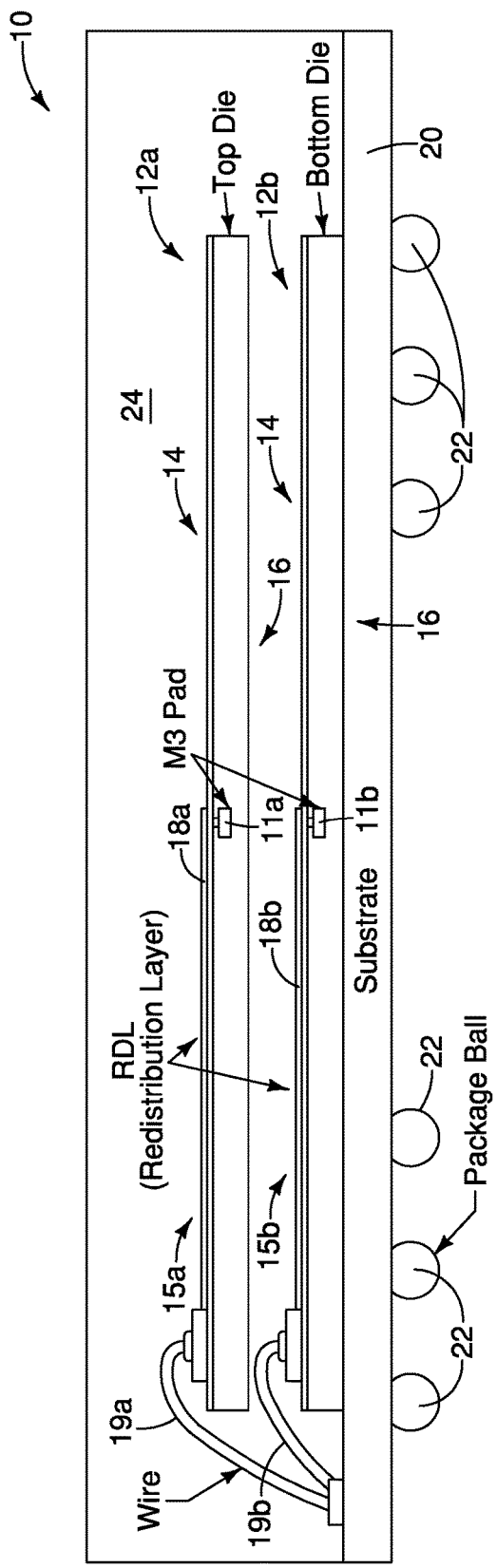
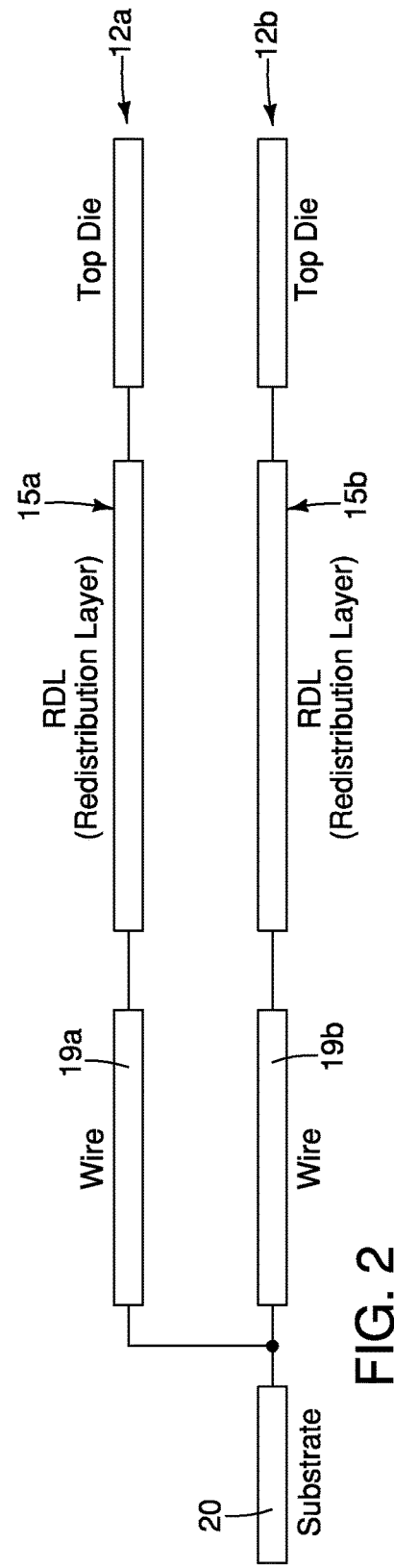
FIG. 1 (Prior Art)
FIG. 2 (Prior Art)

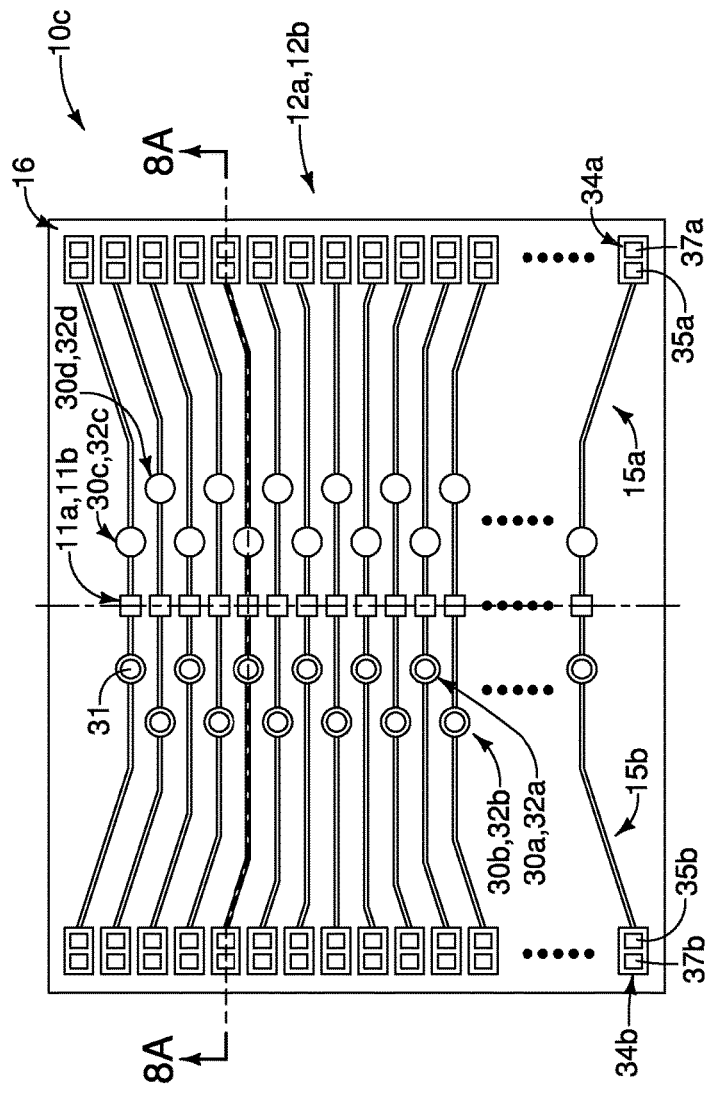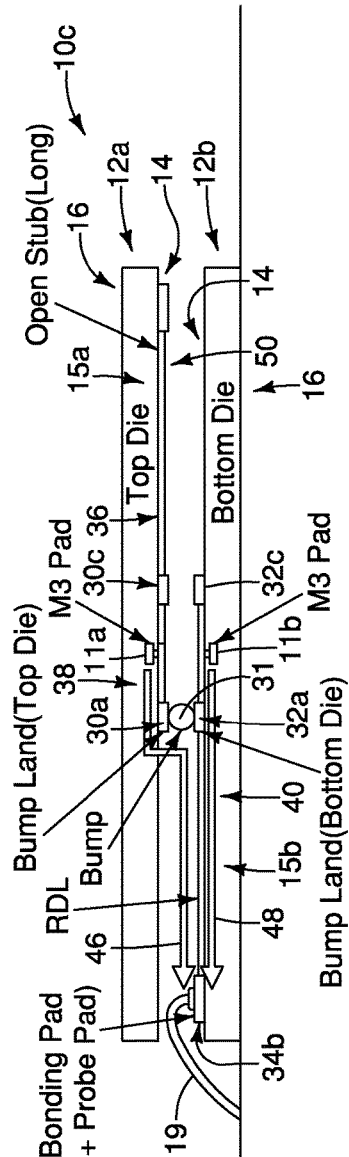
FIG. 8
FIG. 8A

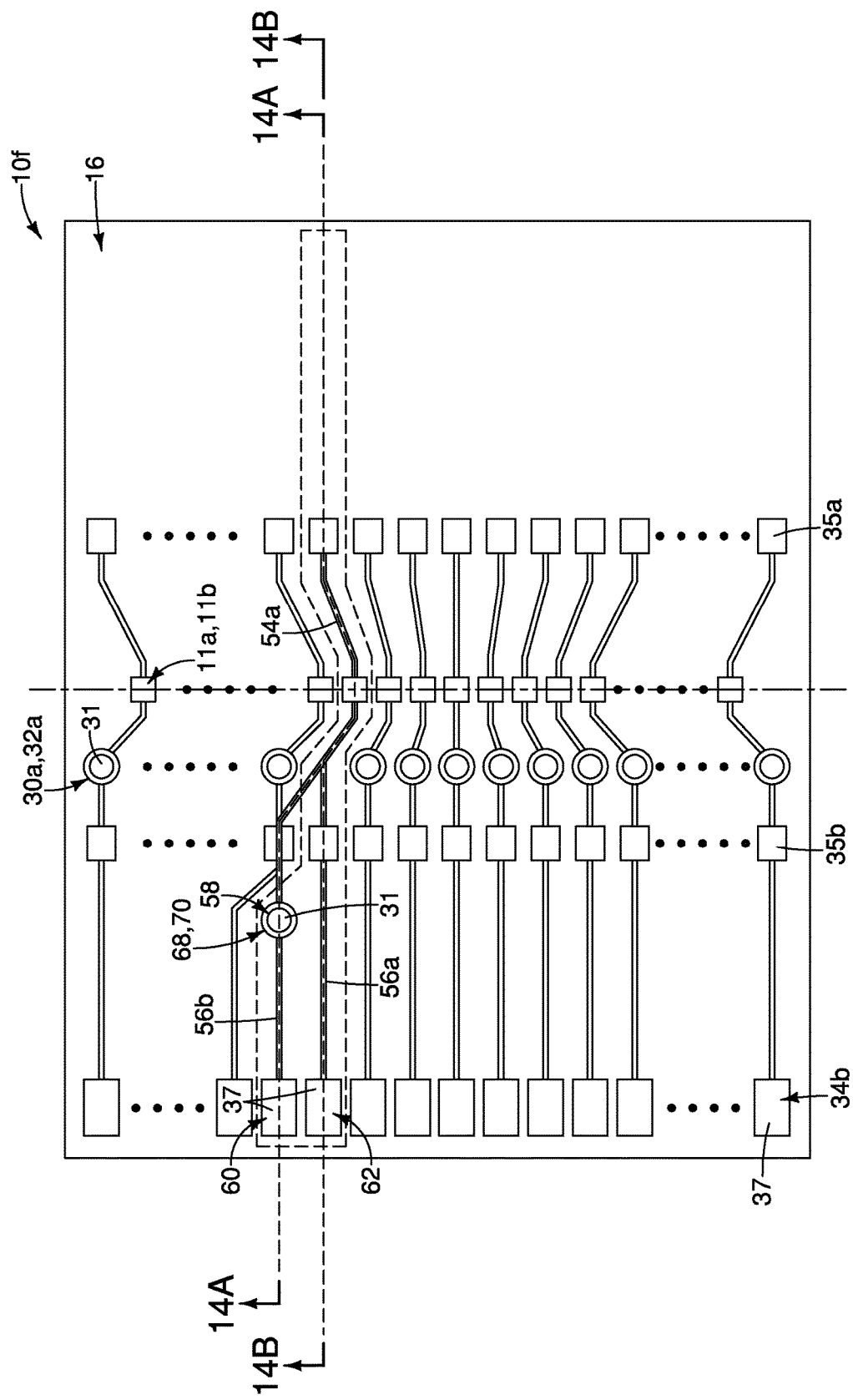

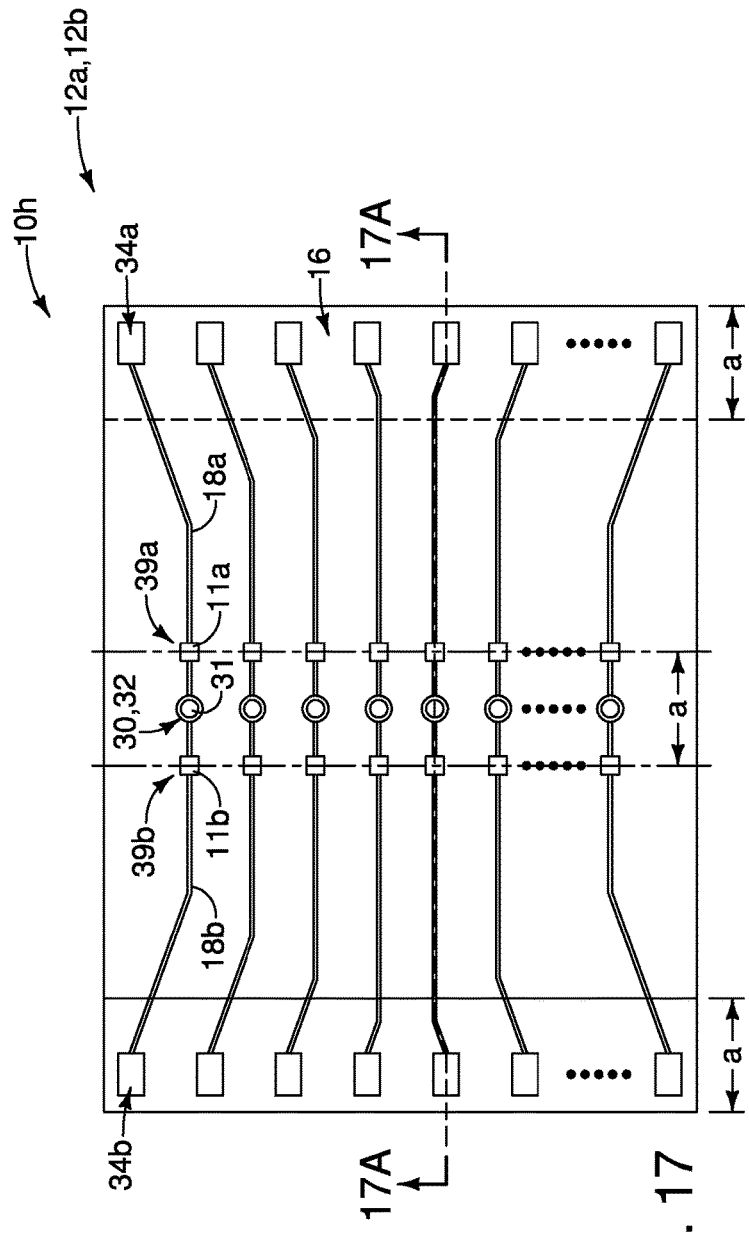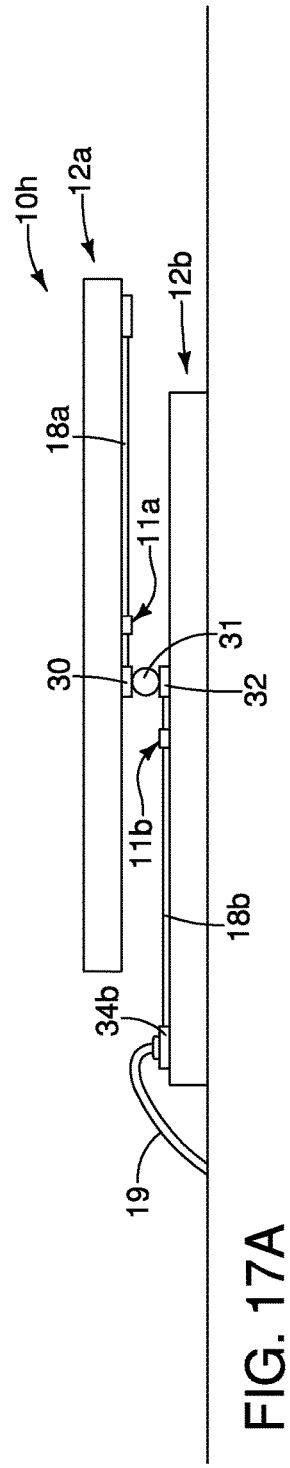

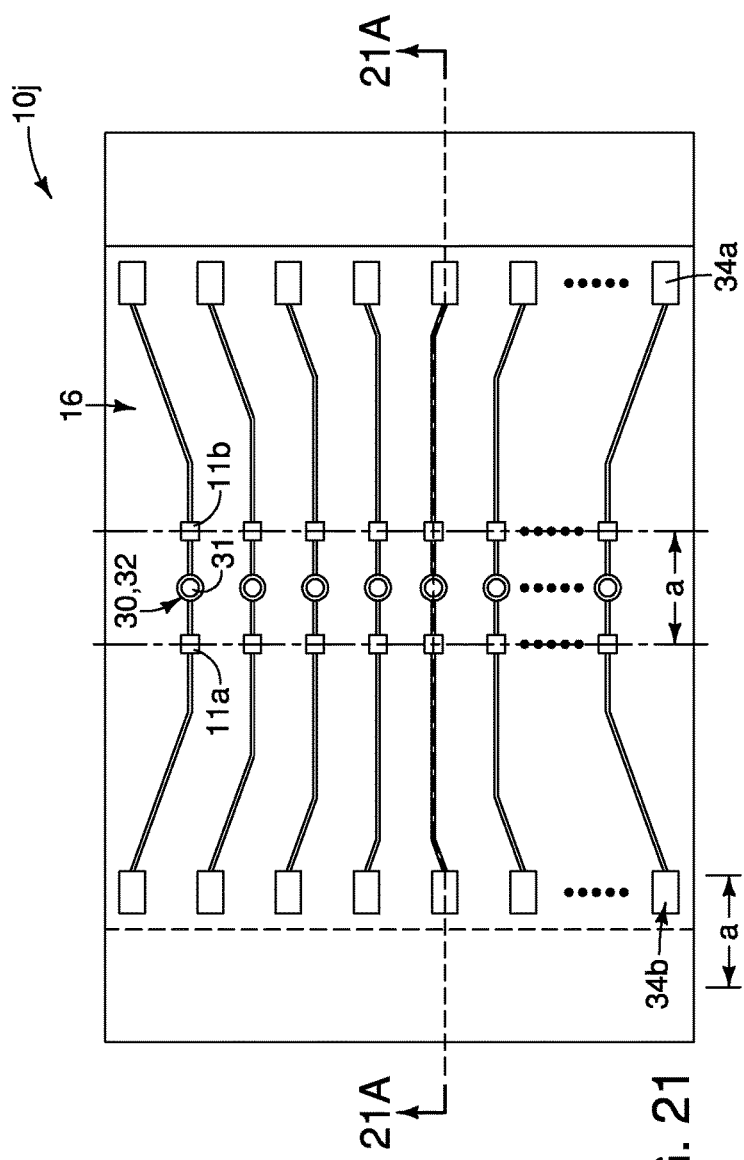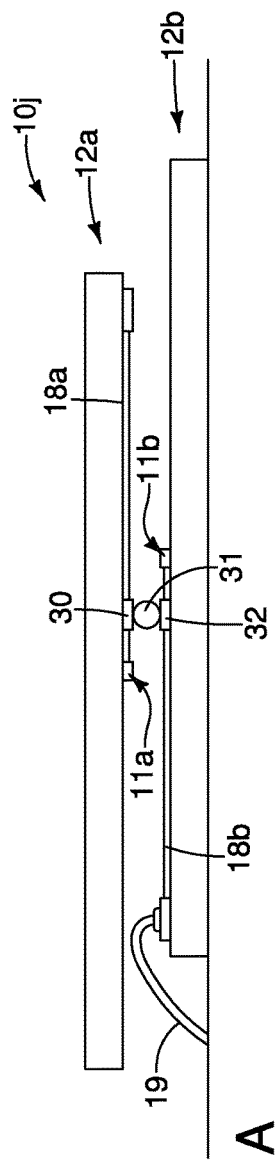
FIG. 21
FIG. 21A

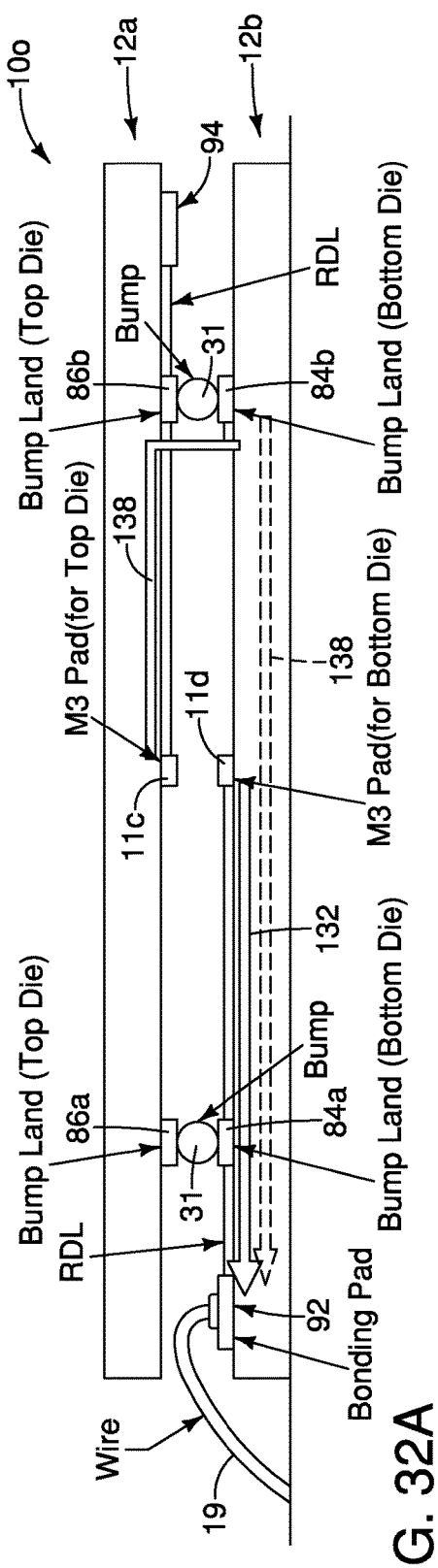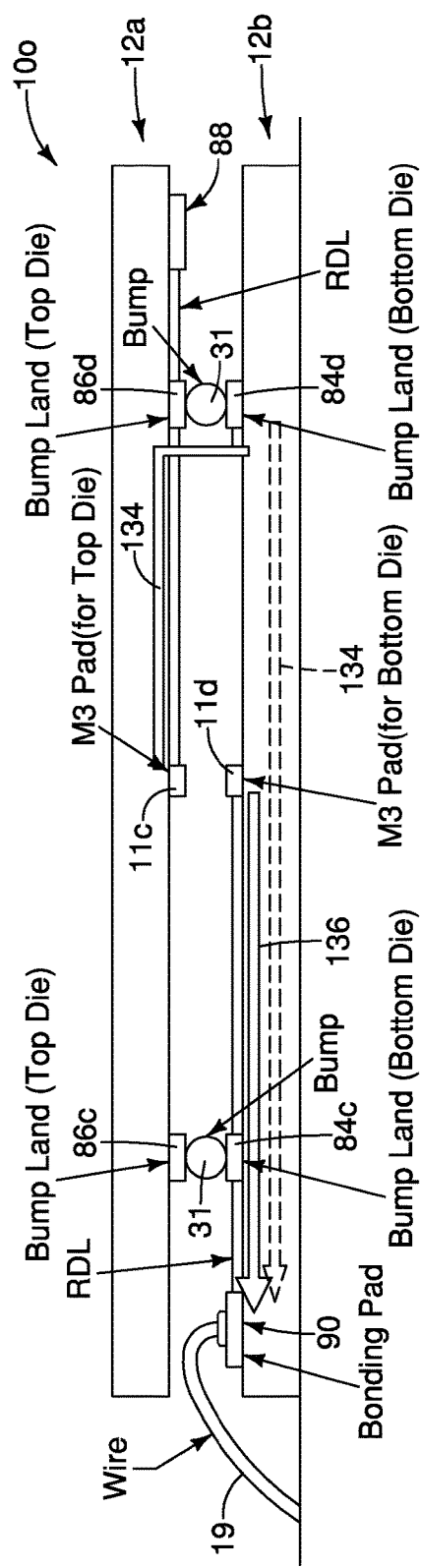
FIG. 32A
FIG. 33A

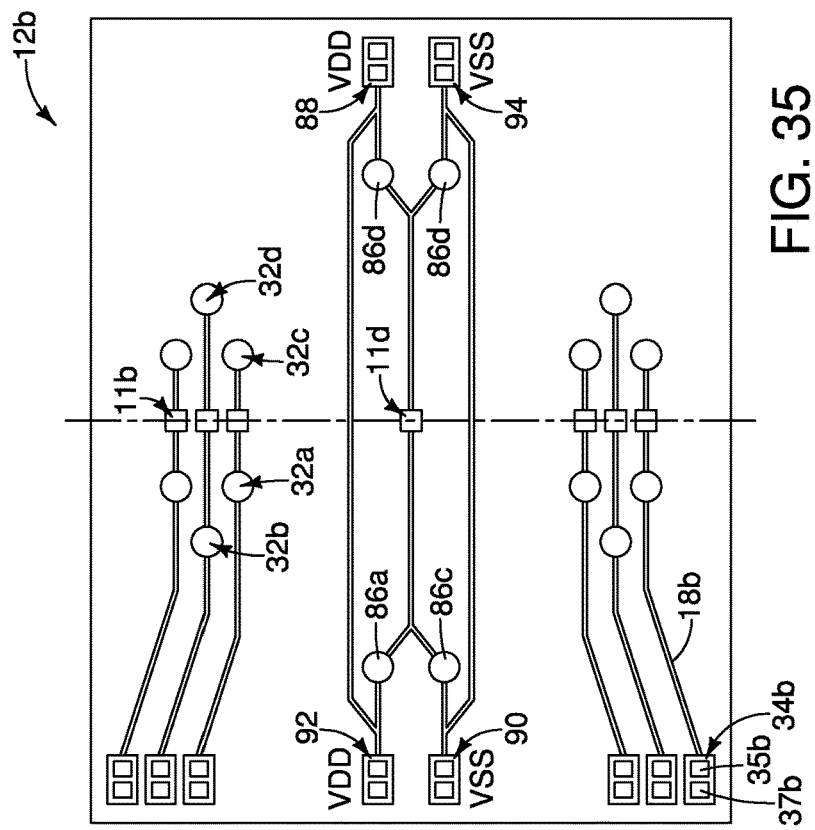
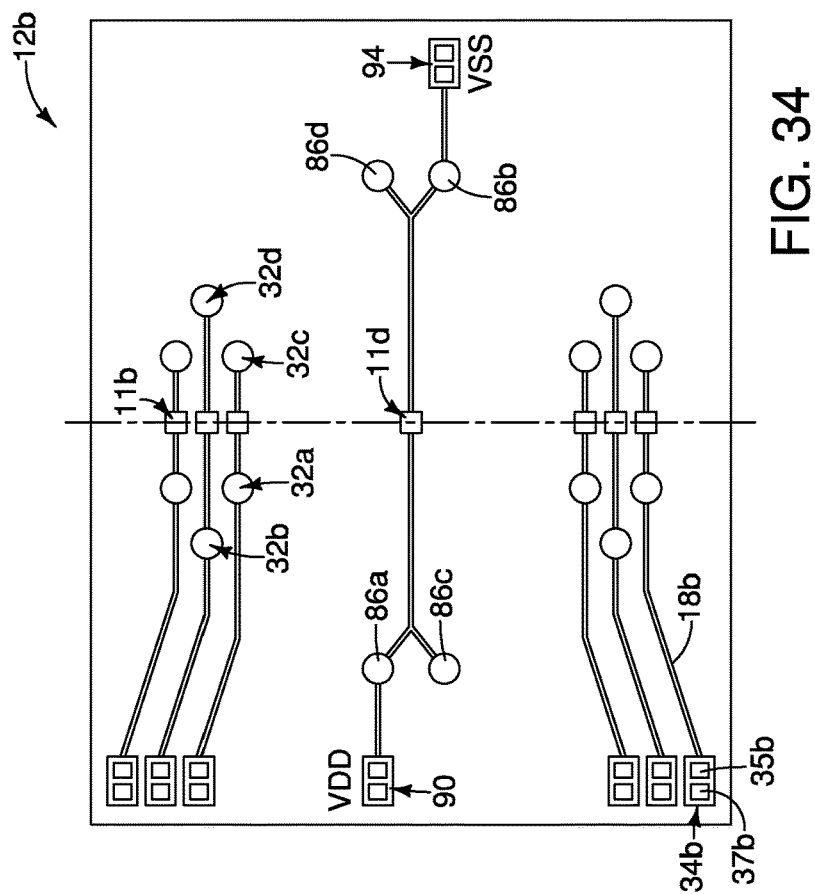

APPARATUSES COMPRISING SEMICONDUCTOR DIES IN FACE-TO-FACE ARRANGEMENTS

RELATED PATENT DATA

This patent resulted from a continuation of U.S. patent application Ser. No. 15/644,383, which was filed Jul. 7, 2017, and which is hereby incorporated herein by reference.

TECHNICAL FIELD

Apparatuses comprising semiconductor dies arranged in face-to-face relationship with one another.

BACKGROUND

Semiconductor dies (i.e., chips) may comprise memory, logic, sensors, etc. A semiconductor die may be utilized singly, or may be utilized in combination with other semiconductor dies. In some applications, two or more semiconductor dies may be combined in a single packaged assembly. FIG. 1 shows an example prior art packaged assembly 10 which comprises a pair of semiconductor dies 12a and 12b. The dies may be identical to one another, or may be different relative to one another. The dies 12a and 12b may be referred to as a top die and a bottom die, respectively, in that the die 12a is above the die 12b.

Each of the dies 12a, 12b has a face side 14 and a bottom side 16, with the face side comprising most of the significant circuitry. Each of the dies also has a so-called M3 pad 11a, 11b, which is an interconnection region associated with the die. The M3 pad 11a, 11b of each die is part of a redistribution wiring layer (RDL) 15a, 15b that extends along the face of the die and couples with wires (or other suitable connections) 19a, 19b. The redistribution wiring layer 15a, 15b of each die 12a, 12b may be considered to include redistribution wiring 18a, 18b and the M3 pad 11a, 11b coupled with such redistribution wiring 18a, 18b.

The M3 pads 11a, 11b may be utilized for testing of the dies, and it may be desired to have access to the M3 pads 11a, 11b in order to ascertain integrity of each die before completion of the packaged assembly 10. For instance, it may be desired that the M3 pads 11a, 11b be of sufficient size and be otherwise suitably accessible for coupling with an access probe at some time prior to completion of the packaged assembly 10 so that each of the dies 12a and 12b may be tested. The dies 12a, 12b may then be repaired or replaced if found to be unsatisfactory, prior to finalization of the packaged assembly 10.

The dies are supported by a substrate 20. Such substrate has interconnects 22 (indicated to be package balls) on an exterior of the package 10. The interconnects 22 may comprise solder balls, or any other structure suitable for electrically coupling the package 10 with circuitry external of the package. Also, additional interconnects extend through the substrate (such additional interconnects are not shown) and electrically couple the interconnects 22 with circuitry associated with the dies 12a and 12b. Such additional interconnects may, for example, electrically couple the wires 19a, 19b with the interconnects 22, and may thereby electrically couple the wires 19a, 19b (and associated redistribution wiring layers 15a, 15b) with circuitry external of the package 10.

The dies 12a, 12b may comprise any suitable semiconductor material, and in some embodiments may comprise silicon.

The substrate 20 may comprise any suitable material, and in some embodiments may comprise a polymeric circuit board.

An insulative material 24 extends over and between the dies 12a and 12b. Such insulative material may comprise any suitable composition or combination of compositions.

The assembly 10 of FIG. 1 has each of the dies 12a and 12b in a face-up orientation, and provides a separate connection 19 from the redistribution wiring layers to circuitry associated with the substrate 20 (such circuitry is not shown in FIG. 1, but is known to persons of ordinary skill).

FIG. 2 shows the prior art construction of FIG. 1 in a more simplistic view so that relevant relationships may be more clearly understood. Specifically, each of the semiconductor dies 12, 12b is shown to include a redistribution wiring layer 15a, 15b; and the redistribution wiring layers 15a, 15b are shown to couple to circuitry associated with the substrate 20 through the wires 19a, 19b.

It would be desirable to develop improved multi-die assemblies configured to enable suitable access to M3 pads (or equivalent interconnection regions), and which enable rapid electrical access to the semiconductor dies within the assemblies.

BRIEF DESCRIPTION OF THE DRAWINGS

FIG. 1 is a diagrammatic cross-sectional side view of a prior art assembly comprising a pair of semiconductor dies, and FIG. 2 is a simplified view of the prior art assembly of FIG. 1.

FIG. 8 is a diagrammatic top-down view of the two dies of FIG. 7 stacked one atop another in a face-to-face arrangement, and schematically illustrates overlap of the circuitry of the two dies along an interface where the faces of the two dies are joined to one another. The circuitry is illustrated as if viewed through all materials and structures that may be over the circuitry, including the back-side surface of the top die.

FIG. 8A is a diagrammatic cross-sectional side view along the line 8A-8A of FIG. 8.

FIG. 14 is a diagrammatic top-down view of the two dies of FIG. 13 stacked one atop another in a face-to-face arrangement, and schematically illustrates overlap of the circuitry of the two dies along an interface where the faces of the two dies are joined to one another. The circuitry is illustrated as if viewed through all materials and structures that may be over the circuitry, including the back-side surface of the top die.

FIG. 17 is a diagrammatic top-down view of the two dies of FIG. 16 stacked one atop another in a face-to-face arrangement, and schematically illustrates overlap of the circuitry of the two dies along an interface where the faces of the two dies are joined to one another. The circuitry is illustrated as if viewed through all materials and structures that may be over the circuitry, including the back-side surface of the top die.

FIG. 17A is a diagrammatic cross-sectional side view along the line 17A-17A of FIG. 17.

FIG. 21 is a diagrammatic top-down view of the two dies of FIG. 20 stacked one atop another in a face-to-face arrangement, and schematically illustrates overlap of the circuitry of the two dies along an interface where the faces of the two dies are joined to one another. The circuitry is illustrated as if viewed through all materials and structures that may be over the circuitry, including the back-side surface of the top die.

FIG. 21A is a diagrammatic cross-sectional side view along the line 21A-21A of FIG. 21.

FIGS. 27 and 28 schematically illustrate overlap of the circuitry of the two dies along an interface where the faces of the two dies are joined to one another. The circuitry is illustrated as if viewed through all materials and structures that may be over the circuitry, including the back-side surface of the top die.

FIGS. 30-33 schematically illustrate overlap of the circuitry of the two dies along an interface where the faces of the two dies are joined to one another. The circuitry is illustrated as if viewed through all materials and structures that may be over the circuitry, including the back-side surface of the top die.

FIGS. 30A, 31A, 32A and 33A are diagrammatic cross-sectional side views along the lines 30A-30A of FIG. 30, 31A-31A of FIG. 31, 32A-32A of FIGS. 32 and 33A-33A of FIG. 33, respectively.

FIGS. 34 and 35 are diagrammatic views of example semiconductor dies that may be utilized for the bottom die of a face-to-face die assembly in some embodiments.

DETAILED DESCRIPTION OF THE ILLUSTRATED EMBODIMENTS

In some embodiments, apparatuses are configured to have a pair of semiconductor dies oriented in face-to-face relationship with one another while still enabling suitable access to M3 pads associated with the dies. The face-to-face relationship may enable a single redistribution wiring layer to be utilized for accessing each of the dies, which may improve access speeds as compared to prior art configurations of the type described above with reference to FIG. 1 in which the dies are in a back-to-face relationship. Example embodiments are described with reference to FIGS. 3-35.

Figure 3:
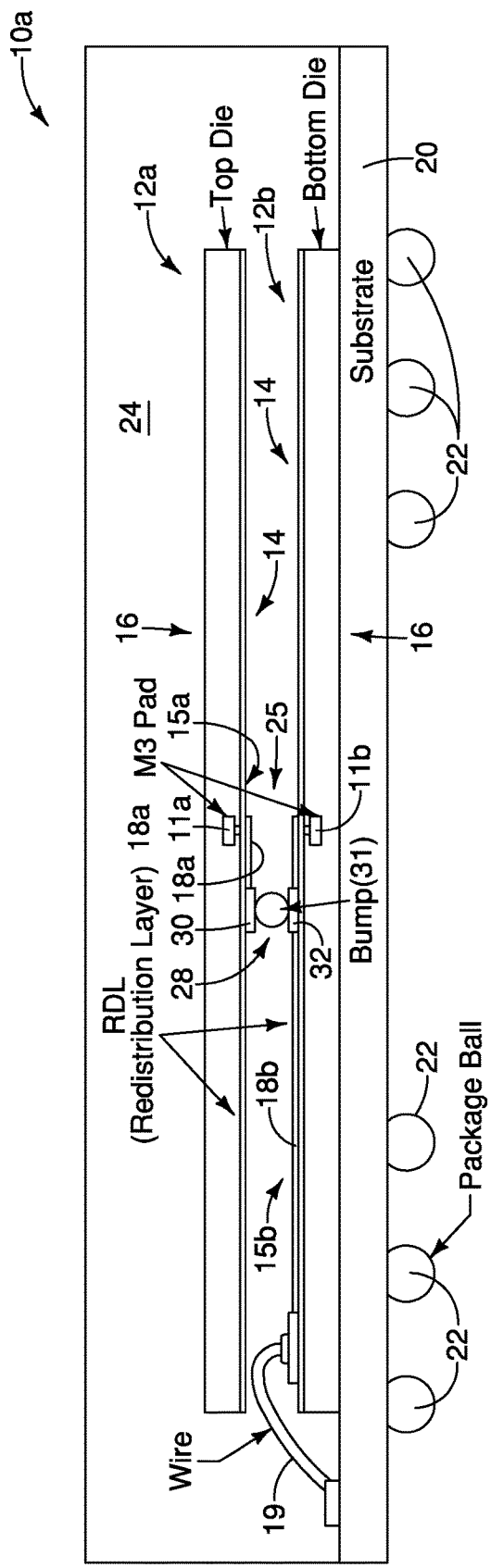
FIG. 3 is a diagrammatic cross-sectional side view of an example assembly comprising a pair of semiconductor dies.

Referring to FIG. 3, an example packaged assembly 10a includes a pair of semiconductor dies (or chips) 12a,12b. The dies 12a, 12b are identical to those discussed above with reference to FIG. 1, and each of the dies has the face side 14 and the bottom side 16. However, in contrast to the arrangement of FIG. 1, the dies of FIG. 3 are arranged in a face-to-face orientation.

In some embodiments, the die 12a may be referred to as a first chip (or first die), and the die 12b may be referred to as a second chip (or second die). The first chip 12a is mounted above the second chip 12b so that the redistribution wiring layer 18a of the first chip 12a faces the redistribution wiring layer 18b of the second chip 12b. The M3 pad 11a of the first chip 12a faces the M3 pad 11b of the second chip 12b, and is vertically spaced from the M3 pad 11a by an intervening region 25. Such intervening region 25 may be filled with insulative material, such as, for example, the insulative material 24.

The redistribution wiring 18a of the first chip 12a is electrically coupled to the redistribution wiring 18b of the second chip 12b through a bonding region 28. In the illustrated embodiment, the bonding region 28 includes a conductive bump 31 which electrically couples a pad 30 associated with the redistribution wiring layer 15a of the first chip 12a with an analogous pad 32 associated with the redistribution wiring layer 15b of the second chip 12b. The conductive bump 31 may comprise any suitable material, and in some embodiments may comprise solder. The conductive bump 31 is an example conductive interconnect suitable for utilization in the bonding region 28, and in other embodiments such conductive bump may be replaced with another suitable conductive interconnect.

The electrical coupling of the redistribution wiring layer 15a with the redistribution wiring layer 15b enables a single wire 19 to be utilized for accessing the redistribution wiring layers 15a, 15b. In some aspects, it may be considered that the M3 pad 11a is electrically coupled to the M3 pad 11b through the redistribution wiring 18a, the redistribution wiring 18b, and the bonding region 28.

Figure 4:
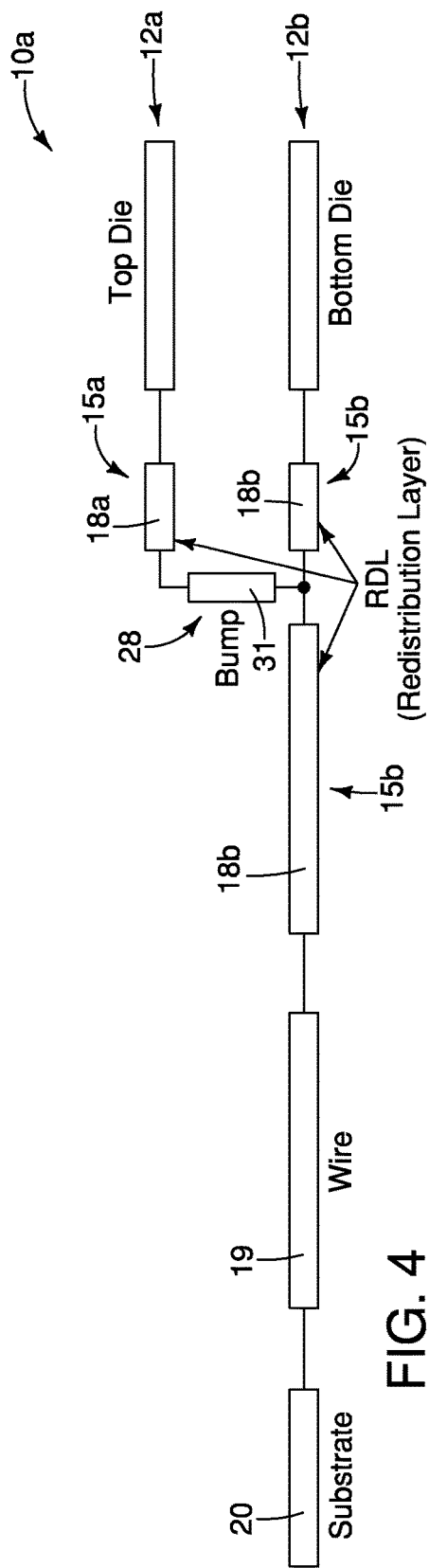
FIG. 4 is a simplified view of the assembly of FIG. 3.

FIG. 4 shows the construction 10a of FIG. 3 in a more simplistic view so that relevant relationships may be more clearly understood. The redistribution wiring layer 15a of the top die (i.e., first chip) 12a is electrically coupled to the redistribution wiring layer 15b of the bottom die (i.e., second chip) 12b through the bonding region 28. The redistribution wiring layer 15b is then electrically coupled to the substrate 20 through the wire 19. Notably, in the embodiment of FIGS. 3 and 4, a single wire may be utilized for accessing the redistribution wiring layers 15a, 15b of both of the chips 12a, 12b. Such may simplify fabrication of the assembly 10a of FIGS. 3 and 4 relative to the prior art assembly 10 of FIGS. 1 and 2 in that there are fewer wire connections to made during fabrication of the packaged chip. Further, the design of FIGS. 3 and 4 may enable higher access speeds relative to the chips 12a, 12b as compared to the design of FIGS. 1 and 2 in that wiring may be shared, and wiring distances may be reduced, which may enable faster data transfer to and from circuitry associated with the chips 12a, 12b.

Figure 5:
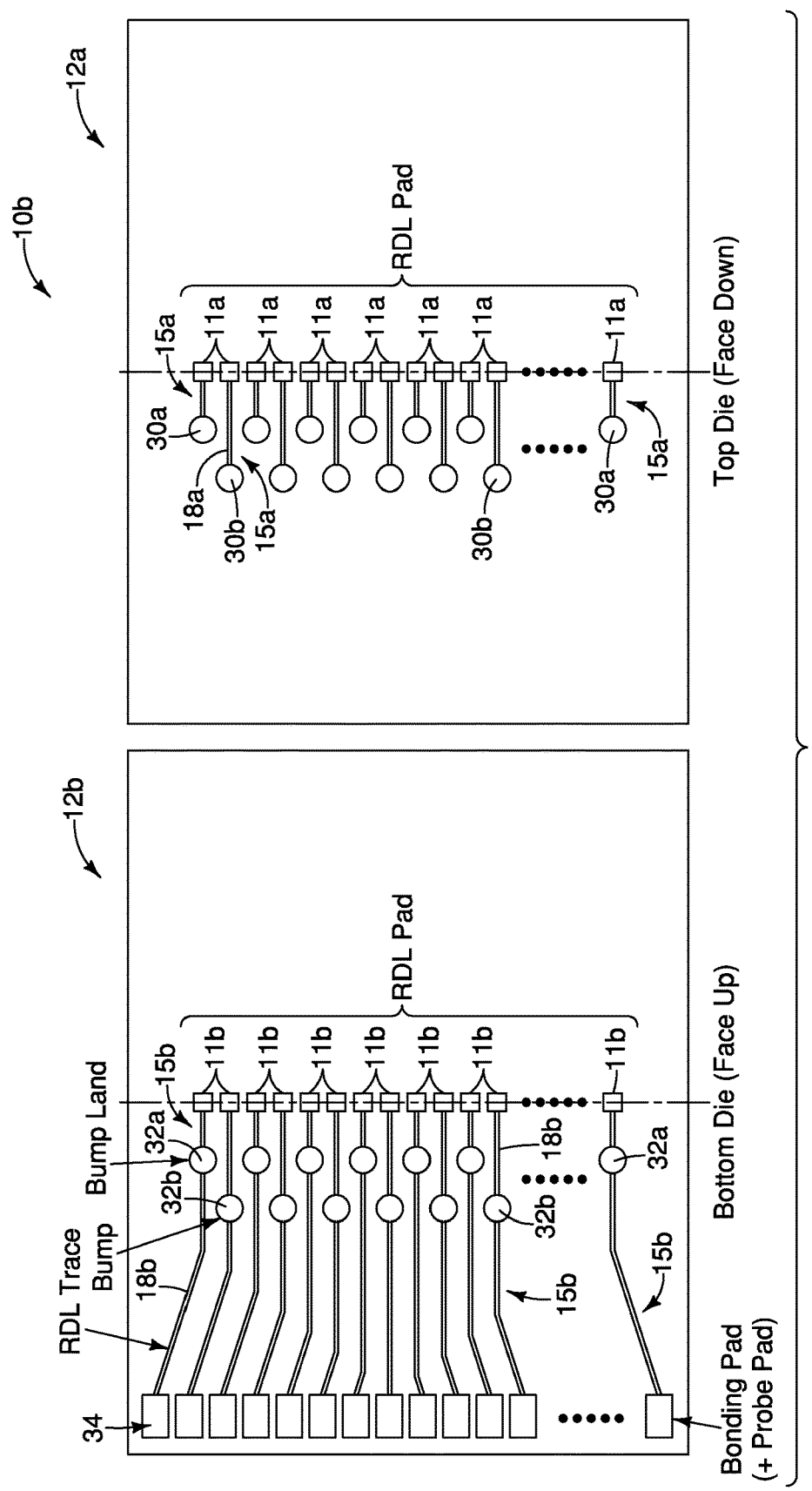
FIG. 5 is a diagrammatic view of an example semiconductor die that may be utilized for the bottom die of the assembly of FIG. 3 (left side die), and a diagrammatic view an example semiconductor die that may be utilized for the top die of the assembly of FIG. 3 (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 5.

In some embodiments, the redistribution wiring layer 15a and/or the redistribution wiring layer 15b may include pads offset toward the edges of the chips. For instance, FIG. 5 shows semiconductor dies 12a, 12b of an assembly 10b. The dies are configured so that they may be assembled in a face-to-face relationship analogous to that of FIG. 3. The bottom die 12b is illustrated in a face-up orientation, and the top die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The die 12a has coupling regions 30a, 30b; with the coupling regions 30a being laterally offset relative to the coupling regions 30b. Analogously, the die 12b has coupling regions 32a, 32b; with the coupling regions 32a being laterally offset relative to the coupling regions 32b. When the dies are in face-to-face relationship, the coupling regions 30a align with the coupling regions 32a, and the coupling regions 30b align with the coupling regions 32b. Solder bumps or other suitable interconnects may be formed to interconnect coupling regions 30a with coupling regions 32a, and to interconnect coupling regions 30b with coupling regions 32b. The regions 30a, 30b, 32a and 32b may be referred to as landings, or in some specific embodiments as bump landings, to indicate that they are locations where bumps or other suitable coupling components interconnect with the redistribution wiring layers 15a, 15b.

In the illustrated embodiment, the redistribution wiring layers 15b of the bottom die 12b extend to bonding pads 34. Such bonding pads may be suitable for coupling with wires 19 of the type described above with reference to FIG. 3 and/or for coupling with a testing probe during testing of the dies 12a, 12b. Although the bonding pads 34 are only shown to be associated with the redistribution wiring layers 15b of the bottom die 12b, in other embodiments analogous bonding pads may be formed to be associated with the redistribution wiring layers 15a of the upper die 12a.

The dies 12a, 12b may have any suitable configuration, and in some embodiments may have similar, or substantially identical, configurations to one another. The term "substantially identical" means identical to within reasonable tolerances of fabrication and measurement.

Figure 6:
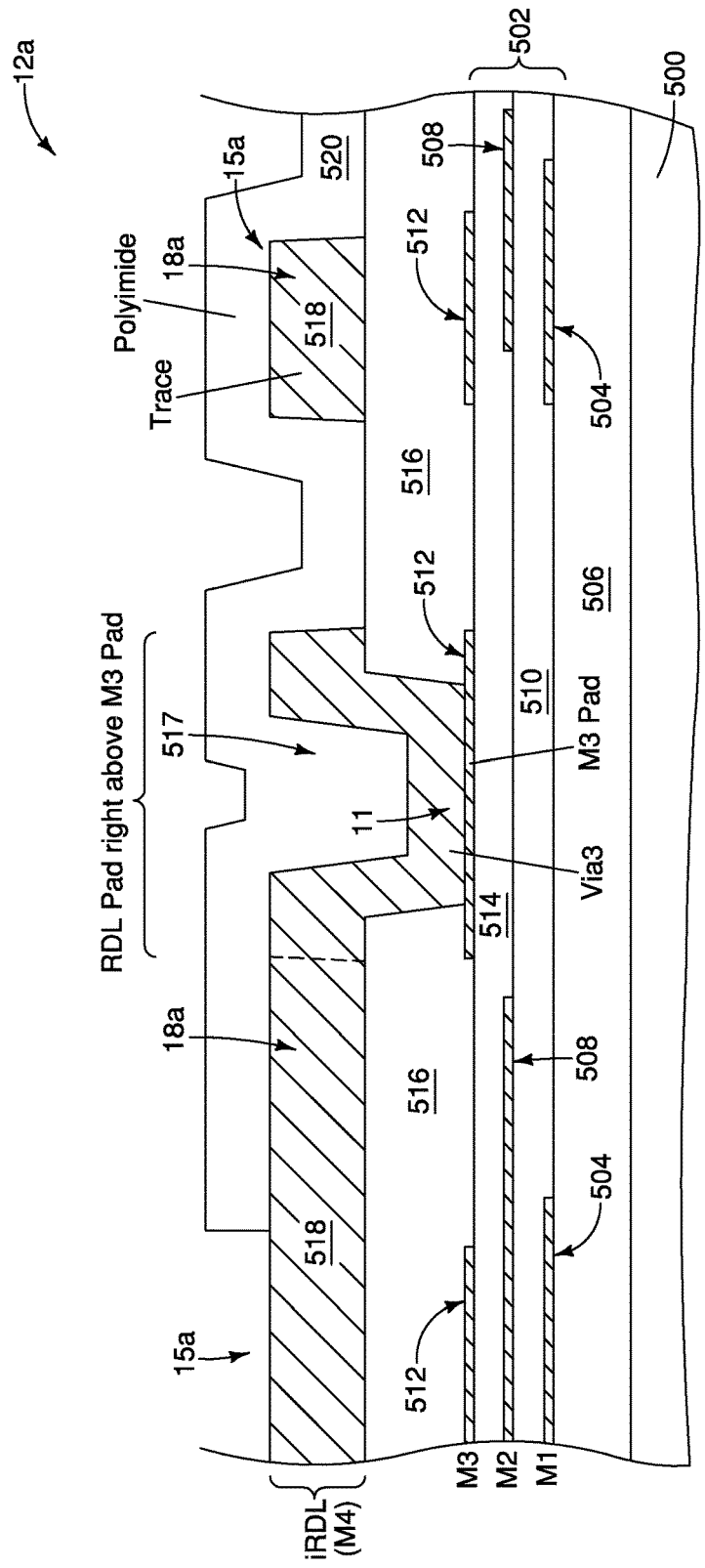
FIG. 6 is a diagrammatic cross-sectional side view of an example face-side region of an example die showing example circuitry and materials that may be along the face-side region.

FIG. 6 shows an example configuration for die 12a. The die 12a comprises a base 500, supporting a multilevel wiring structure 502.

The base 500 may comprise semiconductor material; and may, for example, comprise, consist essentially of, or consist of monocrystalline silicon. The base 500 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 500 may correspond to a semiconductor substrate containing one or more materials associated with integrated circuit fabrication. Such materials may include, for example, one or more of refractory metal materials, barrier materials, diffusion materials, insulator materials, etc.

The multilevel wiring structure 502 comprises first, second and third wiring levels M1, M2 and M3 (which may be alternatively referred to as first, second and third level wiring layers). The first wiring level MI includes wiring structures 504 supported over an insulative material 506; the second wiring level M2 includes wiring structures 508 supported over an insulative material 510; and the third wiring level M3 includes wiring structures 512 supported over an insulative material 514. The insulative materials 506, 510 and 514 may comprise any suitable compositions or combinations of compositions; and in some embodiments may comprise oxide, such as, for example, silicon dioxide. The insulative materials 506, 510 and 514 may all comprise a common composition, or at least one of the insulative materials may be of a different composition relative to at least one other of the insulative materials. The wiring structures 504, 508 and 512 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The wiring structures 504, 508 and 512 may all comprise a common composition, or at least one of wiring structures may be of a different composition relative to at least one other of the wiring structures.

In some embodiments, the multilevel wiring structure 502 may be considered to comprise at least two wiring levels (e.g., wiring levels M2 and M3), and an insulating film between the wiring levels (e.g., insulative material 514). The levels of the multilevel wiring structure are not limited to the wiring levels M1 to M3. For example, four or more wiring levels may be provided as the multilevel wiring structure such that Mn (where n is an integer of at least 5) is an iRDL (where iRDL is an in-line redistribution layer described below) in some example applications of embodiments of this disclosure.

The wiring level M3 includes a first region of the M3 pad 11. Insulative material 516 is over the wiring level M3, with such insulative material 516 having an opening 517 extending therethrough to the first region of the M3 pad 11. The insulative material 516 may comprise any suitable composition; such as, for example, silicon dioxide.

The redistribution wiring layer 15a extends over the insulative material 516, and within the opening 517 to contact the pad 11. The redistribution wiring layer 15a comprises conductive material 518, and may be referred to as a fourth wiring level M4 (or alternatively as a fourth level wiring layer). Conductive material 518 may comprise any suitable electrically conductive material, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material may comprise aluminum. The redistribution wiring layer 15a may be considered to comprise redistribution wiring 18a extending across the insulative material 516, and to comprise a second region of the M3 pad 11 corresponding to the material 518 within opening 517.

A portion of the redistribution wiring 18a extending across the insulative material 516 may be considered to correspond to an in-line redistribution wiring layer (iRDL), as shown. It may assist the reader in understanding the term "iRDL" to note that this may be contrasted with iRDL which refers to a redistribution layer (RDL) provided prior to a wafer probe test. The technology (iRDL) for forming RDL in the front end of a process may make it possible to inspect wafers after RDL formation. Inspection pads (RDL Pad for inspection) can be formed in the vicinity of bond pad at the chip end by RDL, for example. This can avoid applying an inspection probe to the metal pad formed in the front end and disposed in the center of the chip. Therefore, it may be possible to reduce the pad size and to increase the area available for arranging peripheral circuits.

Protective material 520 is formed across portions of the redistribution wiring layer 15a. The protective material 520 may comprise polyimide and/or any other suitable composition.

Although FIG. 6 shows the die 12a, it is to be understood that the die 12b may have a configuration similar to, or substantially identical to, the illustrated configuration of the die 12a in some embodiments. Also, it is to be understood that the illustrated configuration of FIG. 6 is an example configuration, and that the dies 12a, 12b may have any suitable configurations, including, but not limited to, the example configuration of FIG. 6.

Figure 7:
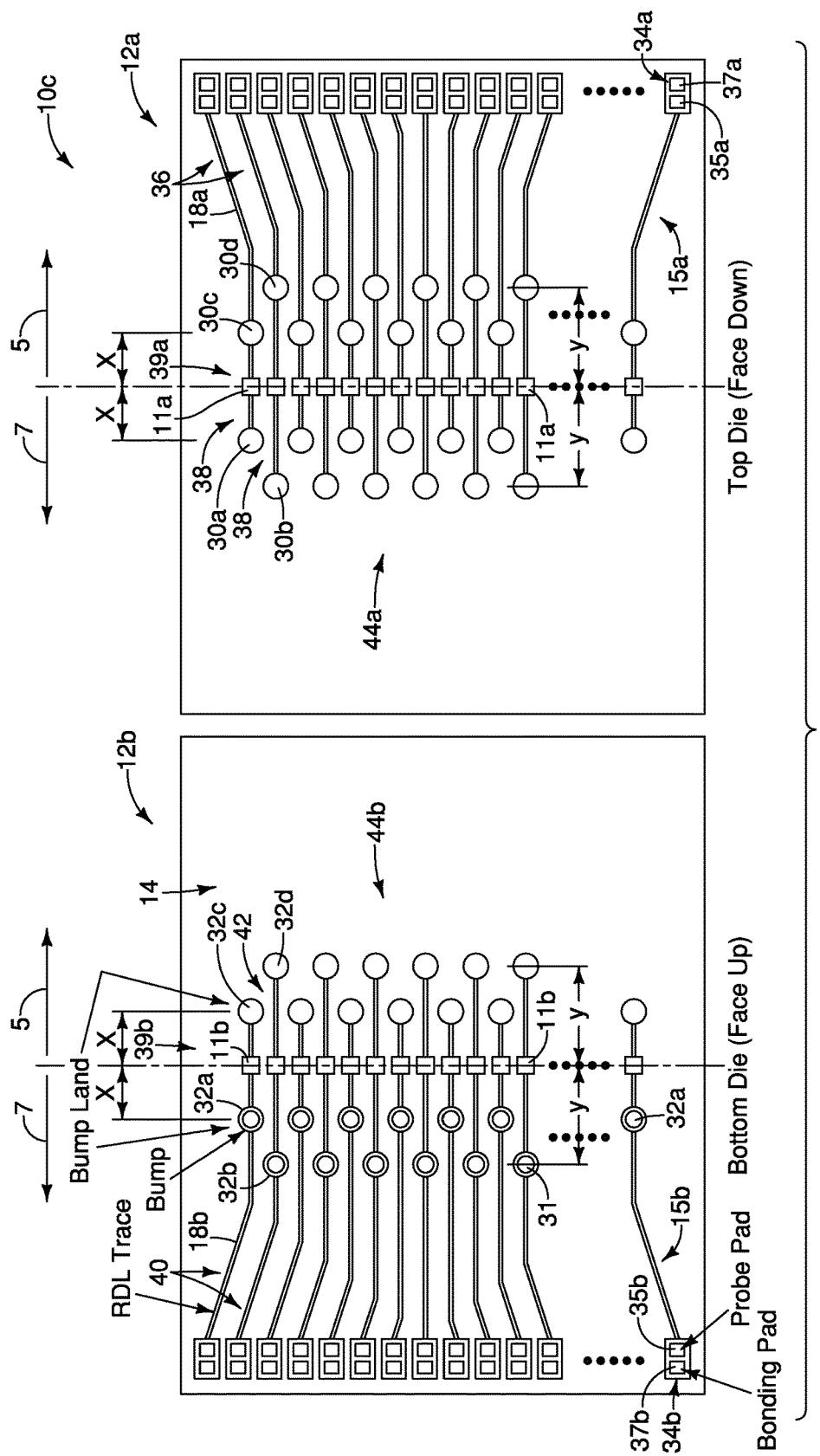
FIG. 7 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 7.

FIG. 7 shows semiconductor dies 12a, 12b of an assembly 10c. The dies are configured so that they may be assembled in a face-to-face relationship analogous to that of FIG. 3. The bottom die 12b is illustrated in a face-up orientation, and the top die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The die 12a has coupling regions 30a, 30b, 30c and 30d; with the coupling regions 30a, 30b, 30c and 30d being laterally offset relative to one another. Analogously, the die 12b has coupling regions 32a, 32b, 32c and 32d; with the coupling regions 32a, 32b, 32c and 32d being laterally offset relative to one another. When the dies are in face-to-face relationship, the coupling regions 30a, 30b, 30c and 30d align with the coupling regions 32a, 32b, 32c and 32d, respectively. Solder bumps or other suitable interconnects may be formed to interconnect coupling regions 30a, 30b, 30c, 30d with coupling regions 32a, 32b, 32c, 32d, as desired. In the shown embodiment, solder bumps 31 (or other suitable interconnects) are associated with regions 32a and 32b of die 12b, and are utilized for bonding such regions to regions 30a and 30b, respectively, of die 12a. Interconnects are not provided between the regions 30c, 30d and the regions 32c, 32d in the shown embodiment. The regions 30a, 30b, 30c, 30d, 32a, 32b, 32c and 32d may be referred to as landings, or in some specific embodiments as bump landings, to indicate that they are locations where bumps or other suitable coupling components interconnect with the redistribution wiring layers 15a, 15b.

The M3 pad regions (i.e. interconnection regions) 11a are arranged in a first line 39a extending along a face surface 14 of the first die 12a (with the face surface 14 of the die 12a being under the view of FIG. 7, but being shown in FIG. 8A); and the M3 pad regions 11b are arranged in a second line 39b extending along a face surface 14 of the second die 12b. First redistribution wiring 18a is electrically coupled with the M3 pad regions 11a of the first die 12a, and second redistribution wiring 18b is electrically coupled with the M3 pad regions 11b of the second die 12b.

The first redistribution wiring 18a is comprised by a first redistribution wiring layer 15a, and the second redistribution wiring 18b is comprised by a second redistribution wiring layer 15b.

The first redistribution wiring layer 15a has primary portions 36 extending outwardly from the M3 pad regions 11a in a first lateral direction represented by an arrow 5, and has secondary portions 38 extending outwardly from the M3 pad regions 11a in a second lateral direction represented by an arrow 7; with the second lateral direction represented by arrow 7 being opposite to the first lateral direction represented by arrow 5. The primary portions 36 include the coupling regions 30c, 30d and the wiring 18a extending across such coupling regions; and the secondary portions 38 include the coupling regions 30a, 30b and the wiring 18a extending across such coupling regions.

The second redistribution wiring layer 15b has primary portions 40 extending outwardly from the M3 pad regions 11b in the second lateral direction represented by the arrow 7, and has secondary portions 42 extending outwardly from the M3 pad regions 11b in the first lateral direction represented by the arrow 5. The primary portions 40 include the coupling regions 32a, 32b and the wiring 18b extending across such coupling regions; and the secondary portions 42 include the coupling regions 32c, 32d and the wiring 18b extending across such coupling regions.

The terms "primary" and "secondary" are utilized to distinguish the portions of the first and second redistribution wiring layers 15a, 15b to assist in explaining the invention, and to assist in defining the invention in the claims which follow. In the illustrated embodiment of FIG. 7, the "primary" portions happen to be longer than the "secondary" portions. In other embodiments, portions analogous to the integrated "primary" portions may be shorter than portions analogous to the indicated "secondary" portions.

The coupling regions 32a and 32c are arranged symmetrically relative to the line 39b of M3 pad regions 11b in the embodiment of FIG. 7; with the coupling regions 32a being laterally offset from the line 39b by a distance x along the second direction represented by arrow 7, and the coupling regions 32c being laterally offset from the line 39b by the distance x along the first direction represented by arrow 5. Similarly, the coupling regions 32b and 32d are arranged symmetrically relative to the line 39b of M3 pad regions 11b in the embodiment of FIG. 7; with the coupling regions 32b being laterally offset from the line 39b by a distance y along the second direction represented by arrow 7, and the coupling regions 32d being laterally offset from the line 39b by the distance y along the first direction represented by arrow 5. The coupling regions 30a and 30c are also arranged symmetrically relative to the line 39a of M3 pad regions 11a, and similarly the coupling regions 30b and 30d are arranged symmetrically relative to the line 39a.

An advantage of the embodiment of FIG. 7 is that the die 12a may be substantially identical to the die 12b (with "substantially identical" meaning identical to within reasonable tolerances of fabrication and measurement), and accordingly may be formed with identical processing as the die 12b. Such may simplify fabrication, and reduce costs, as compared to other embodiments in which the dies 12a and 12b are not substantially identical to one another. In some embodiments, the first interconnection regions 11a may be considered to be associated with the first redistribution wiring layer 15a; with the first interconnection regions 11a and the associated first redistribution wiring layer 15a forming a first pattern 44a. Similarly, the second interconnection regions 11b may be considered to be associated with the second redistribution wiring layer 15b; with the second interconnection regions 11b and the associated second redistribution wiring layer 15b forming a second pattern 44b. In the embodiment of FIG. 7, the second pattern 44b is substantially identical to the first pattern 44a. In other embodiments, the second pattern may be different than the first pattern.

In the illustrated embodiment, the redistribution wiring layers 15a of the top die 12a extend to first pads 34a, and the redistribution wiring layers 15b of the bottom die 12b extend to second pads 34b. Such pads may be suitable for coupling with wires 19 of the type described above with reference to FIG. 3 and/or for coupling with a testing probe during testing of the dies 12a, 12b. In the shown embodiment, the pads 34a and 34b are illustrated to each comprise two regions (35a, 37a) and (35b, 37b); with the regions 35a, 35b being configured as "probe pads" (or in other words, being configured to be suitable for contact with a testing probe), and the regions 37a, 37b being configured as "bonding pads" (or in other words, being configured to be suitable for bonding to a wire 19 of the type shown above with reference to FIG. 3, or any other suitable interconnect). In other embodiments, the pads 34a and 34b may have other configurations. If the pads 34a, 34b have regions suitable for bonding with wires (e.g., 19 of FIG. 3), the bonding pads may be referred to as wire bonding pads.

In the illustrated embodiment, the first bonding pads 34a are laterally offset from the first interconnecting regions 11a along the first lateral direction represented by arrow 5, and the second bonding regions 34b are laterally offset from the second interconnecting regions 11b along the second lateral direction represented by arrow 7.

FIG. 8 shows assembly 10c in an arrangement in which the dies are in face-to-face relationship. The bottom die 12b is face up, and the top die 12a is face down. The assembly 10c is viewed downwardly through the backside surface 16 of the top die 12a. Circuitry between the dies is schematically illustrated as if viewed through all materials and structures that may be over the circuitry. Overlap of the coupling regions 30a, 30b, 30c and 30d with the coupling regions 32a, 32b, 32c and 32d is apparent; as is the overlap of the M3 pad regions (i.e., interconnection regions) 11a with the M3 pad regions (i.e., interconnection regions) 11b. In the illustrated embodiment, the coupling regions 30a are electrically coupled with the coupling regions 32a through conductive interconnects (e.g., solder bumps) 31, and the coupling regions 30b are electrically coupled with the coupling regions 32b through conductive interconnects (e.g., solder bumps) 31. The coupling regions 30d are vertically above the coupling regions 32d but are not directly electrically coupled with such regions, and the coupling regions 30c are vertically above the coupling regions 32c but are not directly electrically coupled with such regions. Also, in the shown embodiment it may be that only the bonding regions 34b are utilized for bonding to wires (or other suitable interconnects), and the bonding regions 34a are simply vestigial; with the bonding regions 34a having resulted from the desirability of forming die 12a to be identical with die 12b. Similarly, the coupling regions 30c, 32c, 30d and 32d may be vestigial. In other embodiments, the bonding regions 34a may be utilized for coupling with circuitry, and accordingly may have a function instead of being simply vestigial structures with no apparent use in a final configuration. Similarly, one or more of the coupling regions 30c, 32c, 30d and 32d may be provided with a function instead of simply being a vestigial structure with no apparent use in the final configuration.

In the illustrated embodiment of FIG. 8, the bonding pads 37a of the first die 12a are overlapped by the second die 12b, and the bonding pads 37b of the second die 12b are vertically overlapped by the first die 12a. In other embodiments, it may be desired to have the bonding pads 37a extending laterally outward beyond the die 12b and/or to have the bonding pads 37b extending laterally outward beyond the die 12a, as discussed in more detail below with reference to FIGS. 16-19.

FIG. 8A shows a cross-section through assembly 10c, and more clearly indicates that the first and second dies 12a and 12b are in face-to-face relationship with one another. One of the first interconnection regions 11a can be seen to be vertically offset from one of the second interconnection regions 11b (and directly over the second interconnection region 11b in the shown embodiment). The secondary portion 38 of the first redistribution wiring layer 15a is electrically coupled to the primary portion 40 of the second redistribution wiring layer 15b through an interconnect 31 that couples one of the coupling regions 30a with one of the coupling regions 32a. The first interconnection region 11a is electrically coupled to the wire 19 through a path 46 extends along the first redistribution wiring layer 15a, through the interconnect 31, and along the second redistribution wiring layer 15b to the wire bonding pad 34b; and the second interconnection region 11b electrically coupled to the same wire 19 through a path 48 that extends along the second redistribution wiring layer 15b to the wire bonding pad 34b. Accordingly, both of the interconnection regions 11a and 11b may be accessed utilizing the same wire 19 and the same wire bonding pad 34b.

Figure 9:
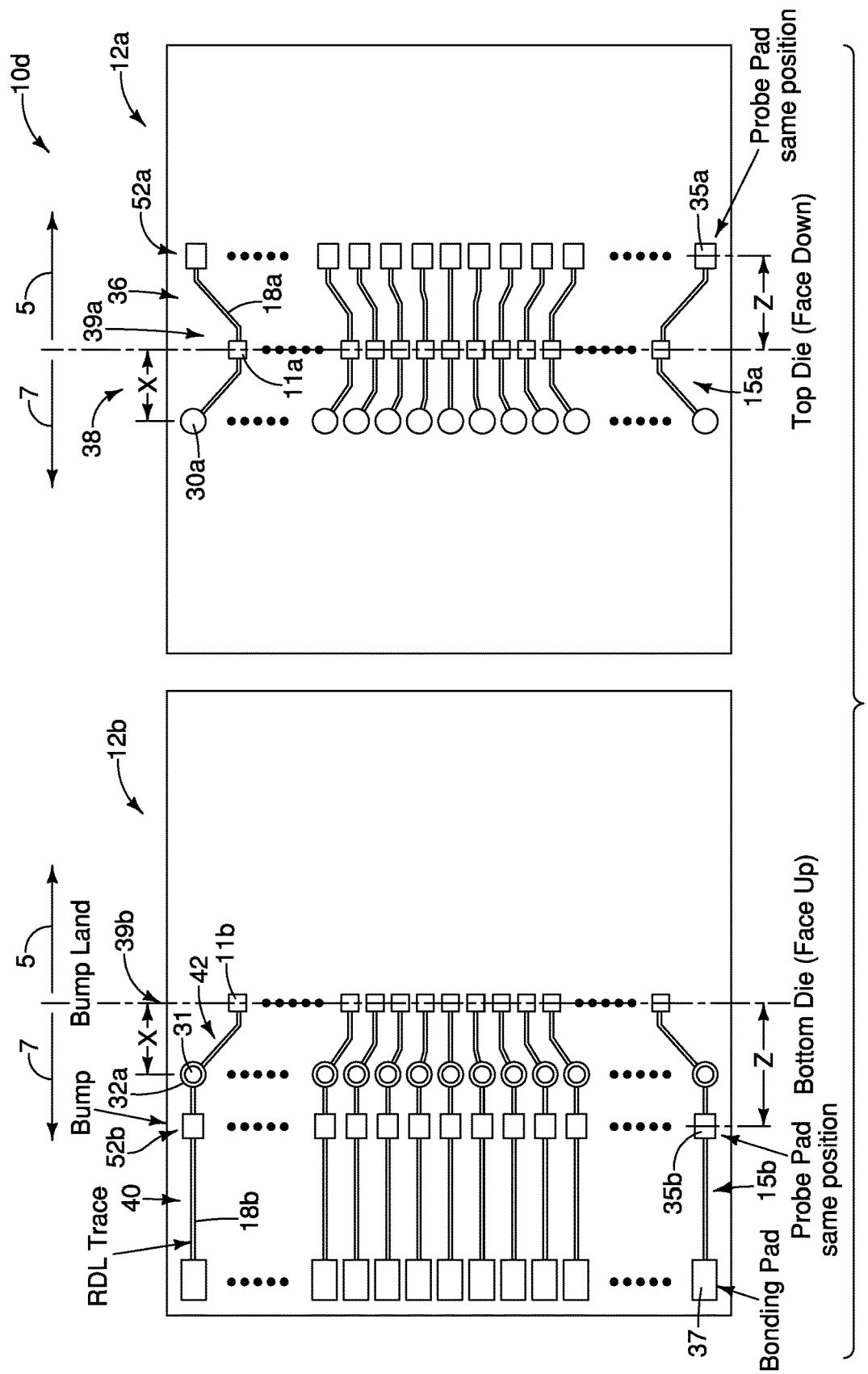
FIG. 9 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 9.
Figure 10:
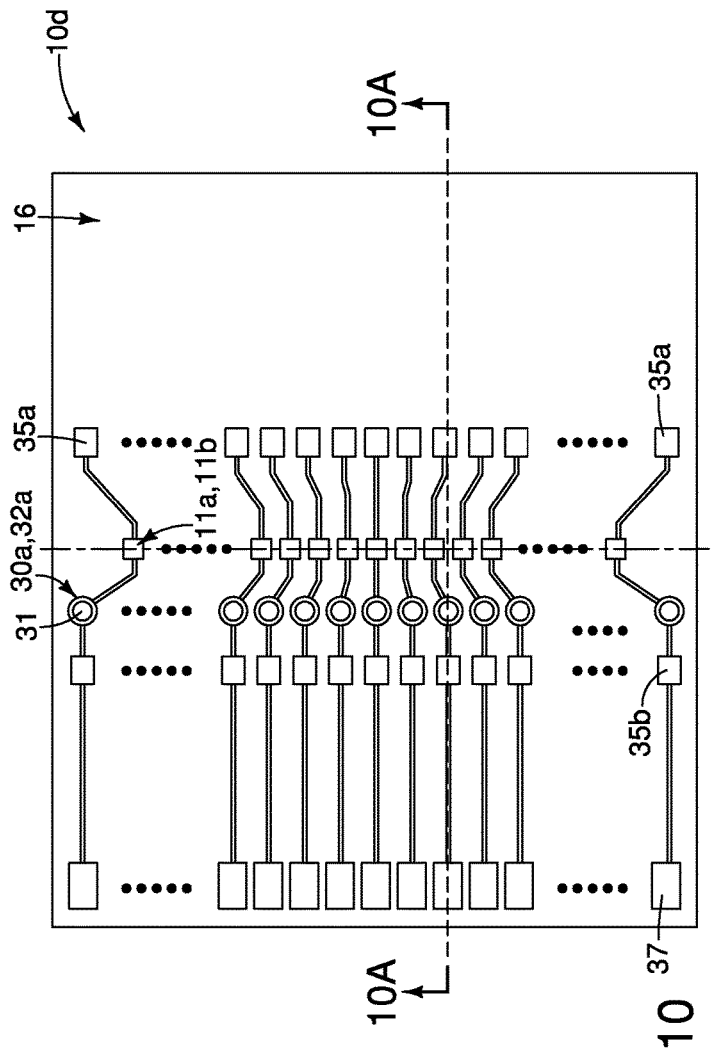
FIG. 10 is a diagrammatic top-down view of the two dies of FIG. 9 stacked one atop another in a face-to-face arrangement, and schematically illustrates overlap of the circuitry of the two dies along an interface where the faces of the two dies are joined to one another. The circuitry is illustrated as if viewed through all materials and structures that may be over the circuitry, including the back-side surface of the top die.
Figure 10A:
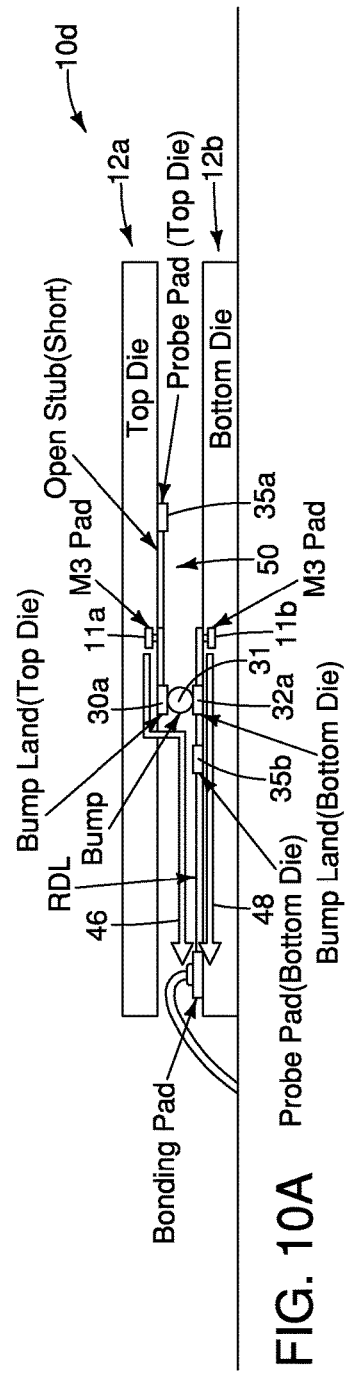
FIG. 10A is a diagrammatic cross-sectional side view along the line 10A-10A of FIG. 10.

In some embodiments, it may be advantageous to utilize a die 12a which is not identical to the die 12b. For instance, the primary portions 36 of the redistribution wiring layer 15a may be considered to comprise an open stub wiring 50 in the embodiment of FIG. 8A. Such open stub wiring may influence capacitance associated with the circuitry along die 12a, which may adversely impact performance of such circuitry. Accordingly, it may be advantageous to reduce the overall size of the open stub wiring 50. FIGS. 9, 10 and 10A illustrate an assembly 10d in which circuitry associated with the first die 12a is different from that associated with the second die 12b.

FIG. 9 shows semiconductor dies 12a, 12b configured so that they may be assembled in a face-to-face relationship. The die 12b is illustrated in a face-up orientation, and the die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The dies 12a and 12b have the coupling regions 30a and 32a, respectively. When the dies are in face-to-face relationship, the coupling regions 30a align with the coupling regions 32a. Solder bumps or other suitable interconnects 31 may be formed to interconnect coupling regions 30a with coupling regions 32a.

The M3 pad regions (i.e. interconnection regions) 11a are arranged in the first line 39a, and the M3 pad regions 11b are arranged in the second line 39b. First redistribution wiring 18a is electrically coupled with the M3 pad regions 11a of the first die 12a, and second redistribution wiring 18b is electrically coupled with the M3 pad regions 11b of the second die 12b.

The first redistribution wiring 18a is comprised by a first redistribution wiring layer 15a, and the second redistribution wiring 18b is comprised by a second redistribution wiring layer 15b.

The first redistribution wiring layer 15a has the primary portions 36 extending outwardly from the M3 pad regions 11a in the first lateral direction represented by the arrow 5, and has the secondary portions 38 extending outwardly from the M3 pad regions 11a in the second lateral direction represented by the arrow 7. The second redistribution wiring layer 15b has the primary portions 40 extending outwardly from the M3 pad regions 11b in the second lateral direction represented by the arrow 7, and has the secondary portions 42 extending outwardly from the M3 pad regions 11b in the first lateral direction represented by the arrow 5.

In the embodiment of FIG. 9, the probe pads 35a, 35b are separated from bonding pads (37a, 37b of FIG. 7). Only one set of bonding pads is utilized in FIG. 9, and such bonding pads are simply labeled 37. The bonding pads 37 are only along the bottom die 12b, rather than being along both of the dies 12a and 12b like the embodiment of FIG. 7. The probe pads 35a are arranged in a line 52a along the face of the first die 12a, and the probe pads 35b are arranged in an analogous line 52b along the face of the second die 12b. The probe pads 35a are laterally spaced from the first interconnection regions 11a by a distance z along the first lateral direction represented by the arrow 5, and the probe pads 35b are spaced from the second interconnection regions 11b by the same distance z along the second lateral direction represented by the arrow 7. Accordingly, substantially identical capacitance may be encountered in testing interconnecting regions 11a of die 12a with probe pads 35a as is encountered in testing interconnecting regions 11b of die 12b with probe pads 35b; and thus, the same testing tool may be utilized for testing both dies.

The die 12a is not substantially identical to the die 12b in the embodiment of FIG. 9 (for instance, the primary region 36 of the redistribution wiring layer 15a is shorter than the primary region 40 of the redistribution wiring layer 15b), but advantages achieved with the particular configurations of dies 12a and 12b (e.g., advantages in being able to use the same testing probe for both dies) may offset disadvantages associated with the need to separately fabricate each of the dies. Notably, even though the redistribution wiring of dies 12a and 12b is different (wiring 15a has a different configuration than wiring 15b), the probe pads 35a and 35b are arranged in the same positions as one another.

FIG. 10 shows assembly 10d in an arrangement in which the dies are in face-to-face relationship. The bottom die 12b is face up, and the top die 12a is face down. The assembly 10d is viewed downwardly through the backside surface 16 of the top die 12a. Circuitry between the dies is schematically illustrated as if viewed through all materials and structures that may be over the circuitry. Overlap of the coupling regions 30a with the coupling regions 32a is apparent; as is the overlap of the M3 pad regions (i.e., interconnection regions) 11a and 11b.

FIG. 10A shows a cross-section through assembly 10d, and more clearly indicates that the first and second dies 12a and 12b are in face-to-face relationship with one another. One of the first interconnection regions 11a can be seen to be vertically offset from one of the second interconnection regions 11b (and is directly over the second interconnection region 11b in the shown embodiment). The first and second interconnection regions 11a and 11b are electrically coupled to the wire 19 through the paths 46 and 48 of the types described above with reference to FIG. 8A. The assembly 10d of FIG. 10A may be advantageous relative to the assembly 10c of FIG. 8A in some applications, in that the open stub 50 of assembly 10d is shorter than that of assembly 10c; and the probe pads 35a, 35b are closer to the M3 pads 11a, 11b in assembly 10d while remaining equidistant from the M3 pads relative to one another.

FIGS. 11, 12, 12A and 12B illustrate an assembly 10e in which circuitry associated with the first die 12a is the same as that associated with the second die 12b (or at least substantially identical to that of the second die 12b); and yet in which the redistribution wiring path from an interconnection region 11a may comprise a unique (i.e., not shared) bonding pad/probe pad, and the redistribution wiring path from an interconnection region 11b may comprise a unique bonding pad/probe pad.

Figure 11:
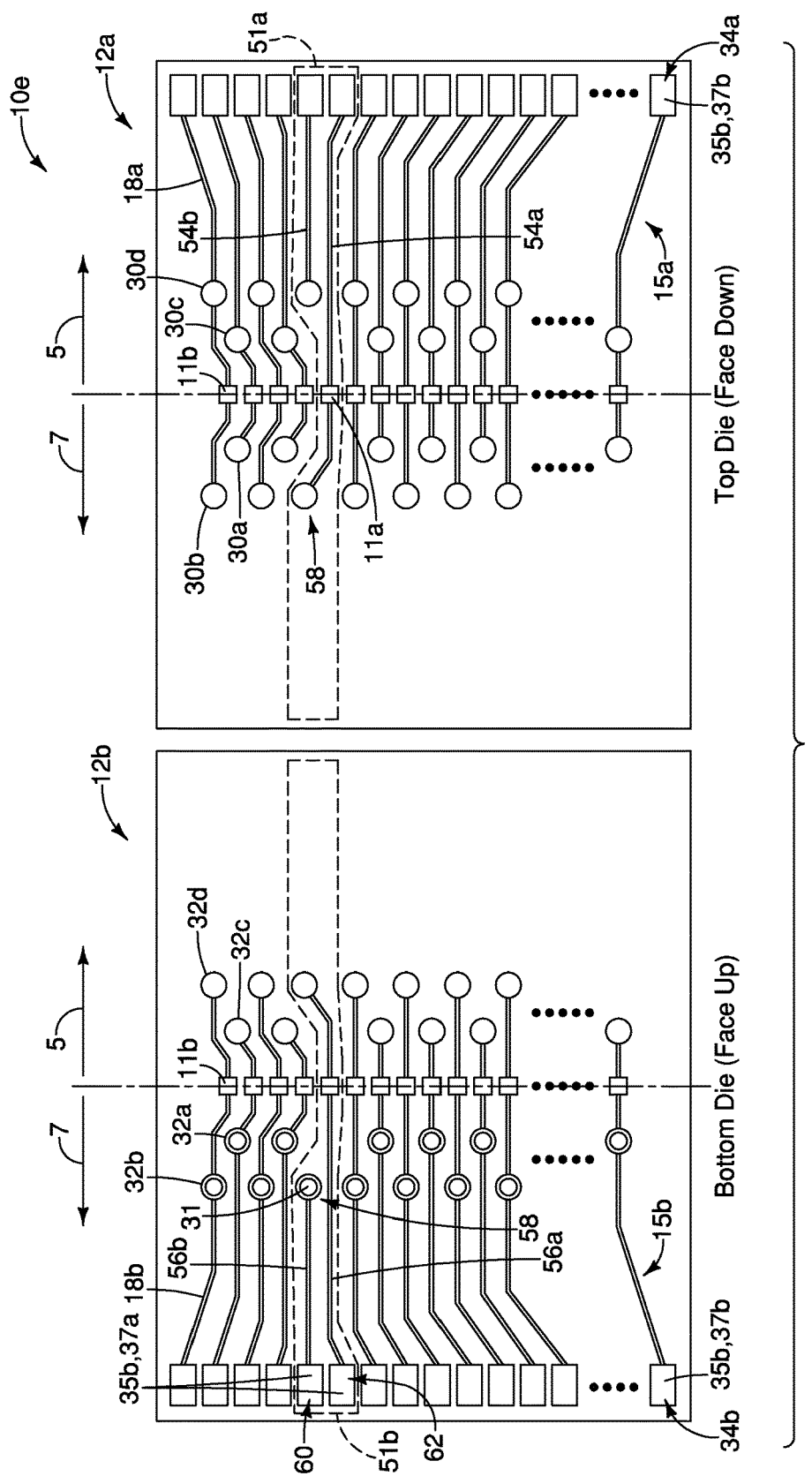
FIG. 11 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 11.

FIG. 11 shows semiconductor dies 12a, 12b configured so that they may be assembled in a face-to-face relationship. The die 12b is illustrated in a face-up orientation, and the die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The dies 12a and 12b of FIG. 11 are similar to the dies 12a and 12b of FIG. 7; and have the redistribution wiring 18a, 18b; coupling regions 30a, 30b, 30c, 30d, 32a, 32b, 32c, 32d; and pads 11a, 11b within redistribution wiring layers 15a, 15b. The dies 12a and 12 of FIG. 11 differ from those of FIG. 7 in that the dies 12a and 12b of FIG. 11 comprise wiring trace regions (i.e., control regions, or tailored regions) 51a and 51b, respectively; which are configured to enable an upper pad 11a to be accessed through a probe location which is not shared with a lower pad 11b during a control pulse; and which also enable a lower pad 11b to be accessed through a probe location which is not shared an upper pad 11a.

The region 51a comprises a wiring segment 54a which extends to one of the interconnection regions 11a, and comprises another wiring segment 54b which is physically separate from the wiring segment 54a and which does not extend to any of the interconnection regions 11a. Both of the wiring segments 54a and 54b may be comprised by the redistribution wiring layer 15a, and may be considered to be portions of the redistribution wiring 18a. The region 51b comprises a wiring segment 56a which extends to one of the interconnection regions 11b, and comprises another wiring segment 56b which is physically separate from the wiring segment 56*a* and which does not extend to any of the interconnection regions 11*b*. Both of the wiring segments 56*a* and 56*b* may be comprised by the redistribution wiring layer 15*b*, and may be considered to be portions of the redistribution wiring 18*b*.

In some embodiments, the segments 54*a*, 56*a*, 56*b* and 54*b* may be referred to as first, second, third and fourth wiring segments, respectively. The third wiring segment 56*b* is electrically coupled to the first wiring segment 54*a* through a bonding region 58; with the bonding region 58 including a coupling region 30*b*, a coupling region 32*b*, and an interconnect 31.

Figure 12:
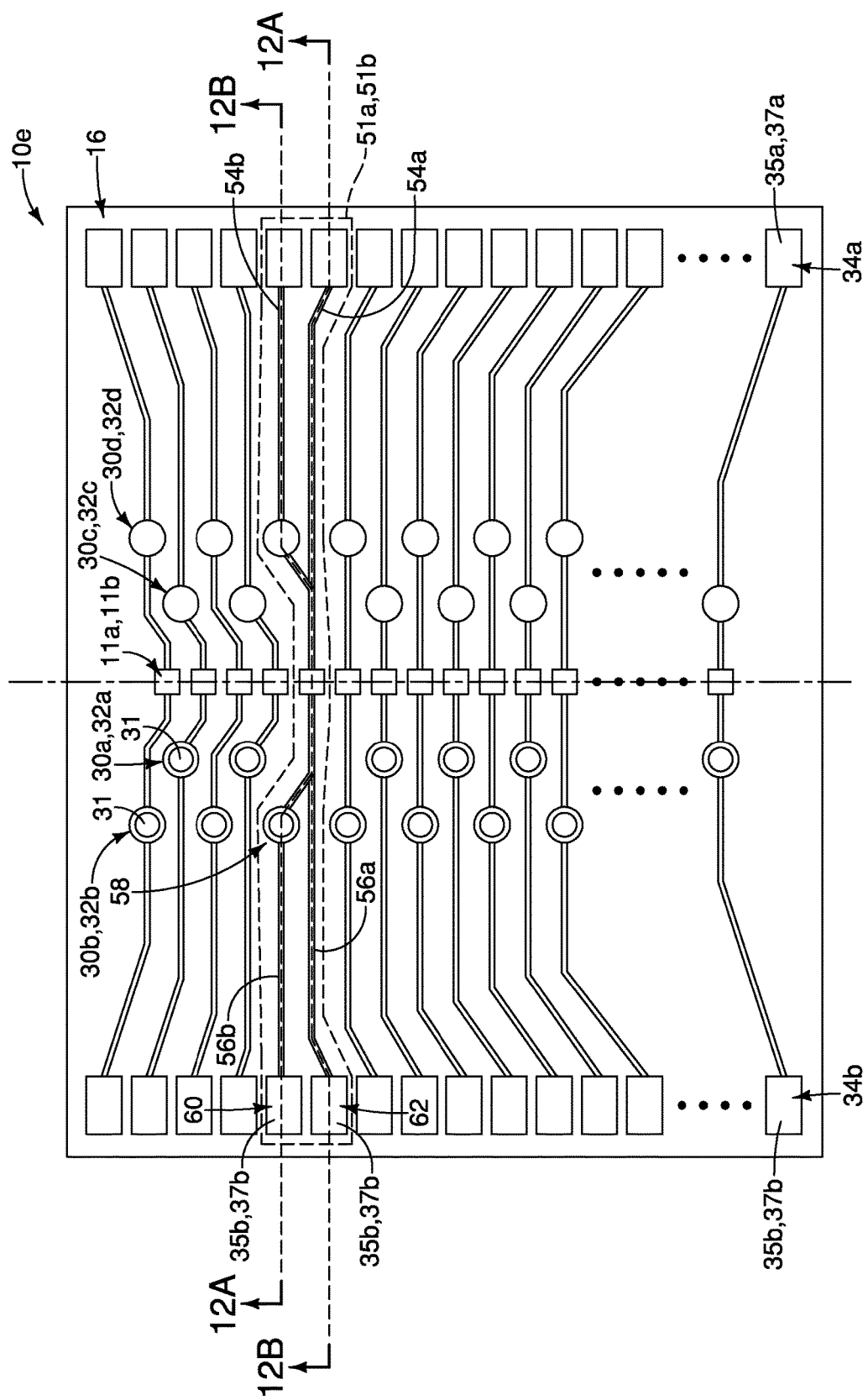
FIG. 12 is a diagrammatic top-down view of the two dies of FIG. 11 stacked one atop another in a face-to-face arrangement, and schematically illustrates overlap of the circuitry of the two dies along an interface where the faces of the two dies are joined to one another. The circuitry is illustrated as if viewed through all materials and structures that may be over the circuitry, including the back-side surface of the top die.

FIG. 12 shows assembly 10*e* in an arrangement in which the dies are in face-to-face relationship. The bottom die 12*b* is face up, and the top die 12*a* is face down. The assembly 10*e* is viewed downwardly through the backside surface 16 of the top die 12*a*. Circuitry between the dies is schematically illustrated as if viewed through all materials and structures that may be over the circuitry.

Figure 12A:
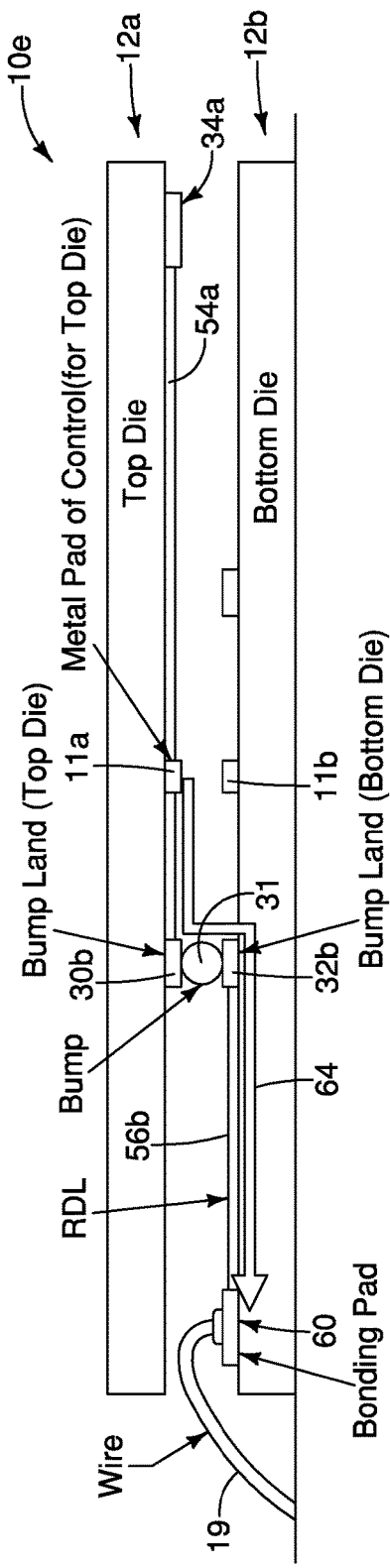
FIGS. 12A and 12B are diagrammatic cross-sectional side views along the lines 12A-12A of FIG. 12, and 12B-12B of FIG. 12, respectively.
Figure 12B:
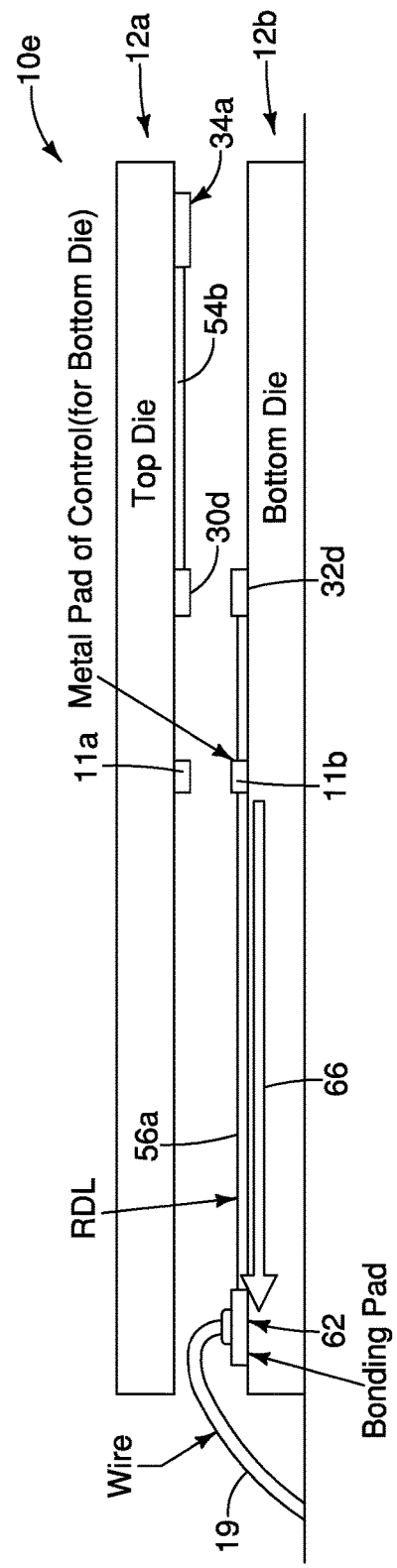

FIG. 12A shows a cross-section through assembly 10*e* along the wiring segments 54*a*, 56*b*; and FIG. 12B shows a cross-section through assembly 10*e* along the wiring segments 54*b*, 56*a*.

Electrical coupling of the first and third wiring segments 54*a*, 56*b* through the bonding region 58 is apparent in FIGS. 12 and 12A.

FIGS. 12, 12A and 12B show that the bonding pad/probe pad electrically coupled with the wiring trace formed from combined wiring segments 54*a*, 56*b* (labeled 60 in FIGS. 12, 12A and 12B to distinguish it from other bonding pad/probe pads) is different from the bonding pad/probe pad electrically coupled with wiring segment 58 (labeled 62 in FIGS. 12, 12A and 12B to distinguish it from other bonding pad/probe pads).

An interconnection region 11*a* within wiring trace region 51*a*/51*b* may be uniquely accessed through pad 60, and an interconnection region 11*b* within the wiring trace region 51*a*/51*b* may be uniquely accessed through pad 62.

The first interconnection region 11*a* of FIG. 12A is electrically coupled to a wire 19 through a path 64 that extends along wiring segments 56*b* and 54*a*, and through pad 60; and the second interconnection region 11*b* of FIG. 12B is electrically coupled to a wire 19 through a path 66 that extends along wiring segment 56*a* and through pad 62.

FIGS. 11, 12, 12A and 12B illustrate an embodiment in which the first and second dies 12*a*, 12*b* are substantially identical to one another. In some embodiments, it may be advantageous to utilize a die 12*a* which is not identical to the die 12*b* (as discussed above with reference to FIGS. 9, 10 and 10A). FIGS. 13, 14, 14A and 14B illustrate an assembly 10*f* similar to the assembly 10*e* of FIGS. 11, 12, 12A and 12B, but in which circuitry associated with the first die 12*a* is different from that associated with the second die 12*b*.

Figure 13:
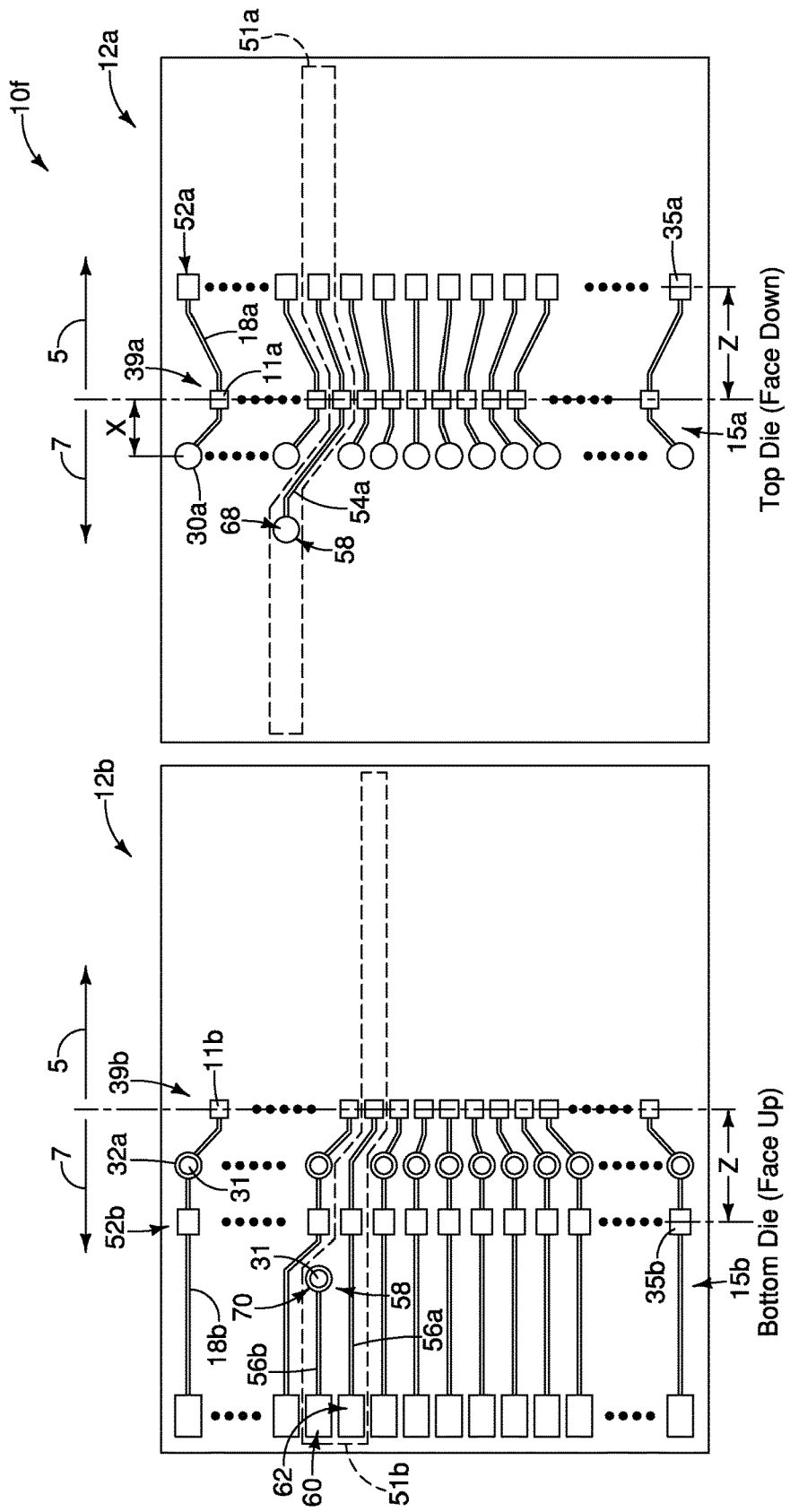
FIG. 13 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 13.

FIG. 13 shows semiconductor dies 12*a*, 12*b* configured so that they may be assembled in a face-to-face relationship. The die 12*b* is illustrated in a face-up orientation, and the die 12*a* is illustrated in a face-down orientation. Circuitry associated with the dies (e.g., redistribution wiring layers 15*a*, 15*b*; M3 pads 11*a*, 11*b*; etc.) is schematically illustrated as if viewed through all materials and structures that may be over the circuitry in order to simplify the drawings. However, it is to be understood that the circuitry may be covered with one or more materials; and, in the case of die 12*a*, the circuitry is along a bottom of the die.

The dies 12*a* and 12*b* of FIG. 13 are similar to the dies 12*a* and 12*b* of FIG. 9, but also include wiring trace region (i.e., control regions, or tailored regions) 51*a* and 51*b*, respectively, similar to those described with reference to FIG. 11. The dies 12*a* and 12*b* of FIG. 13 have the redistribution wiring 18*a*, 18*b*; coupling regions 30*a*, 32*a*; and pads 11*a*, 11*b* within redistribution wiring layers 15*a*, 15*b*. The dies 12*a* and 12 of FIG. 13 comprise wiring segments 54*a*, 56*a* and 56*b* within the regions 51*a* and 51*b*. Notably, there is no wiring segment 54*b* of the type shown in FIG. 11.

In some embodiments, the segments 54*a*, 56*a* and 56*b* may be referred to as first, second and third wiring segments, respectively. The third wiring segment 56*b* is electrically coupled to the first wiring segment 54*a* through a bonding region 58; with the bonding region 58 including a coupling region 68 along wiring segment 54*a*, a coupling region 70 along wiring segment 56*b*, and an interconnect 31.

FIG. 14 shows assembly 10*f* in an arrangement in which the dies are in face-to-face relationship. The bottom die 12*b* is face up, and the top die 12*a* is face down. The assembly 10*f* is viewed downwardly through the backside surface 16 of the top die 12*a*. Circuitry between the dies is schematically illustrated as if viewed through all materials and structures that may be over the circuitry. Electrical coupling of the first and third wiring segments 54*a*, 56*b* through the bonding region 58 is apparent. FIG. 14 also shows a bonding pad 60 electrically coupled with the wiring trace formed from combined wiring segments 54*a*, 56*b*; and a bonding pad 62 electrically coupled with wiring segment 58. It is noted that the pads 60, 62 of the embodiment of FIG. 12 included both probe pad regions 35 and bonding pad regions 37; whereas the pads 60, 62 of FIG. 14 comprise only bonding pad regions as the probe pad regions 35 are separated from the bonding pad regions 37 in a manner similar to the embodiment of FIG. 10 (discussed above).

Figure 14A:
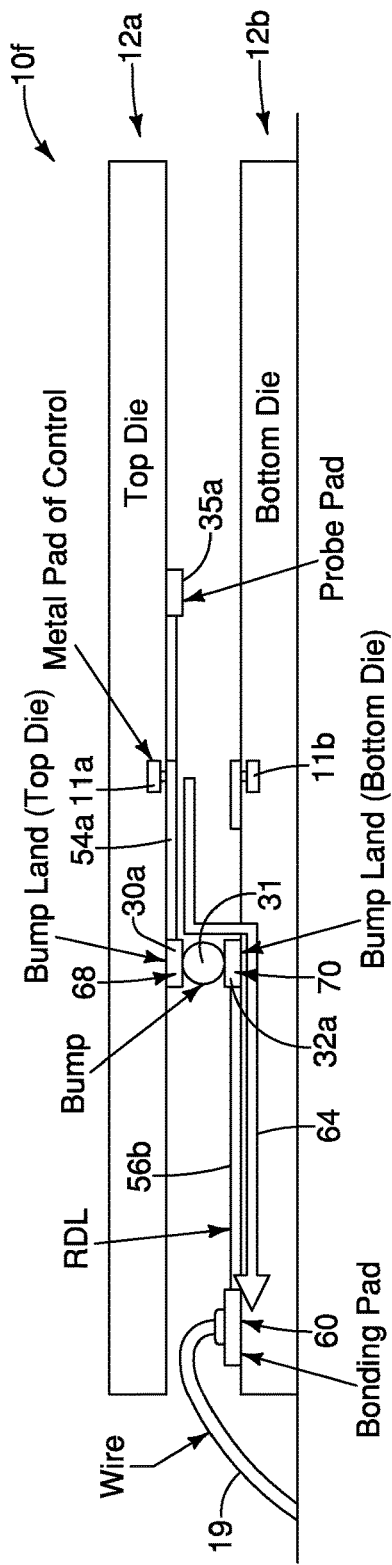
FIGS. 14A and 14B are diagrammatic cross-sectional side views along the lines 14A-14A of FIG. 14, and 14B-14B of FIG. 14, respectively.
Figure 14B:
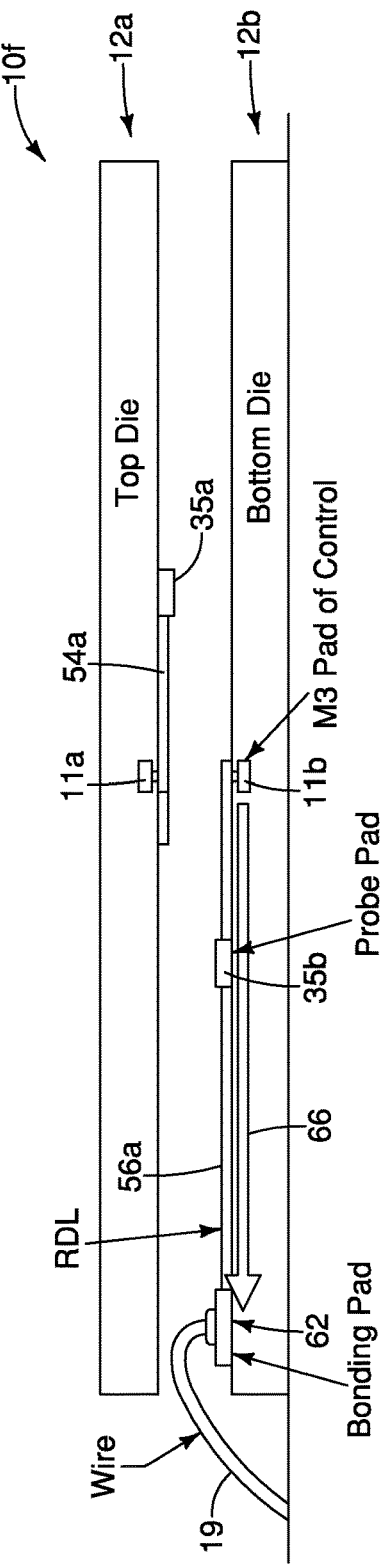

FIG. 14A shows a cross-section through assembly 10*f* along the wiring segments 54*a*, 56*b*; and FIG. 14B shows a cross-section through assembly 10*f* along the wiring segments 54*a*, 56*a*. The first interconnection region 11*a* of FIG. 14A is electrically coupled to a wire 19 through a path 64 that extends along wiring segments 56*b* and 54*a*, and through pad 60; and the second interconnection region 11*b* of FIG. 14B is electrically coupled to a wire 19 through a path 66 that extends along wiring segment 56*a* and through pad 62.

Figure 15:
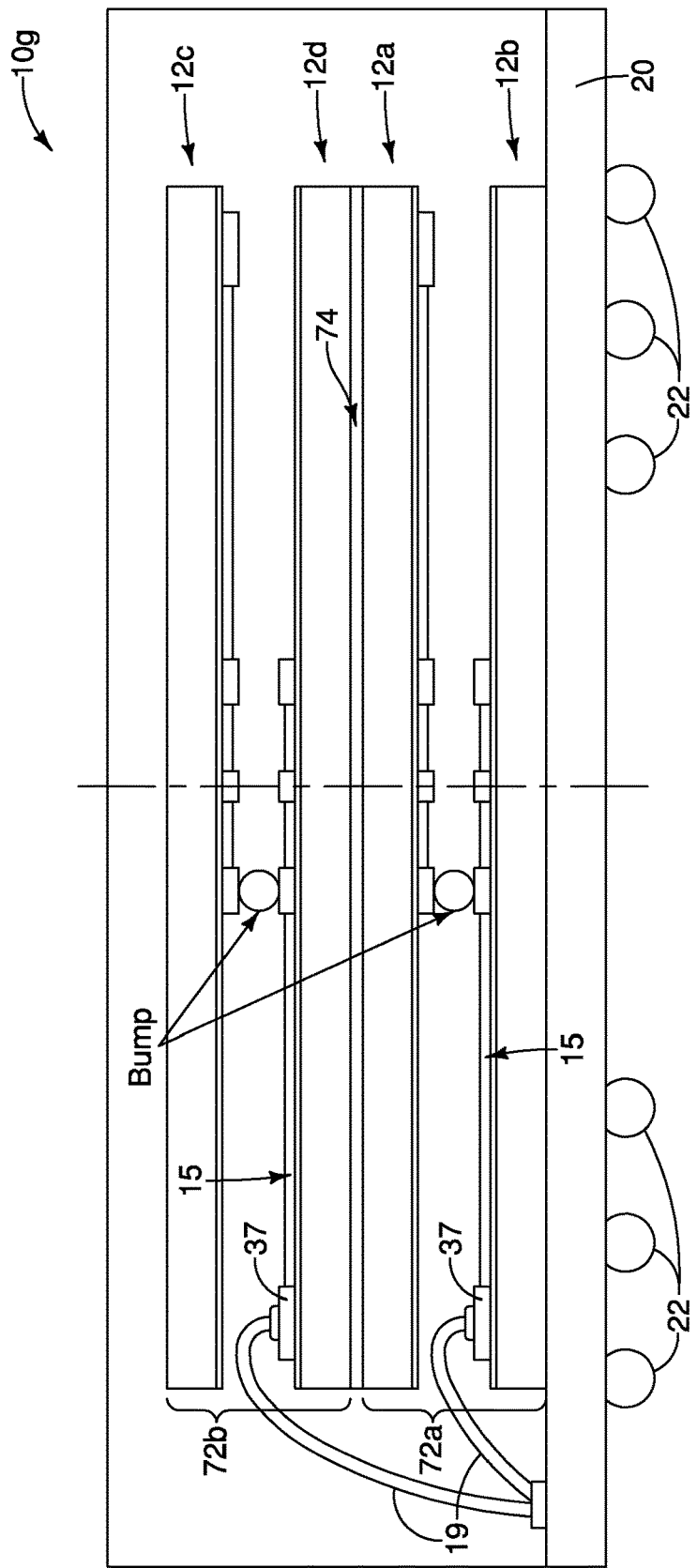
FIG. 15 is a diagrammatic cross-sectional side view of an assembly comprising multiple sets of paired dies in face-to-face arrangement, with the sets being vertically stacked one atop another.
Figure 16:
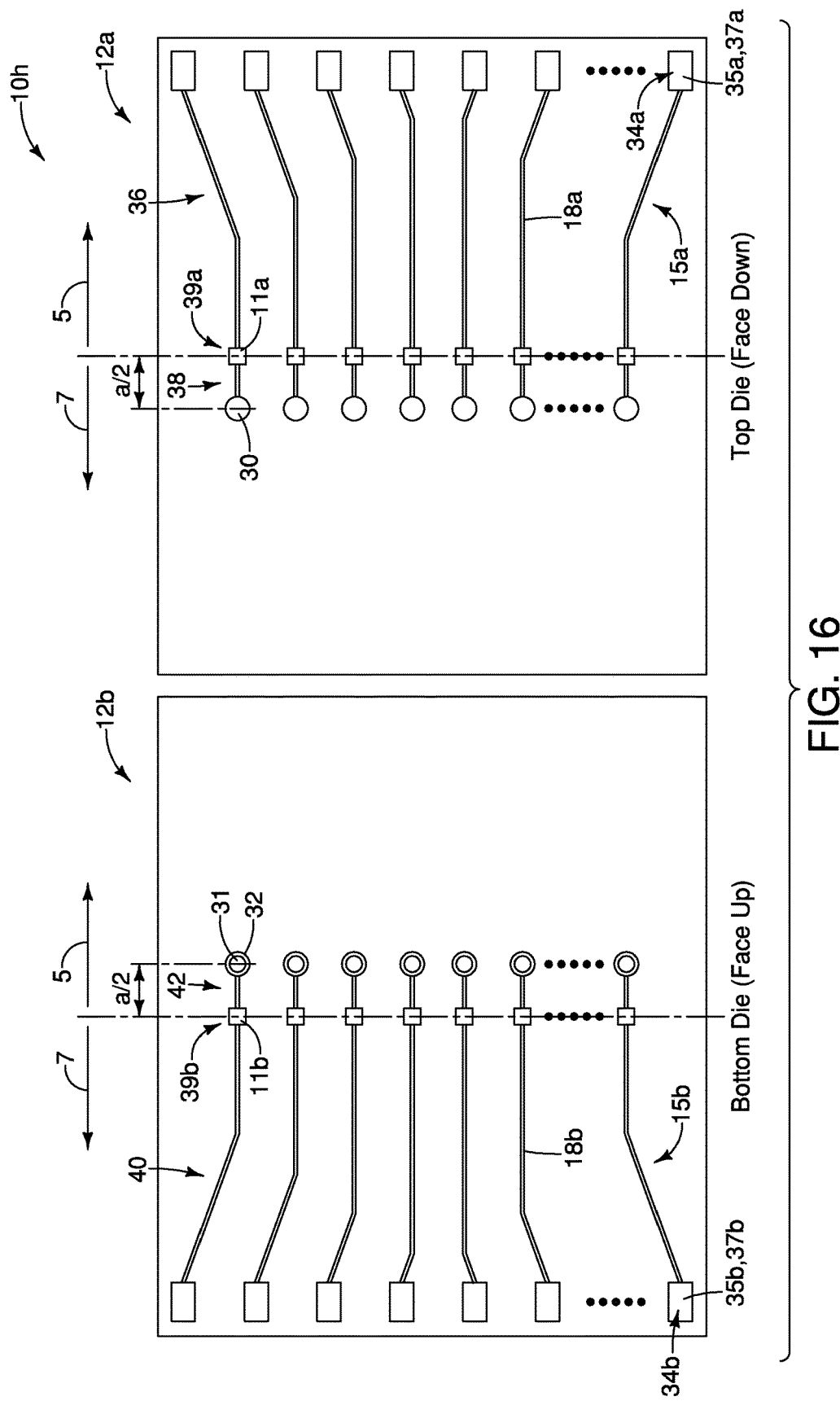
FIG. 16 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 16.

The paired dies 12*a*, 12*b* of the above-described embodiments may be considered together to form a first face-to-face die assembly. In some embodiments, a packaged assembly may be fabricated to comprise multiple face-to-face die assemblies. For instance, FIG. 15 shows a packaged assembly 10*g* in which the dies 12*a*, 12*b* form a first face-to-face die assembly 72*a*, and in which a second pair of dies 12*c*, 12*d* form a second face-to-face die assembly 72*b*. The second face-to-face die assembly 72*b* is vertically disposed relative to the first face-to-face die assembly 72*a*. Although two face-to-face die assemblies 72*a*, 72*b* are illustrated, in other embodiments analogous packages may comprise more than two face-to-face die assemblies.

In the shown embodiment, the assemblies 72*a* and 72*b* are vertically separated from one another by an intervening insulative region 74. The insulative region 74 may comprise any suitable composition or combination of compositions, such as, for example, one or more of silicon dioxide, silicon nitride, etc.

Each of the die assemblies 72*a*, 72*b* has a bonding pad 37 coupled with a wire (or any other suitable connection) 19. The wires 19 extend to a common region of the substrate 20 comprising circuitry suitable for accessing redistribution layers along the die assemblies 72*a*, 72*b*. In some embodiments, the face-to-face die assembly 72b may be substantially identical to the face-to-face die assembly 72a. Accordingly, each redistribution layer of the second die assembly 72b may have a corresponding redistribution layer of the first die assembly 72a. The cross-section of FIG. 15 be considered to show a redistribution layer 15 of the first assembly 72a, and a corresponding redistribution layer 15 of the second assembly 72b.

The redistribution layer 15 of assembly 72a and the corresponding redistribution layer 15 of assembly 72b may be coupled through the wires 19 to a same region of circuitry associated with substrate 20; and other corresponding redistribution layers of the assemblies 72a, 72b may similarly be coupled with common circuitry as one another along the substrate 20. Accordingly, control circuitry along substrate 20 may be shared by the vertically stacked assemblies 72a, 72b which may advantageously reduce production costs. Further, utilization of stacked assemblies 72a, 72b which are substantially identical to one another may enable common masks and processing steps to be utilized for fabricating each of the stacked assemblies, which may reduce production costs as compared to processes utilizing stacked assemblies which differ from one another. Also, common testing may be utilized for assembly 72b as is utilized for assembly 72a in embodiments in which the assemblies are substantially identical to one another, which may enable a common testing probe to be utilized for testing of all of the dies 12a, 12b, 12c, 12d; which may reduce costs as compared to embodiments in which multiple different testing probe configurations are needed.

The assemblies 72a, 72b of FIG. 15 are shown comprising bonding pads 37. In some embodiments, the assemblies may also comprise bonding pads 60, 62 of the type described above with reference to embodiments of FIGS. 11-14 as being associated with control traces.

The assemblies discussed above have the lower dies 12b aligned with the upper dies 12a; and have bond pads 37, 60 and 62 of the lower die 12b (i.e., second chip) overlapped by the upper die (i.e., first chip). In other embodiments, analogous assemblies may be configured such that upper dies 12a are laterally shifted relative to the lower dies 12b; and in some embodiments, the bond pads of the lower die 12b of a face-to-face die assembly extend laterally outward beyond the upper die 12a to simplify bonding of wires or other suitable interconnects to the bond pads 12a. Additionally, or alternatively, the bond pads of the upper die 12a may extend laterally outward beyond the lower die 12b. FIGS. 16-27 show example assemblies in which upper dies are laterally offset relative to lower dies; and illustrate embodiments in which bond pads of at least one of the paired face-to-face dies extend laterally outward of the other die.

Referring to 16, 17 and 17A, such show semiconductor dies 12a, 12b configured so that they may be assembled in a face-to-face relationship in an assembly 10h. The die 12b is illustrated in a face-up orientation, and the die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The dies 12a and die 12b have the coupling regions 30 and 32, respectively. When the dies are in face-to-face relationship, the coupling regions 30 align with the coupling regions 32. Solder bumps or other suitable interconnects 31 may be formed to interconnect coupling regions 30 with coupling regions 32.

The M3 pad regions (i.e. interconnection regions) 11a are arranged in the first line 39a, and the M3 pad regions 11b are arranged in the second line 39b. First redistribution wiring 18a is electrically coupled with the M3 pad regions 11a of the first die 12a, and second redistribution wiring 18b is electrically coupled with the M3 pad regions 11b of the second die 12b.

The coupling regions 32 are laterally offset from the line 39b by a distance "a/2" along the first direction represented by the arrow 5, and the coupling regions 30 are laterally offset from the line 39a by the distance "a/2" along the second direction represented by the arrow 7.

The first redistribution wiring 18a is comprised by the first redistribution wiring layer 15a, and the second redistribution wiring 18b is comprised by the second redistribution wiring layer 15b.

The first redistribution wiring layer 15a has the primary portions 36 extending outwardly from the M3 pad regions 11a in the first lateral direction represented by the arrow 5, and has the secondary portions 38 extending outwardly from the M3 pad regions 11a in the second lateral direction represented by the arrow 7. The second redistribution wiring layer 15b has the primary portions 40 extending outwardly from the M3 pad regions 11b in the second lateral direction represented by the arrow 7, and has the secondary portions 42 extending outwardly from the M3 pad regions 11b in the first lateral direction represented by the arrow 5.

The redistribution wiring layers 15a of the top die 12a extend to first pads 34a, and the redistribution wiring layers 15b of the bottom die 12b extend to second pads 34b. The pads 34a and 34b comprise regions 35a, 37a, 35b and 37b; with the regions 35a, 35b being the probe pads, and the regions 37a, 37b being the bonding pads.

The dies 12a and 12b are substantially identical to one another.

FIG. 17 shows assembly 10h in an arrangement in which the dies are in face-to-face relationship. The bottom die 12b is face up, and the top die 12a is face down. The assembly 10h is viewed downwardly through the backside surface 16 of the top die 12a. Circuitry between the dies is schematically illustrated as if viewed through all materials and structures that may be over the circuitry. Overlap of the coupling regions 30 with the coupling regions 32 is apparent; as is lateral spacing of the M3 pad regions (i.e., interconnection regions) 11a and 11b by a distance "a".

FIG. 17A shows a cross-section through assembly 10h, and more clearly indicates that the first and second dies 12a and 12b are in face-to-face relationship with one another. One of the first interconnection regions 11a can be seen to be both vertically displaced and laterally offset from one of the second interconnection regions 11b. The first interconnection region 11a is electrically coupled to the wire 19 through a path along wiring 18a and 18b, and the second interconnection region 11b is electrically coupled to the wire 19 through a path along wiring 18b. The assembly 10h of FIG. 17A advantageously has bond pad 34b uncovered by the upper die 12a which can simplify bonding of the wire 19 to bond pad 34b, and which removes some limitations on the profile of the wire bonding as compared to embodiments in which bond pads 34b are covered by the upper die 12a.

Referring to 18, 19 and 19A, such show semiconductor dies 12a, 12b configured so that they may be assembled in a face-to-face relationship in an assembly 10i having wiring trace regions (i.e., control regions, or tailored regions) 51a and 51b, respectively analogous to the those discussed above with reference to FIGS. 11, 12 and 12A. The die 12b is illustrated in a face-up orientation, and the die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The die 12a has the coupling regions 30 (specifically, 30a, 30b and 30c), and the die 12b has the coupling regions 32 (specifically, 32a, 32b and 32c). When the dies are in face-to-face relationship, the coupling regions 30 align with the coupling regions 32. Solder bumps or other suitable interconnects 31 may be formed to interconnect coupling regions 30a, 30b with coupling regions 32a, 32b.

First redistribution wiring 18a is electrically coupled with the M3 pad regions 11a of the first die 12a, and second redistribution wiring 18b is electrically coupled with the M3 pad regions 11b of the second die 12b. The first redistribution wiring 18a is comprised by the first redistribution wiring layer 15a, and the second redistribution wiring 18b is comprised by the second redistribution wiring layer 15b.

The dies 12a and 12b are substantially identical to one another.

Figure 19:
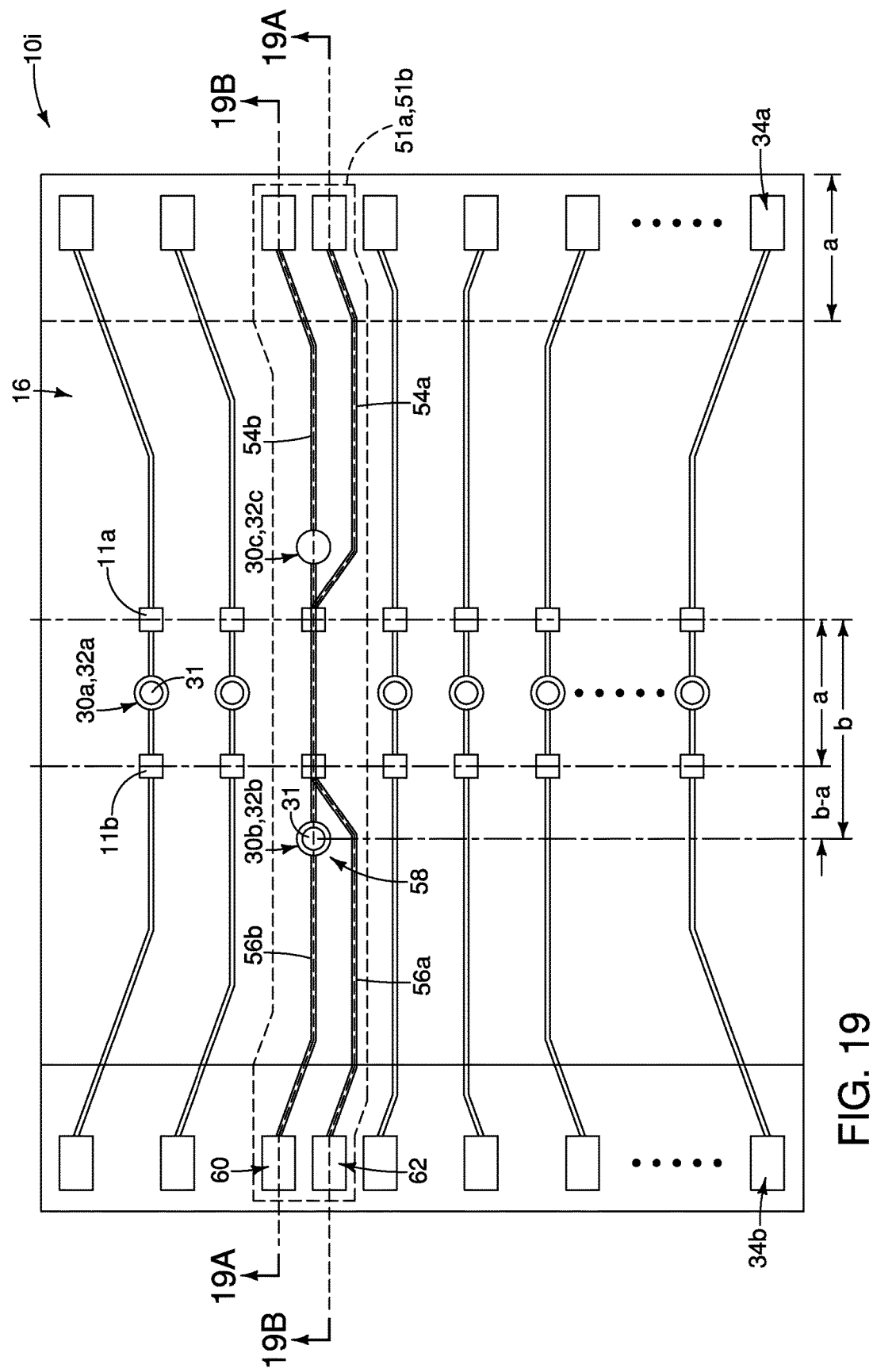
FIG. 19 is a diagrammatic top-down view of the two dies of FIG. 18 stacked one atop another in a face-to-face arrangement, and schematically illustrates overlap of the circuitry of the two dies along an interface where the faces of the two dies are joined to one another. The circuitry is illustrated as if viewed through all materials and structures that may be over the circuitry, including the back-side surface of the top die.

FIG. 19 shows assembly 10i in an arrangement in which the dies are in face-to-face relationship. The bottom die 12b is face up, and the top die 12a is face down. The assembly 10i is viewed downwardly through the backside surface 16 of the top die 12a. Circuitry between the dies is schematically illustrated as if viewed through all materials and structures that may be over the circuitry. Overlap of the coupling regions 30a, 30b and 30c with the coupling regions 32a, 32b and 32c is apparent; as is lateral spacing of the M3 pad regions (i.e., interconnection regions) 11a and 11b by the distance "a".

Figure 19A:
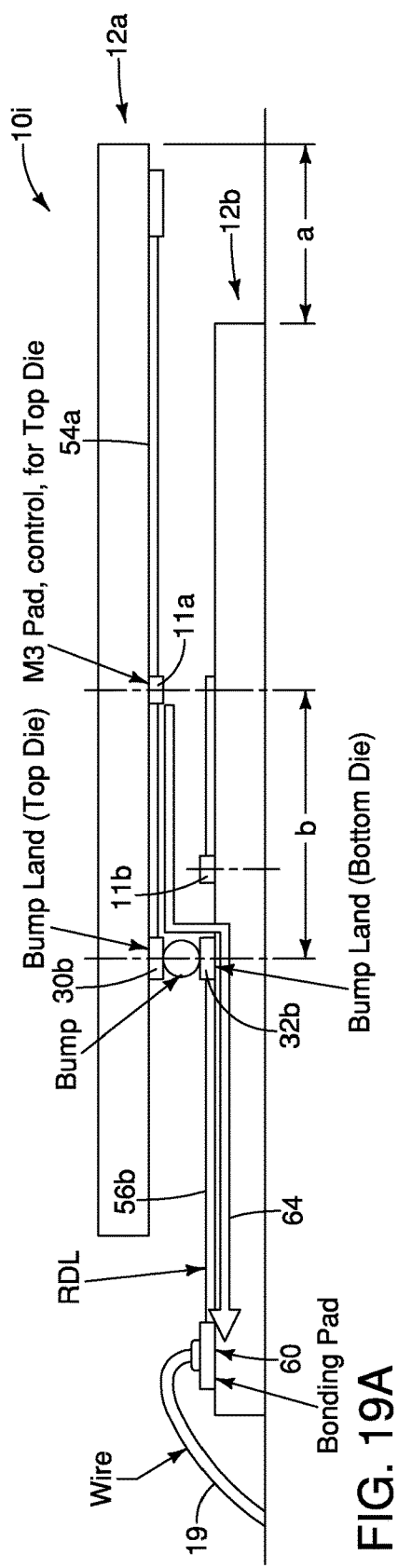
FIGS. 19A and 19B are diagrammatic cross-sectional side views along the lines 19A-19A of FIG. 19, and 19B-19B of FIG. 19, respectively.
Figure 19B:
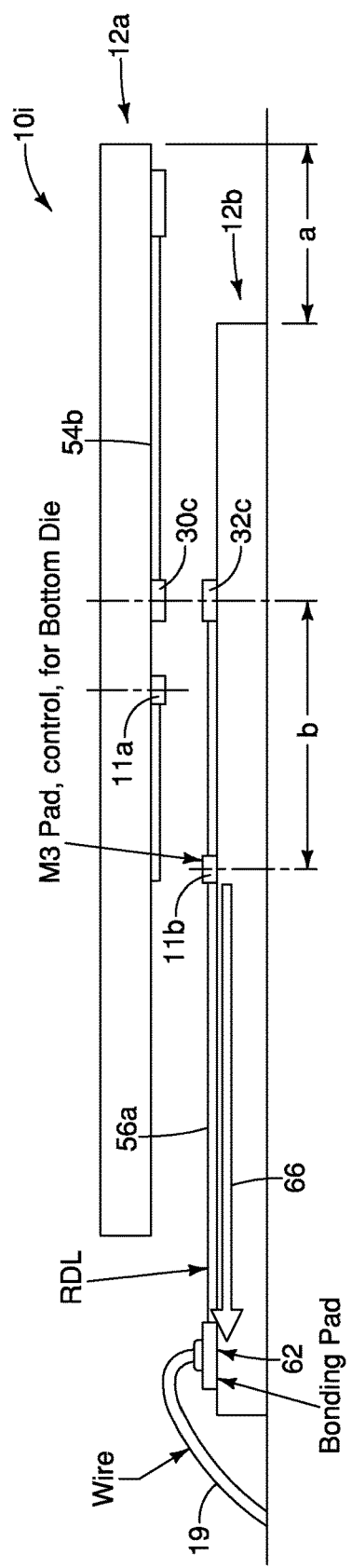

FIG. 19A shows a cross-section through assembly 10i along the wiring segments 54a, 56b; and FIG. 19B shows a cross-section through assembly 10i along the wiring segments 54b, 56a. The first interconnection region 11a of FIG. 19A is electrically coupled to a wire 19 through a path 64 that extends along wiring segments 56b and 54a, and through pad 60; and the second interconnection region 11b of FIG. 19B is electrically coupled to a wire 19 through a path 66 that extends along wiring segment 56a and through pad 62.

Figure 18:
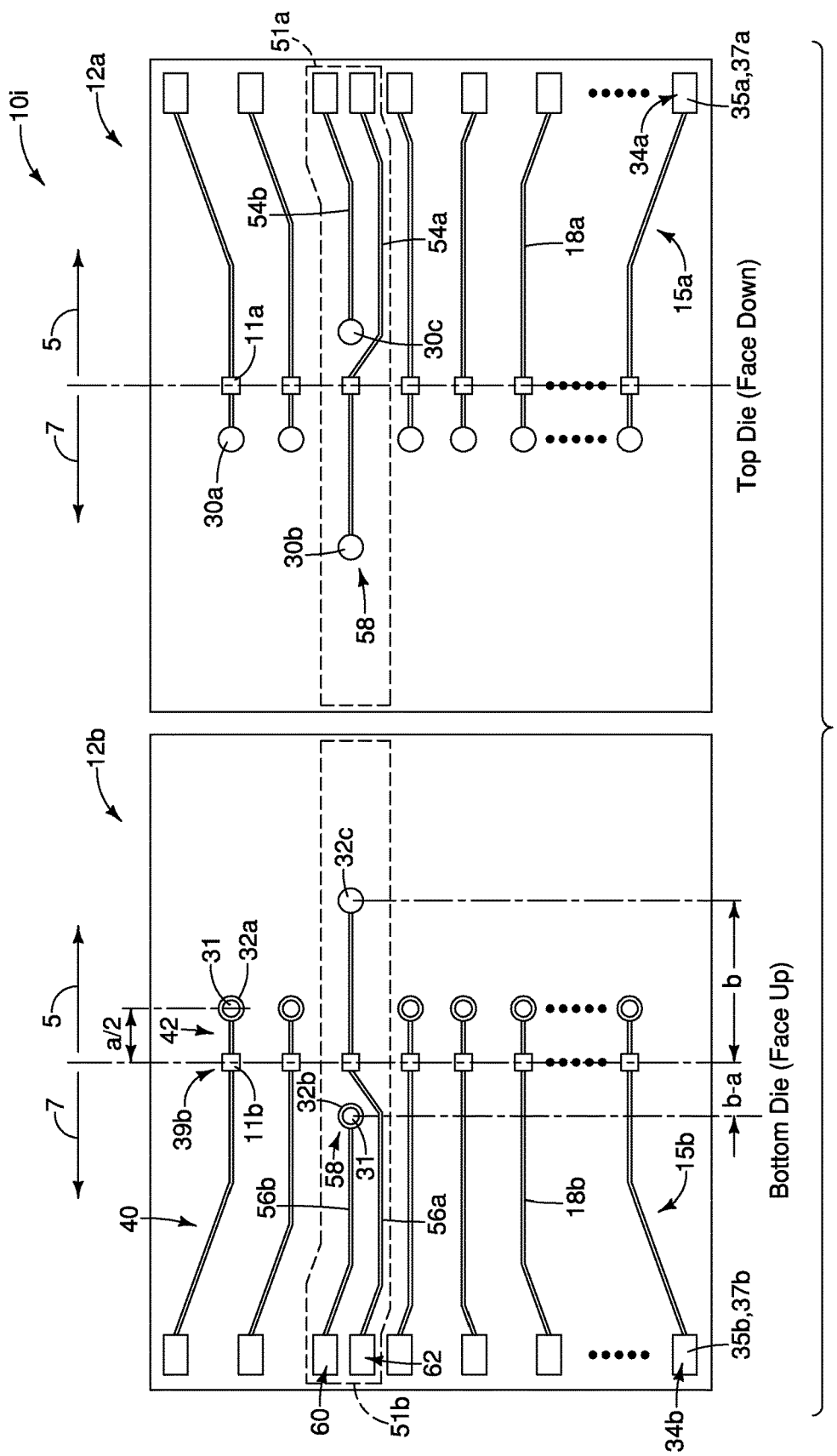
FIG. 18 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 18.

The wire bonding pads and probe pads (analogous to the pads 37, 35 discussed above) may be placed in any suitable locations within the illustrated pads 34a, 34b, 60 and 62 of the assembly 10i of FIGS. 18, 19 and 19A.

Figure 20:
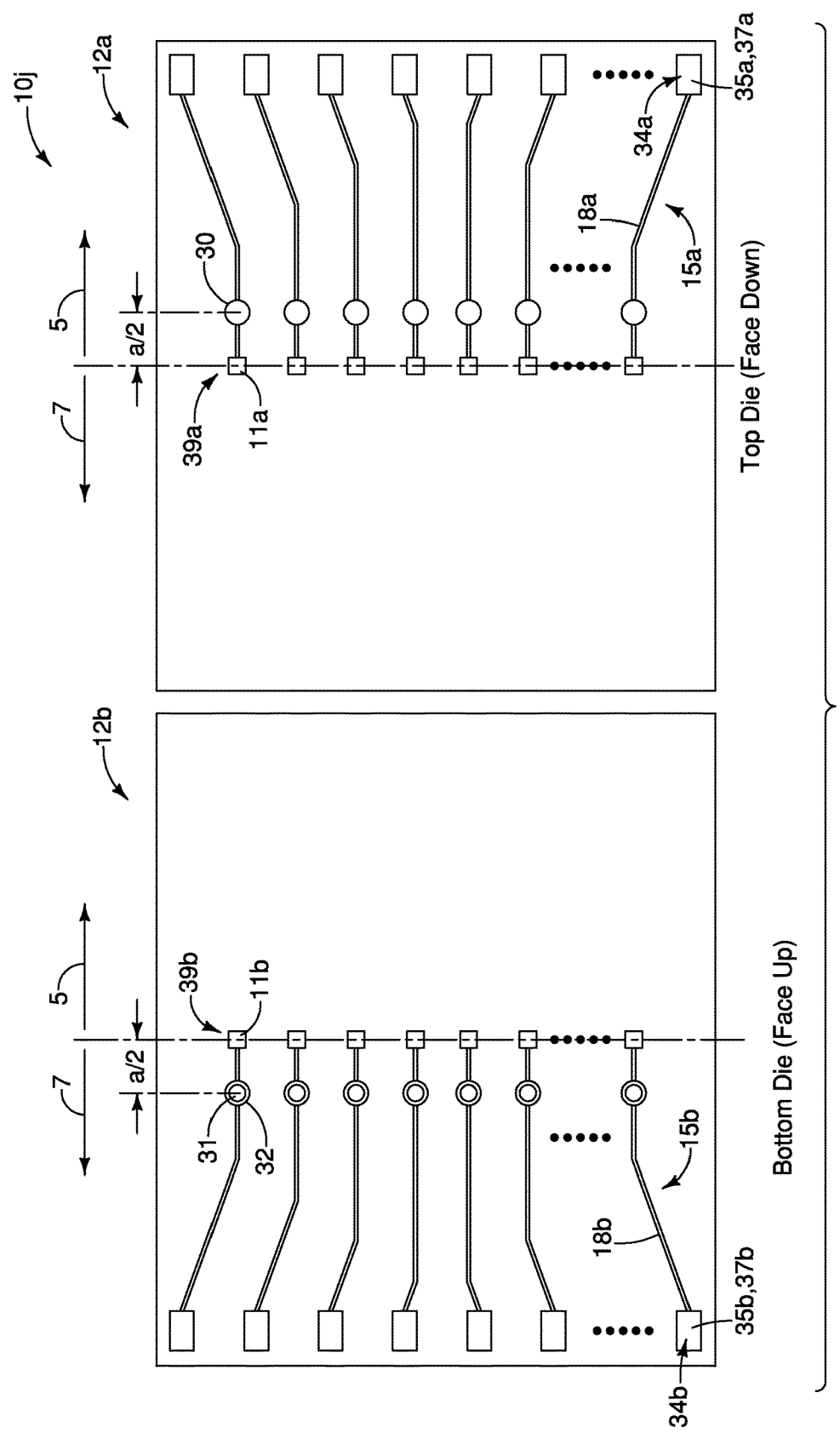
FIG. 20 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 20.
Figure 22:
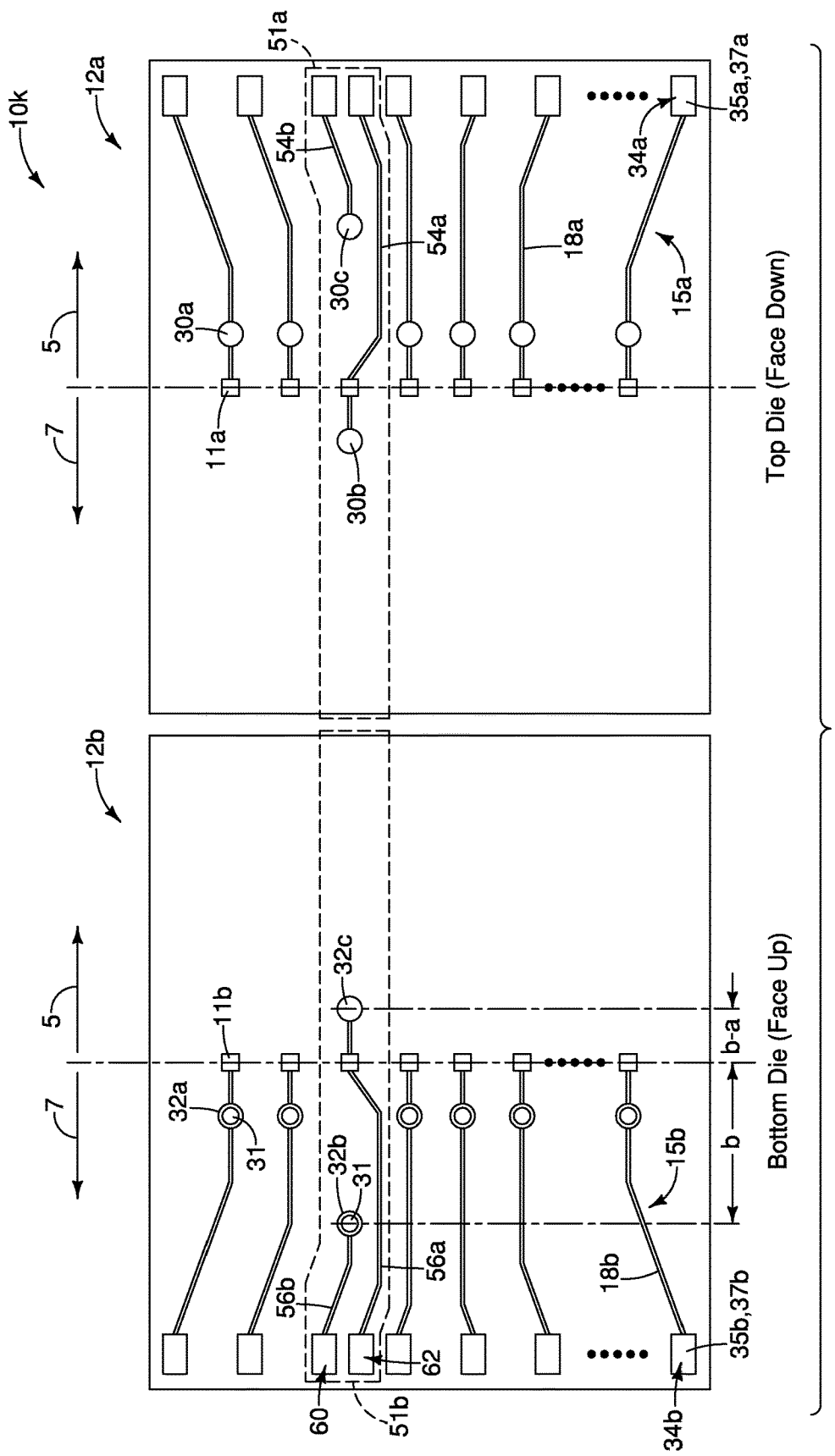
FIG. 22 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 22.

Referring to FIG. 20, such shows semiconductor dies 12a, 12b configured so that they may be assembled in a face-to-face relationship in an assembly 10j. The die 12b is illustrated in a face-up orientation, and the die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The dies 12a and die 12b have the coupling regions 30 and 32, respectively. When the dies are in face-to-face relationship, the coupling regions 30 align with the coupling regions 32. Solder bumps or other suitable interconnects 31 may be formed to interconnect coupling regions 30 with coupling regions 32.

The M3 pad regions (i.e. interconnection regions) 11a are arranged in the first line 39a, and the M3 pad regions 11b are arranged in the second line 39b. First redistribution wiring 18a is electrically coupled with the M3 pad regions 11a of the first die 12a, and second redistribution wiring 18b is electrically coupled with the M3 pad regions 11b of the second die 12b.

The coupling regions 32 are laterally offset from the line 39b by a distance "a/2" along the second direction represented by the arrow 7, and the coupling regions 30 are laterally offset from the line 39a by the distance "a/2" along the first direction represented by the arrow 5.

The first redistribution wiring 18a is comprised by the first redistribution wiring layer 15a, and the second redistribution wiring 18b is comprised by the second redistribution wiring layer 15b.

The redistribution wiring layers 15a of the top die 12a extend to first pads 34a, and the redistribution wiring layers 15b of the bottom die 12b extend to second pads 34b. The pads 34a and 34b comprise regions 35a, 37a, 35b and 37b; with the regions 35a, 35b being the probe pads, and the regions 37a, 37b being the bonding pads.

The dies 12a, 12b are substantially identical to one another.

FIG. 21 shows assembly 10j in an arrangement in which the dies are in face-to-face relationship. The bottom die 12b is face up, and the top die 12a is face down. The assembly 10h is viewed downwardly through the backside surface 16 of the top die 12a. Circuitry between the dies is schematically illustrated as if viewed through all materials and structures that may be over the circuitry. Overlap of the coupling regions 30 with the coupling regions 32 is apparent; as is lateral spacing of the M3 pad regions (i.e., interconnection regions) 11a and 11b by a distance "a".

FIG. 21A shows a cross-section through assembly 10i, and more clearly indicates that the first and second dies 12a and 12b are in face-to-face relationship with one another. One of the first interconnection regions 11a can be seen to be both vertically displaced and laterally offset from one of the second interconnection regions 11b. The first interconnection region 11a is electrically coupled to a wire 19 through a path along wiring 18a and 18b, and the second interconnection region 11b is electrically coupled to the wire 19 through a path along wiring 18b. The assembly 10i of FIG. 21A has bond pad 34b offset relative to an edge of the upper die 12a.

Referring to 22, 23, 23A and 23B, such show semiconductor dies 12a, 12b configured so that they may be assembled in a face-to-face relationship in an assembly 10k having wiring trace regions (i.e., control regions, or tailored regions) 51a and 51b, respectively analogous to the those discussed above with reference to FIGS. 18, 19 and 19A. The die 12b is illustrated in a face-up orientation, and the die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The die 12a has the coupling regions 30 (specifically, 30a, 30b and 30c), and the die 12b has the coupling regions 32 (specifically, 32a, 32b and 32c). When the dies are in face-to-face relationship, the coupling regions 30 align with the coupling regions 32. Solder bumps or other suitable interconnects 31 may be formed to interconnect coupling regions 30a and 30b with coupling regions 32a and 32b.

First redistribution wiring 18a is electrically coupled with the M3 pad regions 11a of the first die 12a, and second redistribution wiring 18b is electrically coupled with the M3 pad regions 11b of the second die 12b.

The first redistribution wiring 18a is comprised by a first redistribution wiring layer 15a, and the second redistribution wiring 18b is comprised by a second redistribution wiring layer 15b.

The dies 12a, 12b are substantially identical to one another.

Figure 23:
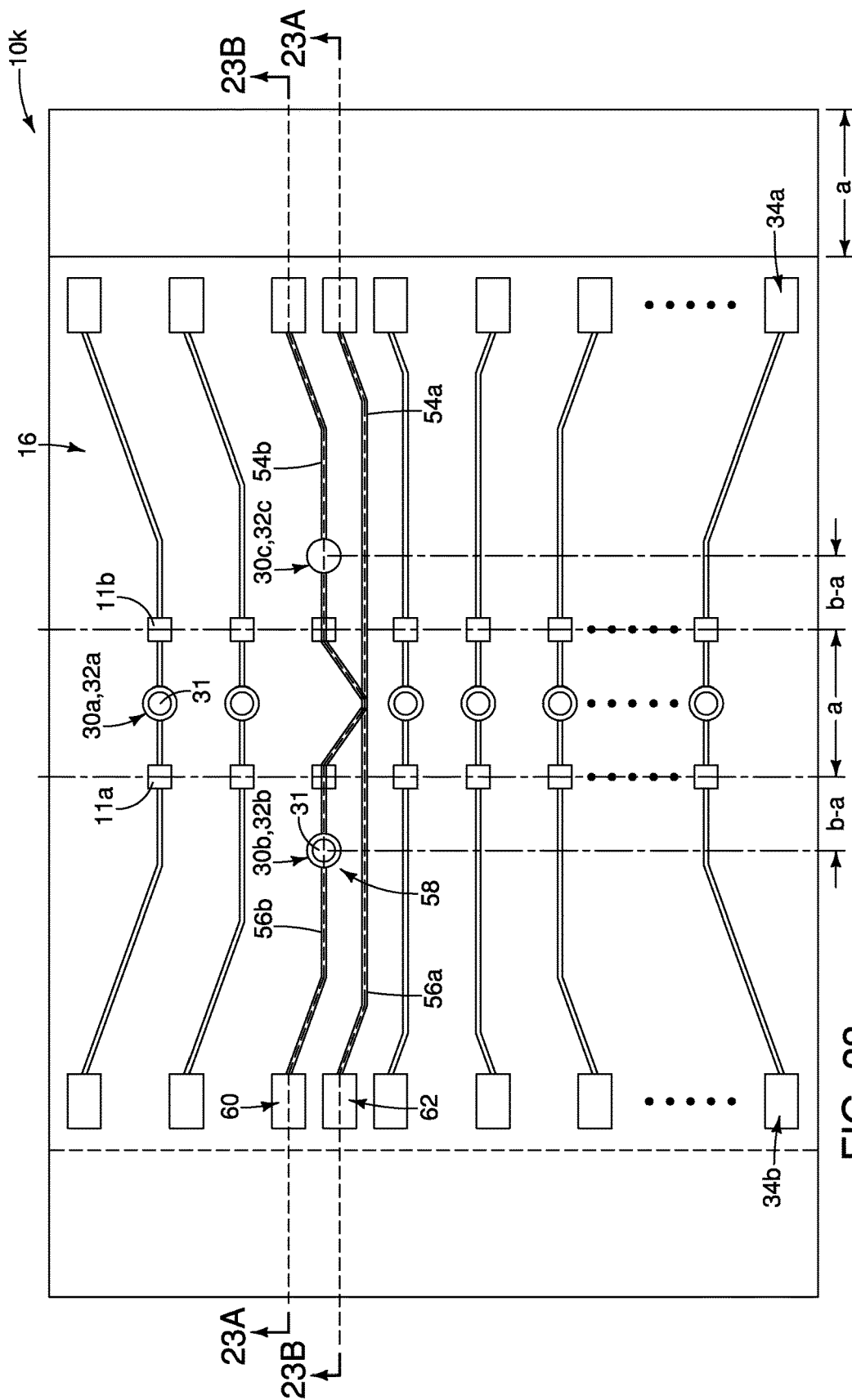
FIG. 23 is a diagrammatic top-down view of the two dies of FIG. 22 stacked one atop another in a face-to-face arrangement, and schematically illustrates overlap of the circuitry of the two dies along an interface where the faces of the two dies are joined to one another. The circuitry is illustrated as if viewed through all materials and structures that may be over the circuitry, including the back-side surface of the top die.

FIG. 23 shows assembly 10k in an arrangement in which the dies are in face-to-face relationship. The bottom die 12b is face up, and the top die 12a is face down. The assembly 10k is viewed downwardly through the backside surface 16 of the top die 12a. Circuitry between the dies is schematically illustrated as if viewed through all materials and structures that may be over the circuitry. Overlap of the coupling regions 30 with the coupling regions 32 is apparent; as is lateral offset of the M3 pad regions (i.e., interconnection regions) 11a and 11b. Also, the dies 12a and 12b are laterally offset relative to one another.

Figure 23A:
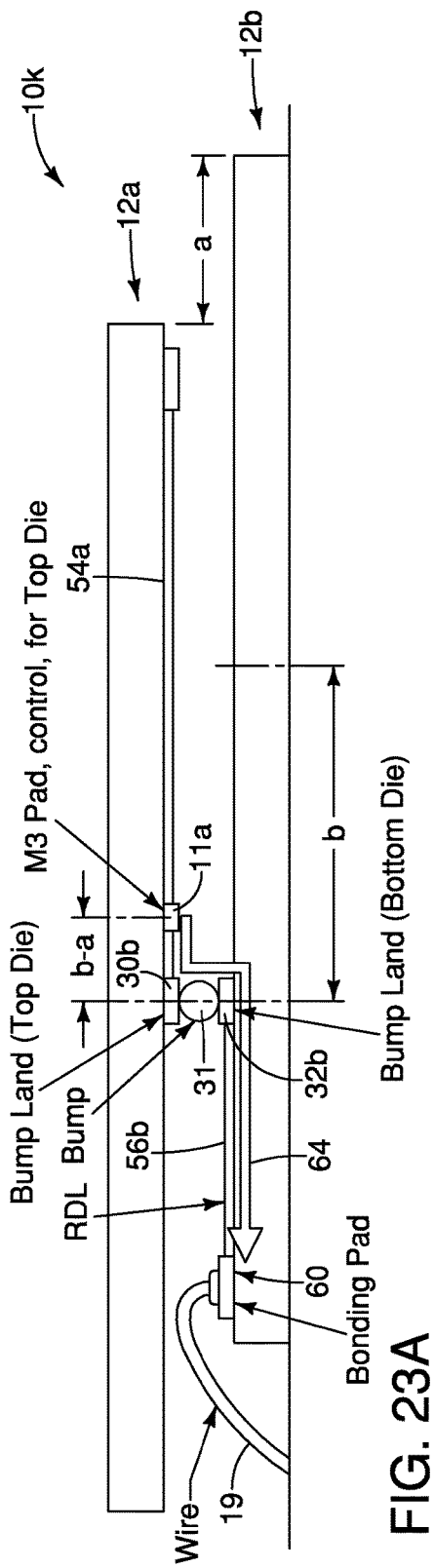
FIGS. 23A and 23B are diagrammatic cross-sectional side views along the lines 23A-23A of FIG. 23, and 23B-23B of FIG. 23, respectively.
Figure 23B:
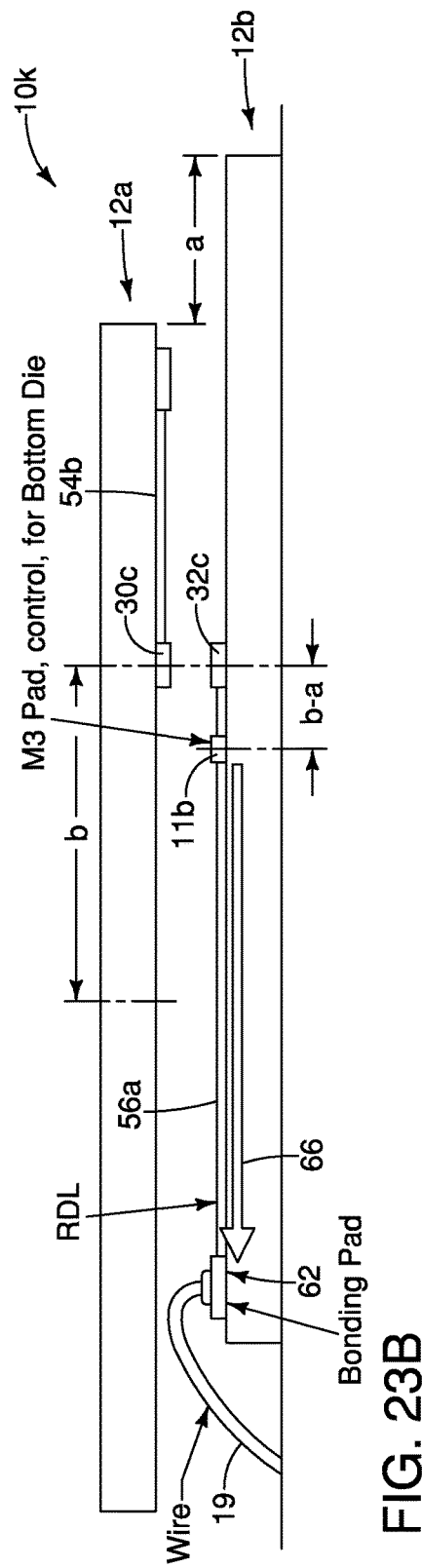

FIG. 23A shows a cross-section through assembly 10k along the wiring segments 54a, 56b; and FIG. 23B shows a cross-section through assembly 10k along the wiring segments 54b, 56a. The first interconnection region 11a of FIG. 23A is electrically coupled to a wire 19 through a path 64 that extends along wiring segments 56b and 54a, and through pad 60; and the second interconnection region 11b of FIG. 23B is electrically coupled to a wire 19 through a path 66 that extends along wiring segment 56a and through pad 62.

The wire bonding pads and probe pads may be placed in any suitable locations within the illustrated pads 34a, 34b, 60 and 62 of the assembly 10k of FIGS. 22, 23, 23A and 23B.

The embodiments of FIGS. 16-23 may be considered to laterally slip the dies 12a, 12b relative to one another. This may provide advantages relative to embodiments in which the dies are not laterally slipped relative to one another (for instance, the embodiment of FIGS. 11-12) in that the number of bump lands may be reduced by half.

Figure 24:
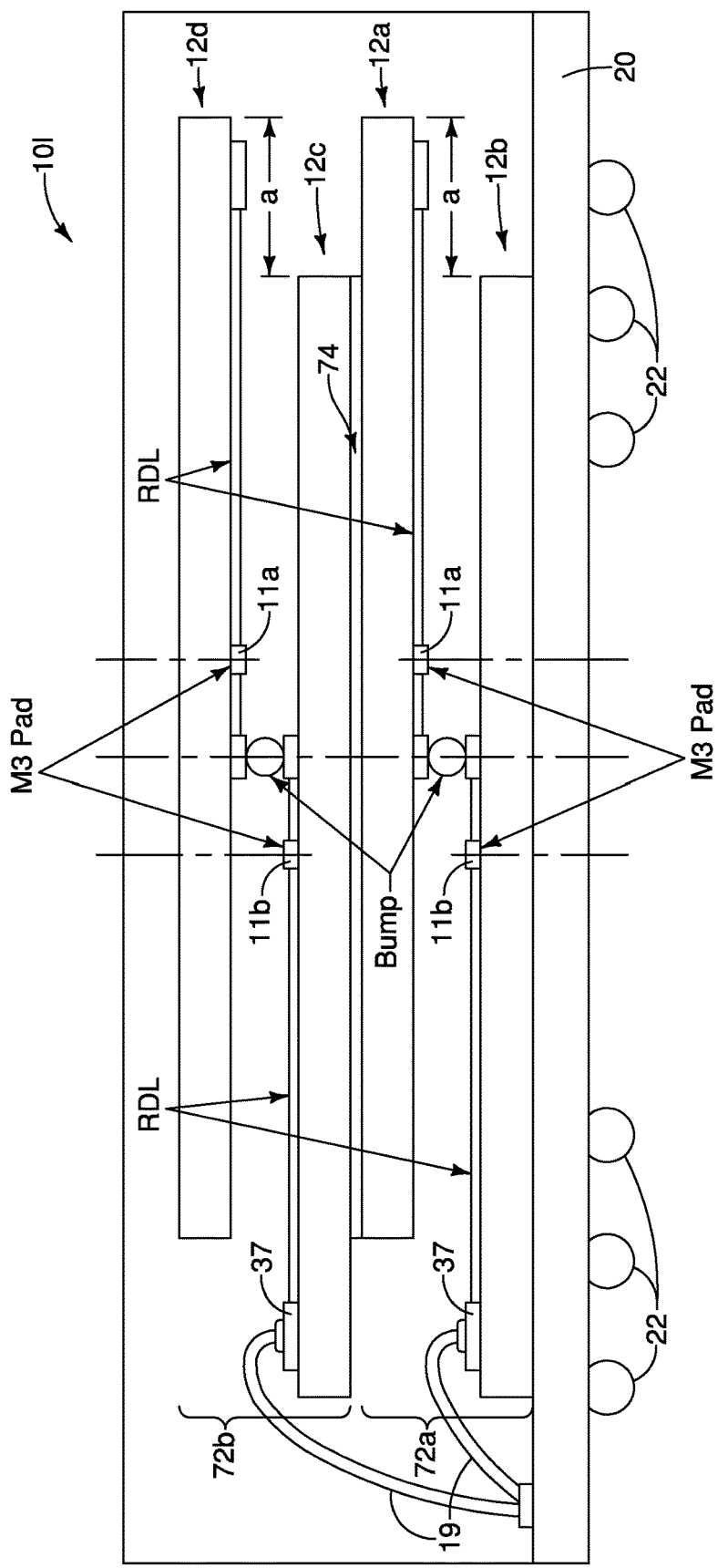
FIGS. 24 and 25 are diagrammatic cross-sectional side views of assemblies comprising multiple sets of paired dies in face-to-face arrangements, with the sets being vertically stacked one atop another.
Figure 25:
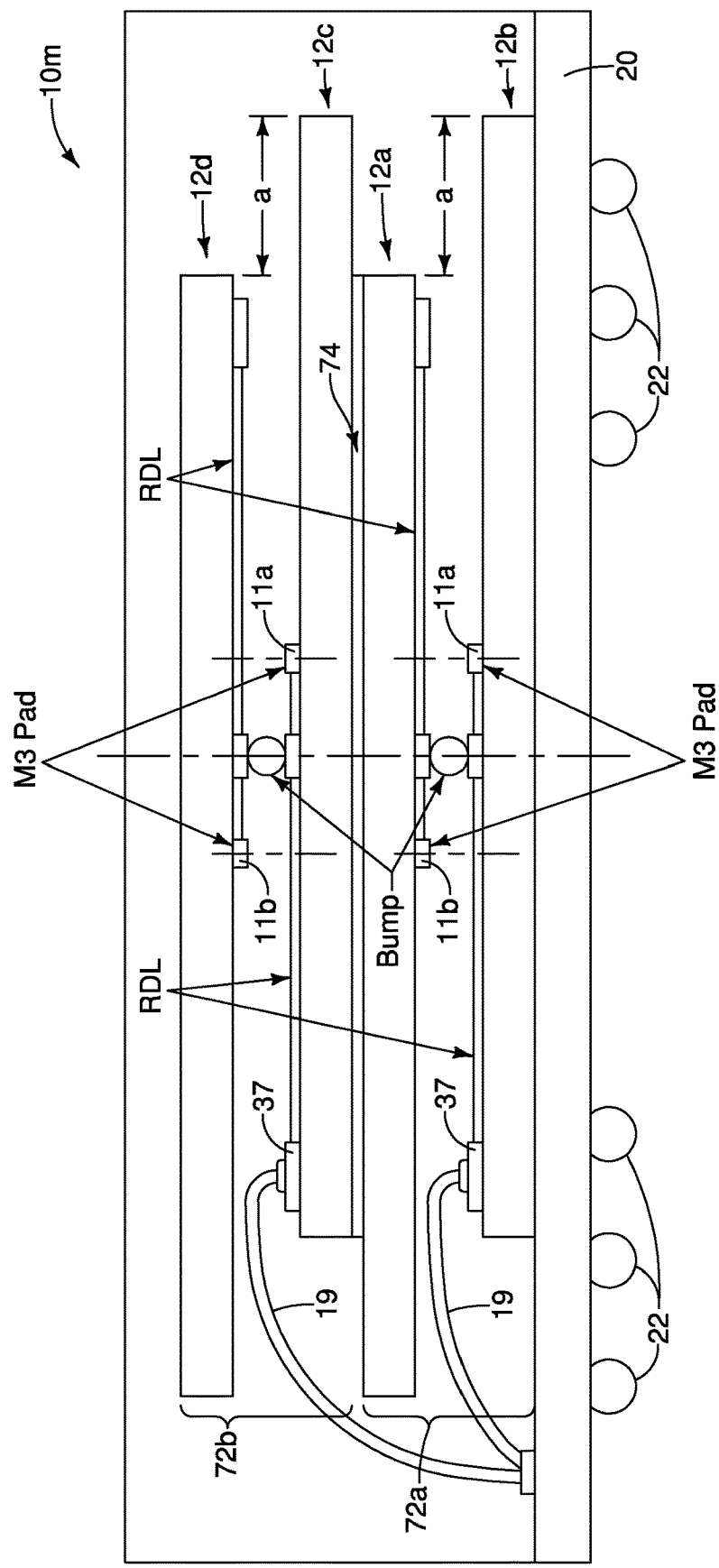

The paired dies 12a, 12b of the embodiments of FIGS. 16-23 may be incorporated into packaged assemblies having multiple face-to-face assemblies (e.g., assemblies analogous to the assembly 10g discussed above with reference to FIG. 15). For instance, FIGS. 24 and 25 shows packaged assemblies 10l and 10m, respectively, in which the dies 12a, 12b form a first face-to-face die assembly 72a, and in which a second pair of dies 12c, 12d form a second face-to-face die assembly 72b. The packaged assembly 10l of FIG. 24 comprise face-to-face dies in the configuration described above with reference to FIGS. 16, 17 and 17A; and the packaged assembly 10m of FIG. 25 comprise face-to-face dies in the configuration described above with reference to FIGS. 20, 21 and 21A.

In some embodiments, one of the first interconnection regions 11a may be utilized in a supply circuit together with one of the second interconnection regions 11b. FIGS. 26-36 illustrate example embodiments of supply circuits configured to utilize a pair of regions 11a and 11b.

Figure 26:
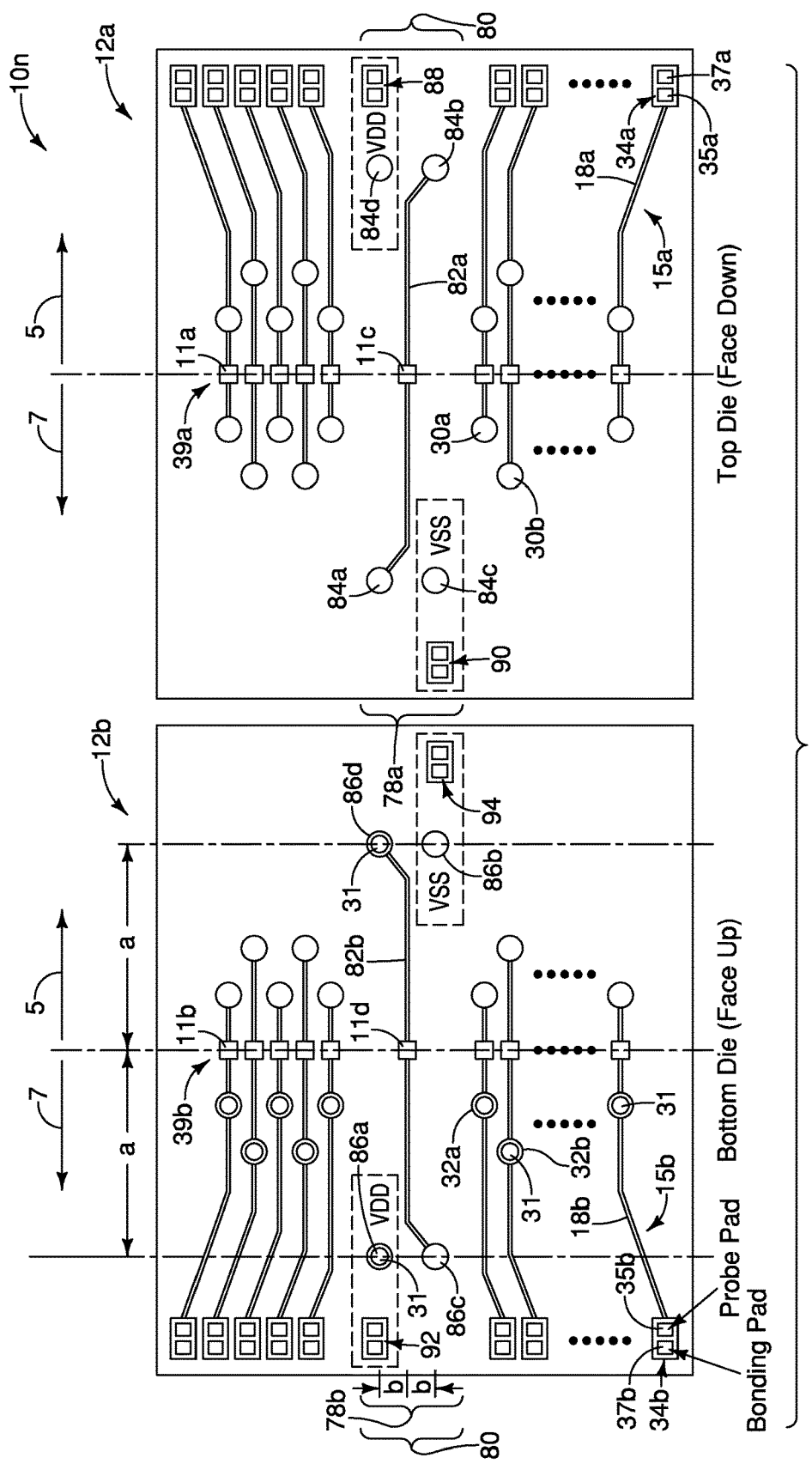
FIG. 26 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 26.

Referring to FIG. 26, such shows semiconductor dies 12a, 12b configured so that they may be assembled in a face-to-face relationship in an assembly 10n. The die 12b is illustrated in a face-up orientation, and the die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The dies 12a and die 12b have the coupling regions 30a, 30b, 32a and 32b. When the dies are in face-to-face relationship, the coupling regions 30a align with the coupling regions 32a, and the coupling regions 30b align with the coupling regions 32b. Solder bumps or other suitable interconnects 31 may be formed to interconnect coupling regions 30a with coupling regions 32a, and to interconnect the coupling regions 30b with coupling regions 32b.

The M3 pad regions (i.e. interconnection regions) 11a are arranged in the first line 39a, and the M3 pad regions 11b are arranged in the second line 39b. First redistribution wiring 18a is electrically coupled with the M3 pad regions 11a of the first die 12a, and second redistribution wiring 18b is electrically coupled with the M3 pad regions 11b of the second die 12b.

A supply circuit 80 comprises a region 78a along first die 12a, and a region 78b along second die 12b. The region 78a of the supply circuit 80 comprises one of the first interconnection regions labeled as 11c, and the region 78b of the supply circuit 80 comprises one of the second interconnection regions labeled as 11d. The interconnection region 11c is along a first wiring 82a extending between coupling regions 84a and 84b, with the wiring 82a being along the first die 12a. The interconnection region 11d is along a wiring 82b extending between coupling regions 86c and 86d, with the wiring 82b being along the second die 12b. In some embodiments, one of the wirings 82a, 82b may be referred to as a first wiring and the other may be referred to as a second wiring.

The region 78a also comprises coupling regions 84c and 84d which align with the regions 86c and 86d of region 78b; and the region 78b also comprises coupling regions 86a and 86b which align with the regions 84a and 84b of region 78a. The regions 86a and 86b are within a VDD plane and VSS plane, respectively (i.e., are coupled with VDD circuitry and VSS circuitry, respectively); and the regions 84c and 84d are coupled with the VSS and VDD circuitry, respectively.

The redistribution wiring layers 15a of the top die 12a extend to first pads 34a, and the redistribution wiring layers 15b of the bottom die 12b extend to second pads 34b. The pads 34a and 34b comprise regions 35a, 37a, 35b and 37b; with the regions 35a, 35b being the probe pads, and the regions 37a, 37b being the bonding pads. The supply circuit regions 78a and 78b include pads 88, 90, 92 and 94.

Figure 27:
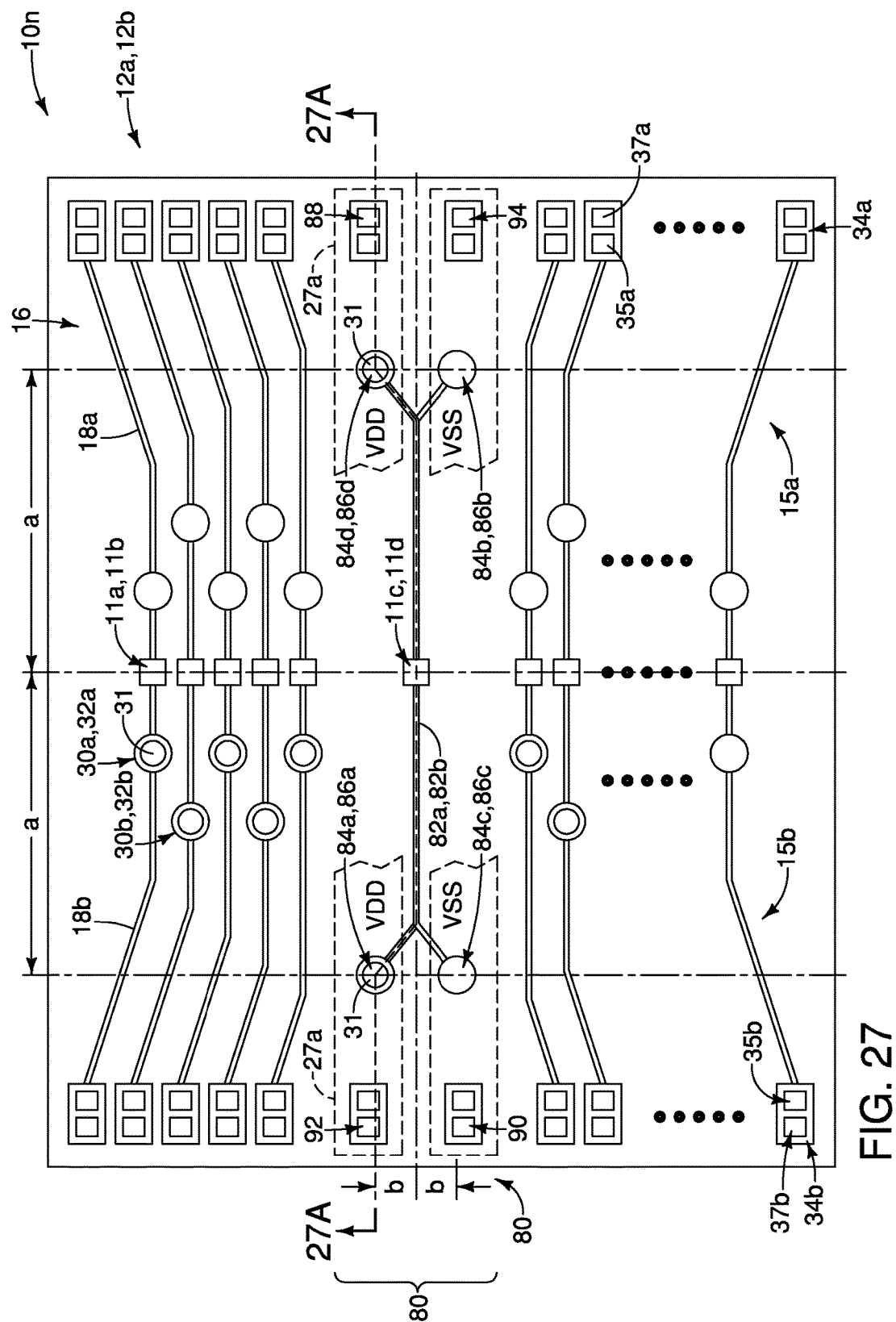
FIGS. 27 and 28 are diagrammatic top-down views of the two dies of FIG. 26 stacked one atop another in a face-to-face arrangement in a first operational state (FIG. 27) and a second operational state (FIG. 28).

FIG. 27 shows assembly 10n in an arrangement in which the dies are in face-to-face relationship, and in which the supply circuit 80 provides VDD. The bottom die 12b is face up, and the top die 12a is face down. The assembly 10n is viewed downwardly through the backside surface 16 of the top die 12a. Circuitry between the dies is schematically illustrated as if viewed through all materials and structures that may be over the circuitry. Overlap of the coupling regions 30a/32a and 30b/32b is apparent; as is vertical overlap of the interconnection regions 11a and 11b. Additionally, it can be seen that there is overlap of coupling regions 84a/86a, 84b/86/b, 84c/86c and 84d/86d; as well as vertical overlap of interconnection regions 11c/11d. Regions 84a/86a are electrically coupled to one another through an interconnect 31, and regions 84d/86d are also electrically coupled to one another through an interconnect 31. The regions 84b/86b are not electrically coupled with one another, and the regions 84c/86c are also not electrically coupled with one another.

Figure 28A:
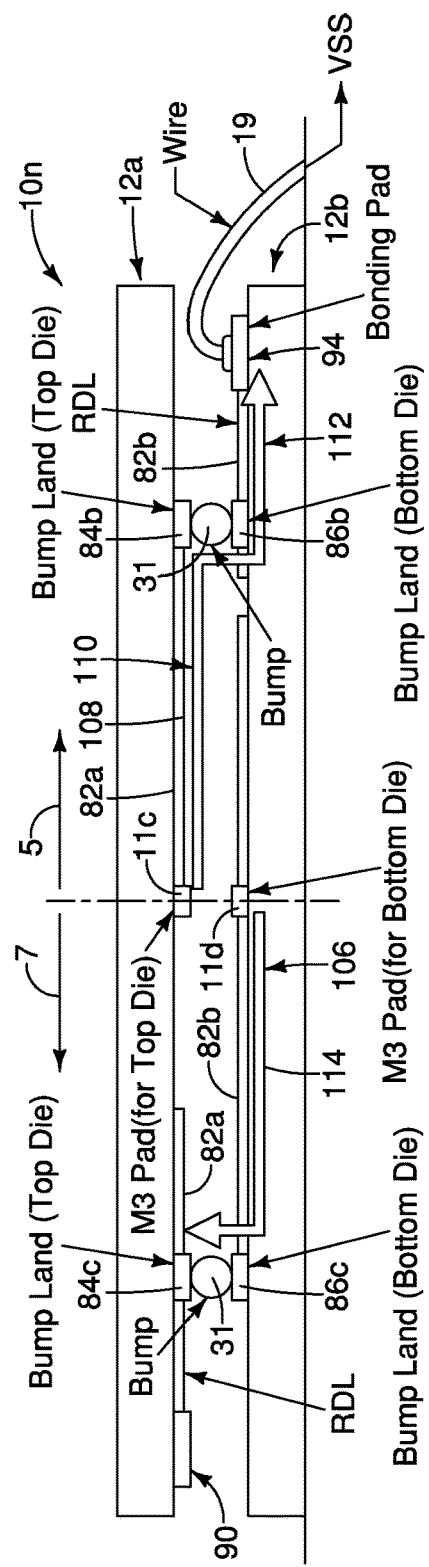
Figure 28:
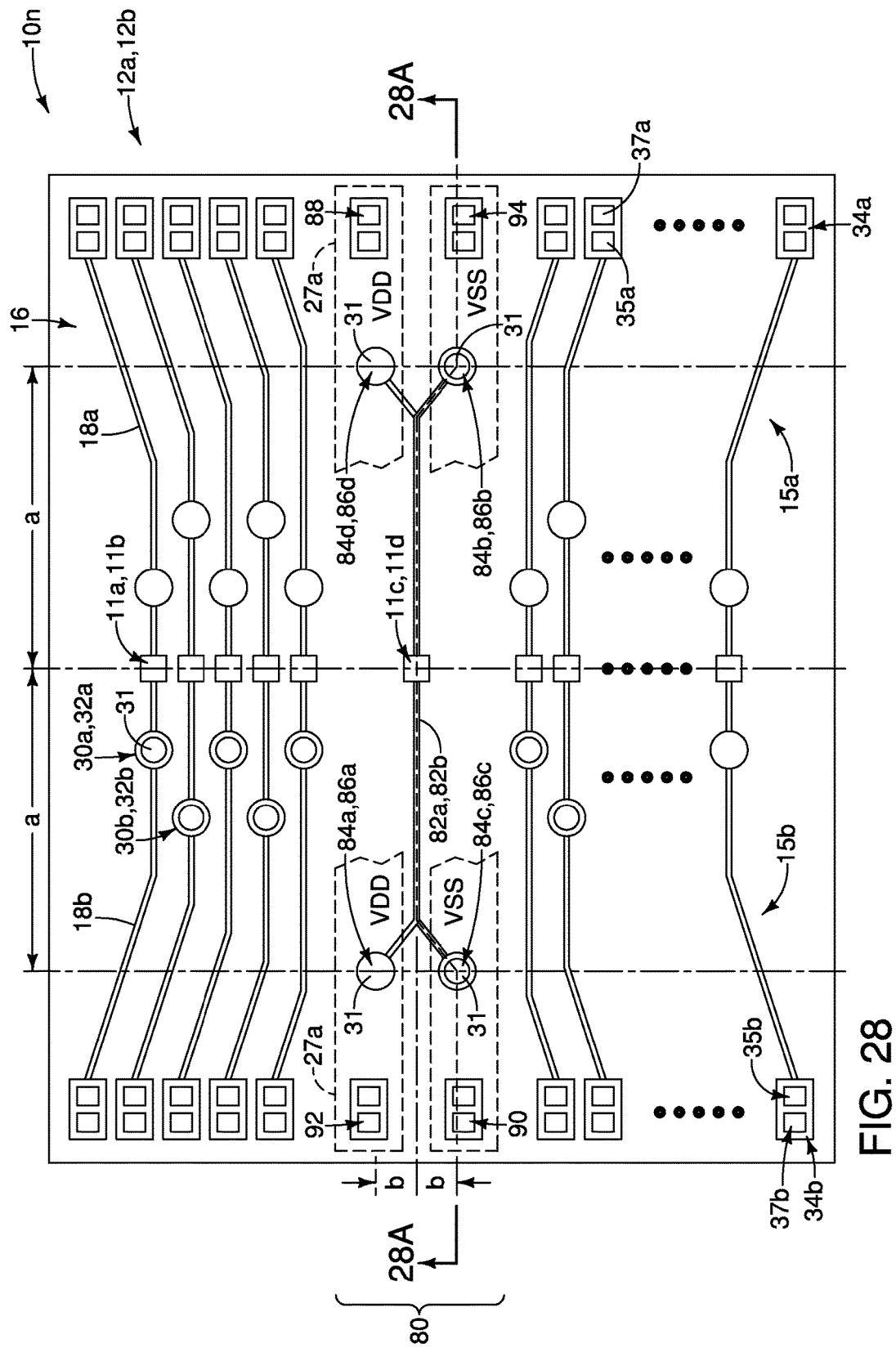

FIG. 28 shows assembly 10n in an arrangement analogous to that of FIG. 27, but in which the supply circuit 80 provides VSS. Regions 84b/86b are electrically coupled to one another through an interconnect 31, and regions 84c/86c are also electrically coupled to one another through an interconnect 31. The regions 84a/86a are not electrically coupled with one another, and the regions 84d/86d are also not electrically coupled with one another.

It is noted that there is substantial mirror symmetry across a horizontal plane along the supply region 80 of FIGS. 27 and 28, as indicated with the common distance "b" from the center of the supply region 80 to the middle of pads 88, 90, 92 and 94.

Figure 27A:
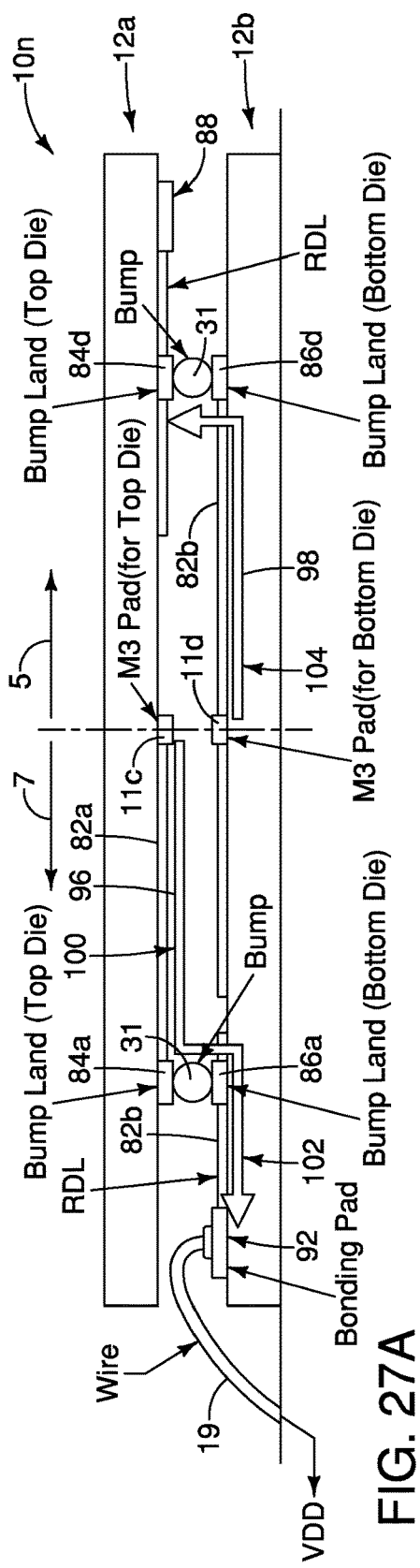
FIGS. 27A and 28A are diagrammatic cross-sectional side views along the lines 27A-27A of FIG. 27, and 28A-28A of FIG. 28, respectively.

FIG. 27A shows a cross-section through assembly 10n along the line 27A-27A of FIG. 27; and FIG. 28A shows a cross-section through assembly 10n along the line 28A-28A of FIG. 28. The VDD supply of FIG. 27A includes a path 96 that extends along the second lateral direction represented by arrow 7, and a path 98 that extends along the first lateral direction represented by arrow 5. The path 96 extends from the first interconnect region 11c, through a region of the wiring 82a along the first die 12a, through the electrically connected coupling regions 84a/86a, through a region of the wiring 82b along the second die 12b, and to a wire 19 electrically coupled with VDD. In some embodiments, the path 96 may being considered to comprise a first wiring segment 100 extending from interconnect 11c to coupling region 84a, and a second wiring segment 102 extending from coupling region 86a to pad 92. Notably, the second wiring segment 102 is offset from the second interconnect region 11d along the second lateral direction represented by arrow 7 in the cross-sectional view of FIG. 27A. The path 98 extends from the second interconnect region 11d, through a region of the wiring segment 82b along the second die 12b and through the electrically coupled regions 84d/86d. In some embodiments, the path 98 may be considered to comprise a third wiring segment 104 which extends from the interconnect region 11d to the coupling region 86d.

The VSS supply of FIG. 28A includes a path 106 that extends along the second lateral direction represented by arrow 7, and a path 108 that extends along the first lateral direction represented by arrow 5. The path 108 extends from the first interconnect region 11c, through a region of the wiring 82a along the first die 12a, through the electrically connected coupling regions 84b/86b, through a region of the wiring 82b along the second die 12b, and to a wire 19 electrically coupled with VSS. In some embodiments, the path 108 may being considered to comprise a first wiring segment 110 extending from interconnect 11c to coupling region 84b, and a second wiring segment 112 extending from coupling region 86b to pad 94. Notably, the second wiring segment 112 is offset from the second interconnect region 11d along the first lateral direction represented by arrow 5 in the cross-sectional view of FIG. 27A. The path 106 extends from the second interconnect region 11d, through a region of the wiring segment 82b along the second die 12b and through the electrically coupled regions 84c/86c. In some embodiments, the path 106 may be considered to comprise a third wiring segment 114 which extends from the interconnect region 11d to the coupling region 86c.

Figure 29:
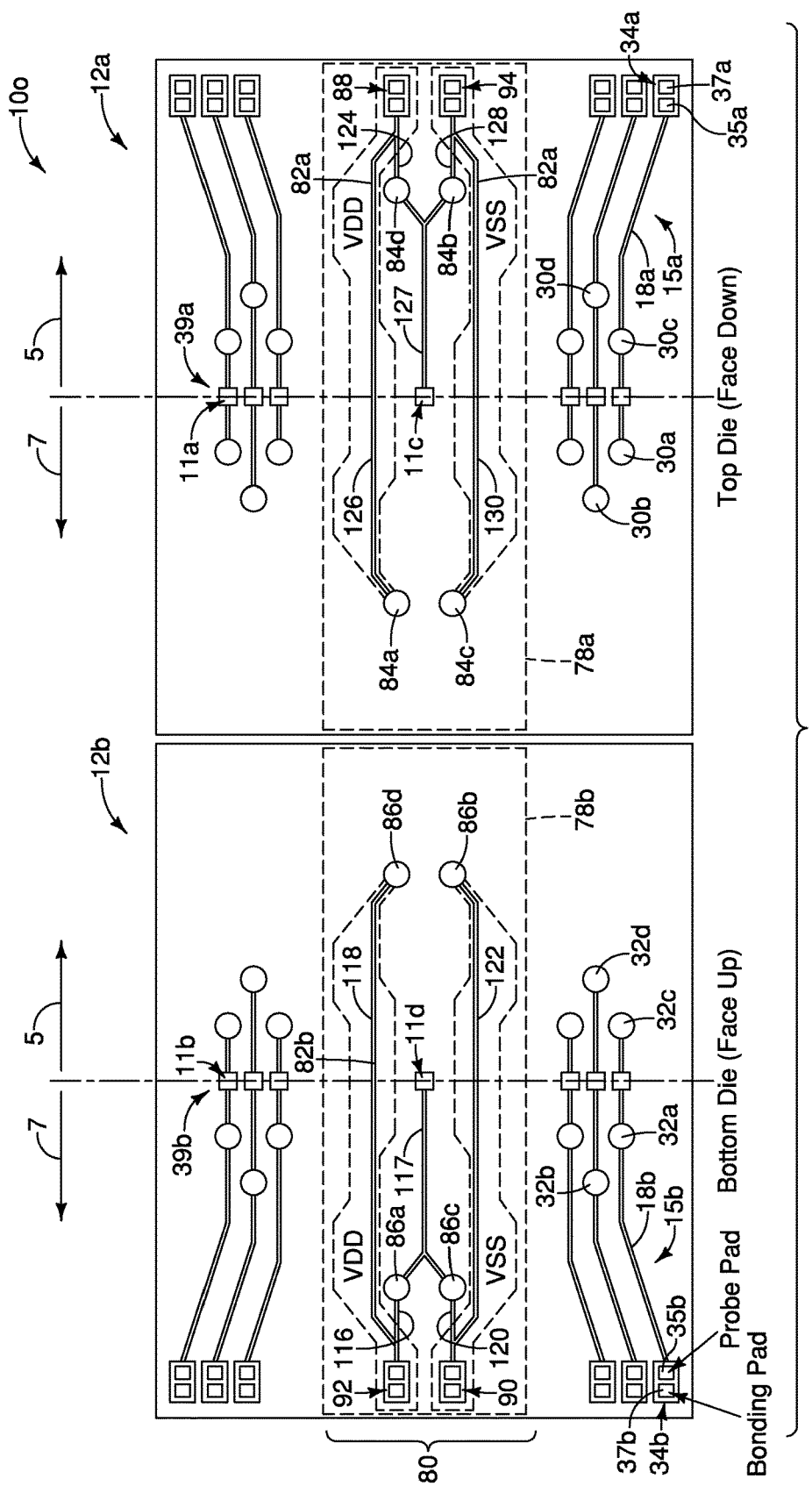
FIG. 29 is a diagrammatic view of an example semiconductor die that may be utilized for the bottom die of a face-to-face die assembly (left side die), and a diagrammatic view an example semiconductor die that may be utilized for the top die of the face-to-face die assembly (right side die). The left side die is face-side up, and the right-side die is face-side down. Example circuitry along face-sides of the left-side die and the right-side die is schematically illustrated as if viewed through all materials and structures that may be over the circuitry, and it is to be understood that the circuitry is under the right-side die in the face-down view of FIG. 29.

Referring to FIG. 29, such shows semiconductor dies 12a, 12b configured so that they may be assembled in a face-to-face relationship in an assembly 10o. The die 12b is illustrated in a face-up orientation, and the die 12a is illustrated in a face-down orientation. Circuitry associated with the dies (e.g., redistribution wiring layers 15a, 15b; M3 pads 11a, 11b; etc.) is schematically illustrated as if viewed through all materials and structures that may be over the circuitry in order to simplify the drawings. However, it is to be understood that the circuitry may be covered with one or more materials; and, in the case of die 12a, the circuitry is along a bottom of the die.

The die 12a has the coupling regions 30a, 30b, 30c, 30d; and the die 12b has the coupling regions 32a, 32b, 32c, 32d. When the dies are in face-to-face relationship, the coupling regions 30a align with the coupling regions 32a, the coupling regions 30b align with the coupling regions 32b, the coupling regions 30c align with the coupling regions 32c, and the coupling regions 30d align with the coupling regions 32d. Solder bumps or other suitable interconnects 31 may be formed to interconnect the aligned coupling regions 30a/32a, 30b/32b, 30c/32c and 30d/32d, as desired.

The M3 pad regions (i.e. interconnection regions) 11a are arranged in the first line 39a, and the M3 pad regions 11b are arranged in the second line 39b. First redistribution wiring 18a is electrically coupled with the M3 pad regions 11a of the first die 12a, and second redistribution wiring 18b is electrically coupled with the M3 pad regions 11b of the second die 12b.

A supply circuit 80 comprises a region 78a along first die 12a, and a region 78b along second die 12b. The region 78a of the supply circuit 80 comprises one of the first interconnection regions labeled as 11c, and the region 78b of the supply circuit 80 comprises one of the second interconnection regions labeled as 11d. The interconnection region 11c is along a first wiring 82a extending between coupling regions 84a, 84b, 84c and 84d; with the wiring 82a being along the first die 12a. The interconnection region 11d is along a wiring 82b extending between coupling regions 86a, 86b, 86c and 86d; with the wiring 82b being along the second die 12b. In some embodiments, one of the wirings 82a, 82b may be referred to as a first wiring and the other may be referred to as a second wiring.

The coupling regions 84a, 86a, 84d and 86b are included within a VDD plane (i.e., are coupled with VDD circuitry); and the coupling regions 84b, 86b, 84c and 86c are within a VSS plane (i.e., are coupled with VSS circuitry).

The redistribution wiring layers 15a of the top die 12a extend to first pads 34a, and the redistribution wiring layers 15b of the bottom die 12b extend to second pads 34b. The pads 34a and 34b comprise regions 35a, 37a, 35b and 37b; with the regions 35a, 35b being the probe pads, and the regions 37a, 37b being the bonding pads. The supply circuit regions 78a and 78b include pads 88, 90, 92 and 94.

In some embodiments, the pad 92 may be referred to as a first pad along the second die 12b and coupled with VDD, and the pad 90 may be referred to as a second pad along the second die 12b and coupled with VSS. In some embodiments, the coupling regions 86a and 86d may be referred to as first and second coupling regions which are coupled with the first pad 92 through first and second wiring segments 116 and 118, respectively. The first coupling region 86a is electrically coupled with the second interconnect region 11d through a wiring segment 117. The coupling regions 86c and 86b may be referred to as third and fourth coupling regions which are coupled with the second pad 90 through third and fourth wiring segments 120 and 122, respectively. The third coupling region 86c is electrically coupled with the second interconnect region 11d through the wiring segment 117.

The coupling regions 84d, 84a, 84b and 84c may be referred to as fifth, sixth, seventh and eighth coupling regions, respectively; and are directly over the second, first, fourth and third coupling regions 86d, 86a, 86b and 86d, respectively. A fifth wiring segment 124 extends to the fifth coupling region 84d; a sixth wiring segment 126 extends to the sixth coupling region 84a; a seventh wiring segment 128 extends to the seventh coupling region 84b; and an eighth wiring segment 130 extends to the eighth coupling region 84c. The fifth and seventh coupling regions 84d, 84b are electrically coupled to the first interconnect region 11c through a wiring segment 127.

Selective coupling of the various regions 84a/86a, 84b/86b, 84c/86d, 84d,86d may enable the supply circuit 80 to be operated in one of four modes (i.e., conditions). Accordingly, the same dies 12a, 12b may provide operational flexibility to attain any one of four different supply circuit configurations. The supply circuit configurations are described with reference to FIGS. 30-33. As a preliminary matter, it is noted that FIGS. 30-33 show assembly 10o in various arrangements in which the dies are in face-to-face relationship; and in which the supply circuit 80 provides VDD or VSS. In the arrangements of FIGS. 30-33, the bottom die 12b is face up, and the top die 12a is face down. The assembly 10o is viewed downwardly through the backside surface 16 of the top die 12a. Circuitry between the dies is schematically illustrated as if viewed through all materials and structures that may be over the circuitry. It is noted that in some embodiments the various arrangements of FIGS. 30-33 may provide potential on one of the interconnection regions 11c, 11d while allowing the other of the interconnections 11c, 11d to electrically float.

Figure 30:
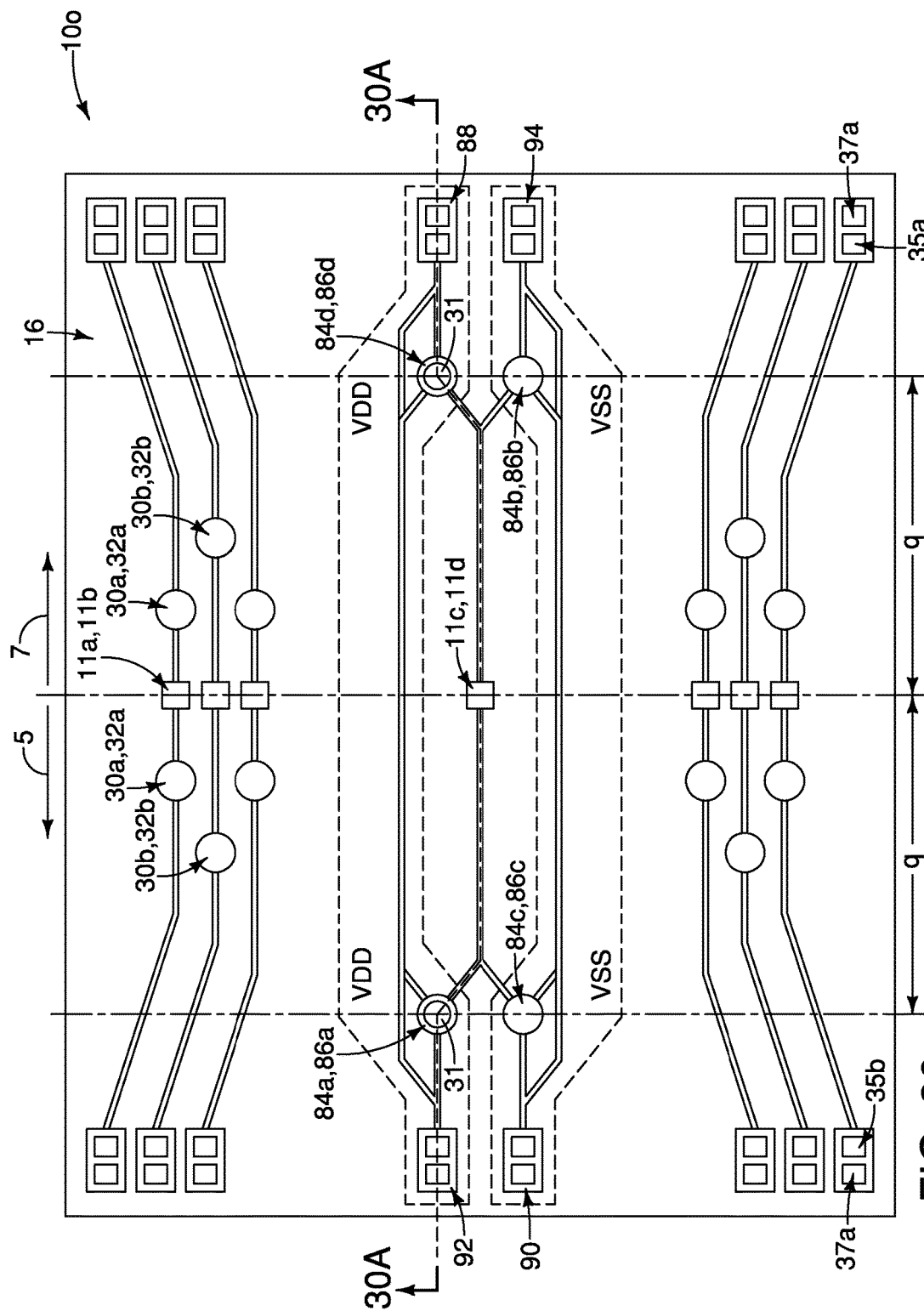
FIGS. 30-33 are diagrammatic top-down views of the two dies of FIG. 29 stacked one atop another in a face-to-face arrangement in each of four different operational states.

Referring to FIG. 30, the first and sixth coupling regions 84a, 86a are electrically coupled to one another through an interconnect 31; and the second and fifth regions 84d, 86d are electrically coupled to one another through an interconnect 31. The regions 84b/86b are not electrically coupled with one another, and the regions 84c/86c are also not electrically coupled with one another. It is noted that the illustrated embodiment has symmetry of regions 84a/86b, 84b/86b, 84c/86c and 84d/86d about the interconnect regions 11c, 11d. Specifically, regions 84a/86a and 84c/86c are offset from interconnect regions 11c, 11d along the second lateral direction (represented by arrow 7) by a same distance "q" as the regions 84b/86b and 84d/86d are offset from interconnect regions 11c, 11d along the first lateral direction (represented by arrow 5).

Figure 31A:
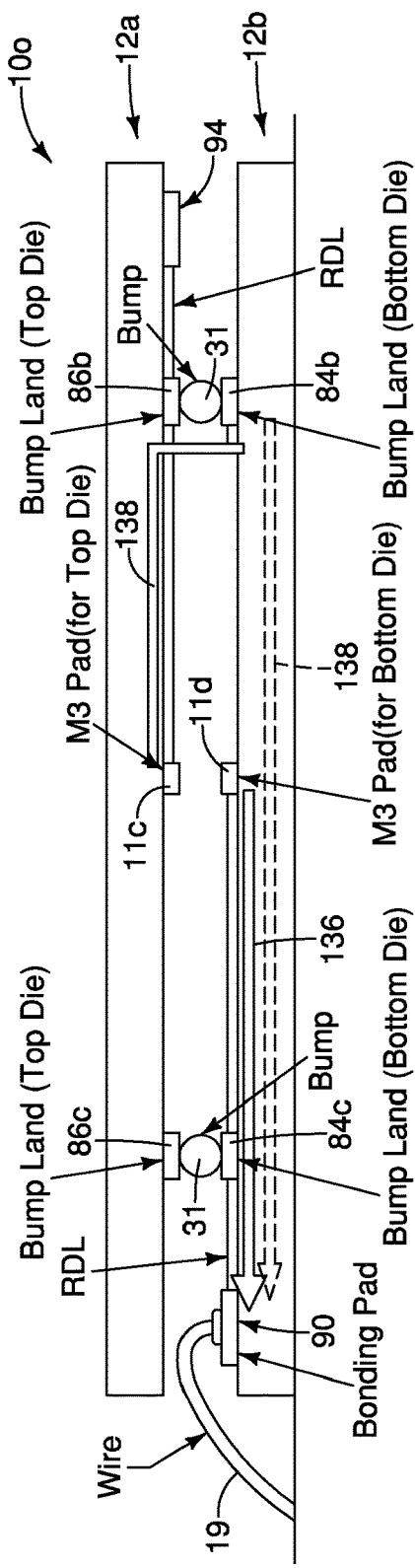
Figure 31:
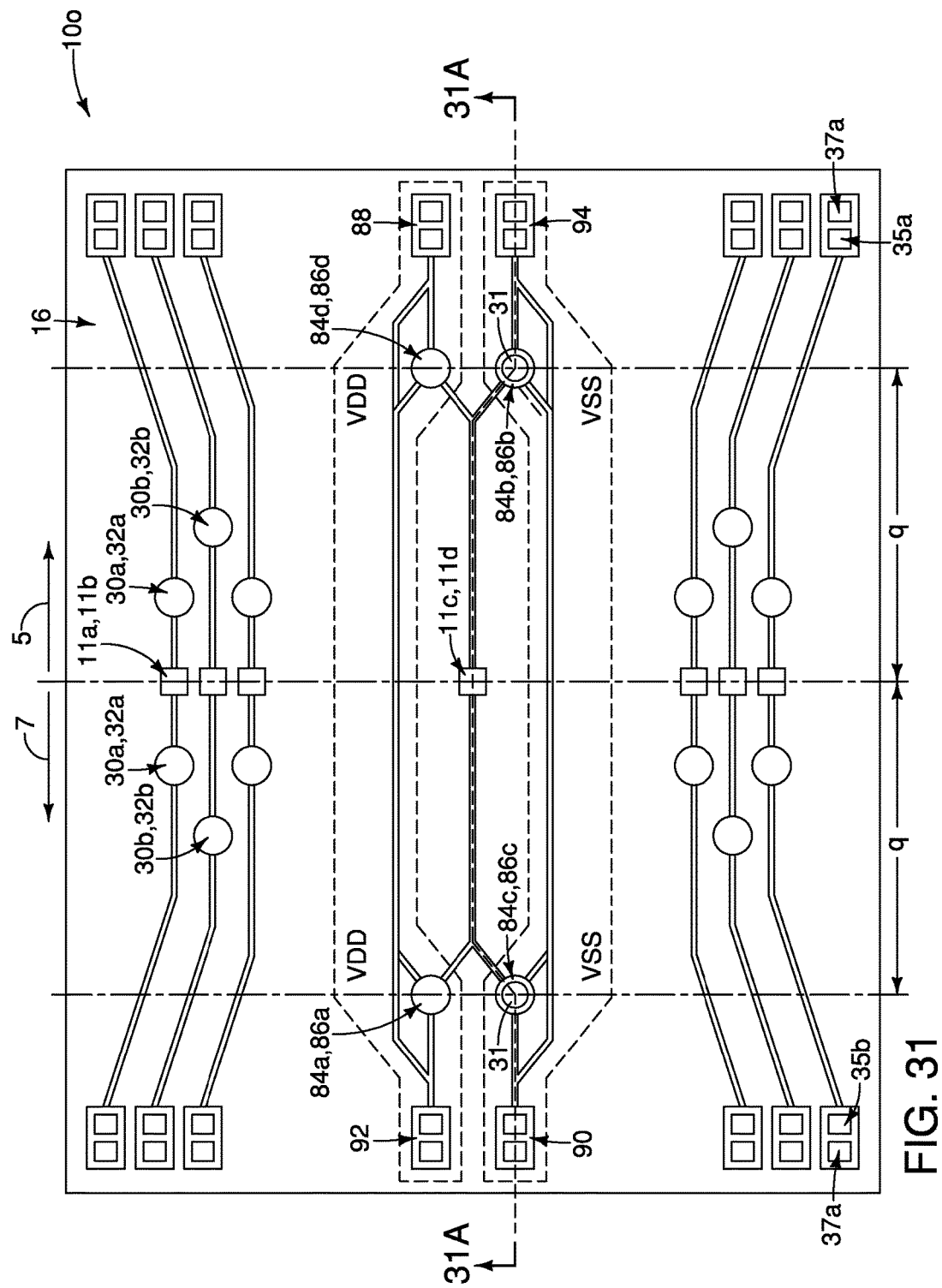

Referring to FIG. 31, the third and eighth coupling regions 84c, 86c are electrically coupled to one another through an interconnect 31; and the fourth and seventh coupling regions 84b/86b are also electrically coupled to one another through an interconnect 31. The regions 84a/86a are not electrically coupled with one another, and the regions 84d/86d are also not electrically coupled with one another.

Figure 32:
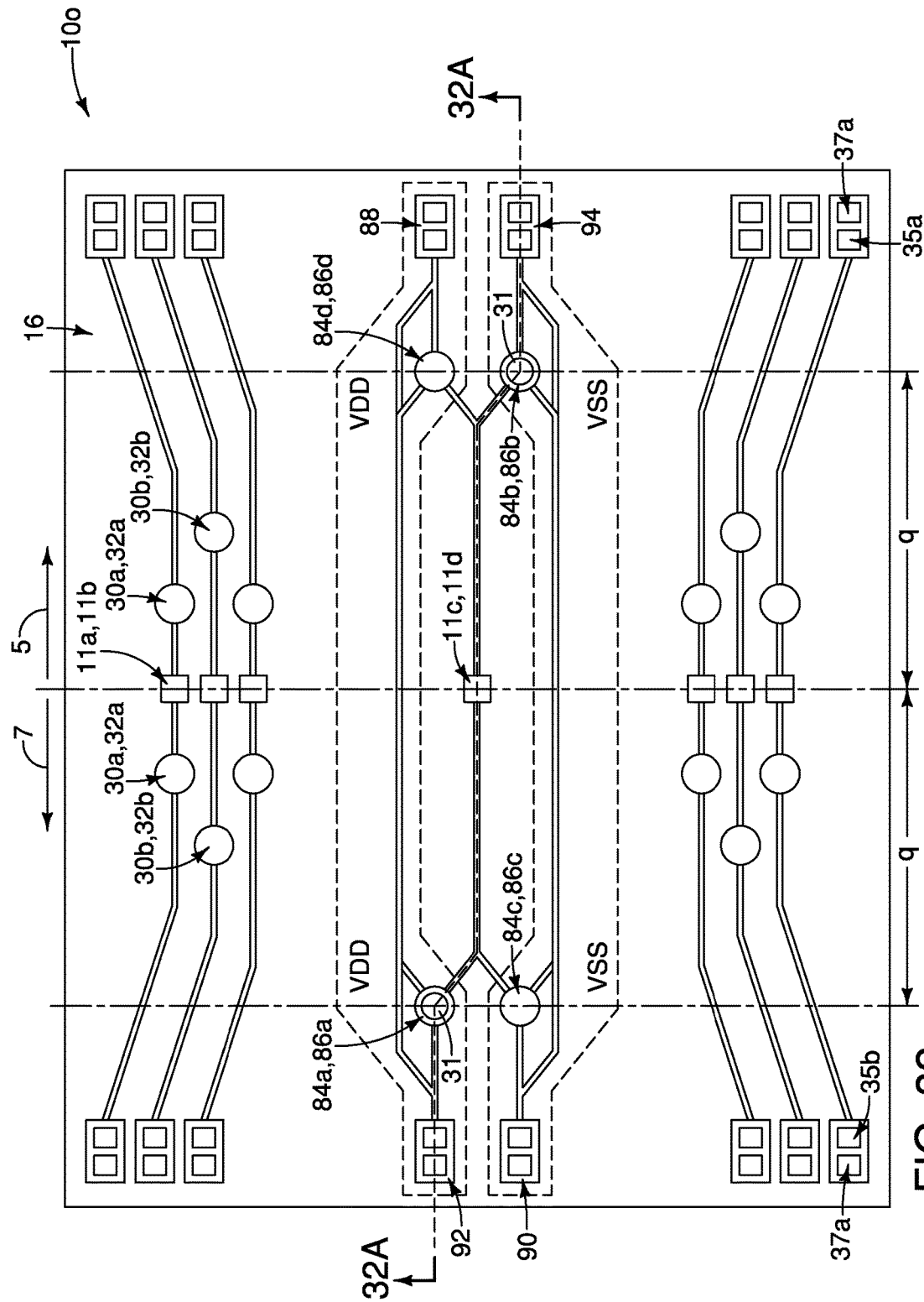

Referring to FIG. 32, the first and sixth coupling regions 84a, 86a are electrically coupled to one another through an interconnect 31; and the fourth and seventh coupling regions 84b, 86b are also electrically coupled to one another through an interconnect 31. The regions 84a/86a are not electrically coupled with one another, and the regions 84d/86d are also not electrically coupled with one another.

Figure 33:
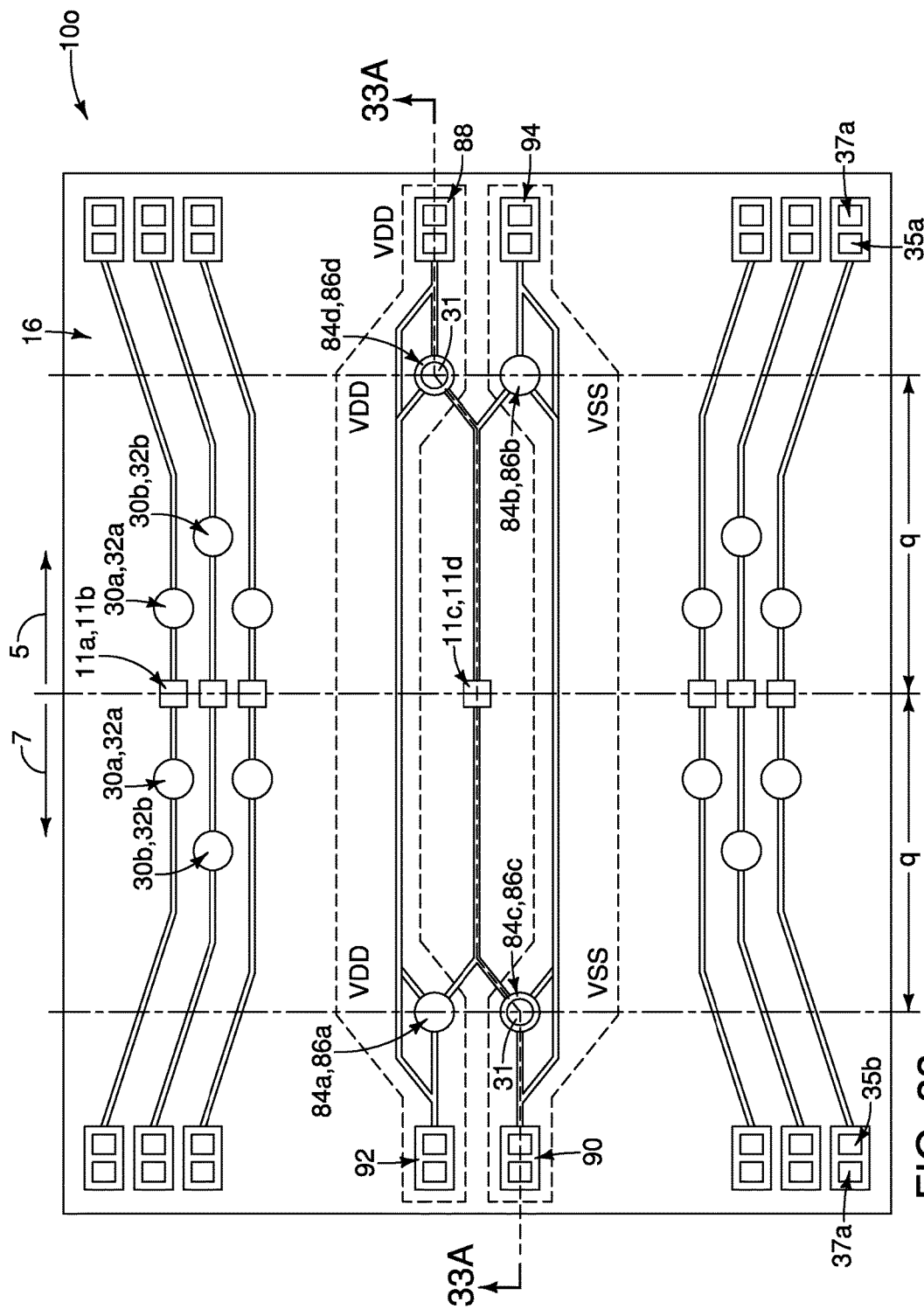

Referring to FIG. 33, the third and eighth coupling regions 84c, 86c are electrically coupled to one another through an interconnect 31; and the second and fifth regions 84d, 86d are electrically coupled to one another through an interconnect 31. The regions 84a/86a are not electrically coupled with one another, and the regions 84b/86b are also not electrically coupled with one another.

Figure 30A:
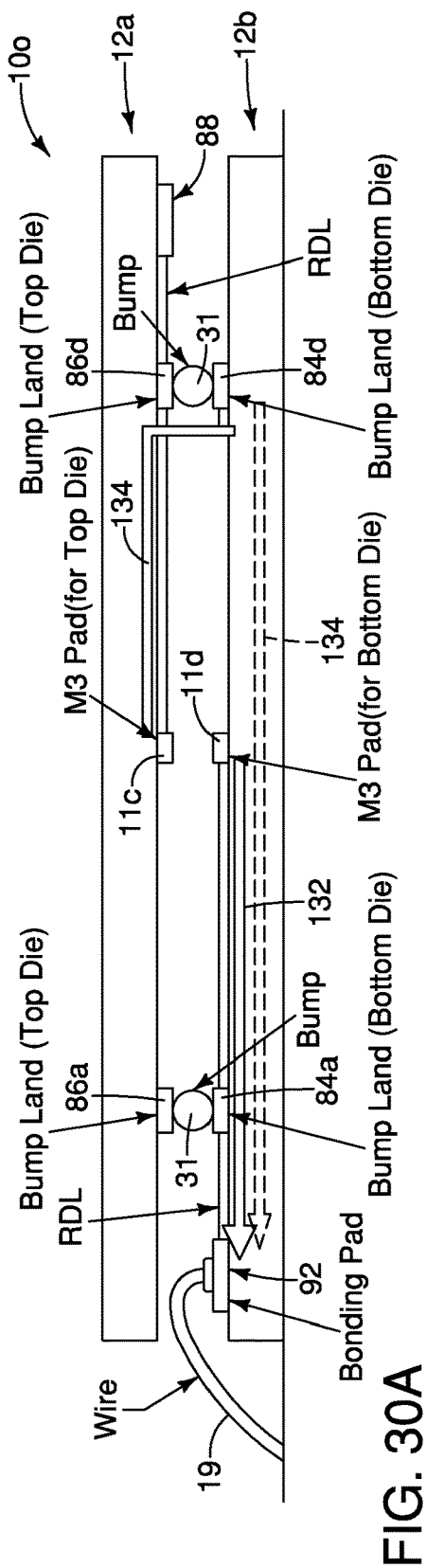

FIG. 30A shows a cross-section through assembly 10o along the line 30A-30A of FIG. 30; FIG. 31A shows a cross-section through assembly 10o along the line 31A-31A of FIG. 31; FIG. 32A shows a cross-section through assembly 10o along the line 32A-32A of FIG. 32; and FIG. 33A shows a cross-section through assembly 10o along the line 33A-33A of FIG. 33. The VDD supply of FIG. 30A includes a path 132 that extends along second die 12b; and a path 134 that extends along both the first die 12a and the second die 12b. The VSS supply of FIG. 31A includes a path 136 that extends along the second die 12b, and a path 138 that extends along both the first die 12a and the second die 12b. The VSS supply of FIG. 32A includes the path 138 in combination with the path 132. The VDD supply of FIG. 33A includes the path 136 in combination with the path 134.

The dies 12a and 12b of FIGS. 29-33 are example dies which may be utilized to fabricate assemblies in which selective coupling of the various regions 84a/86a, 84b/86b, 84c/86d, 84d,86d may enable the supply circuit 80 to be operated in one of multiple modes (i.e., conditions). FIGS. 34 and 35 illustrate other example configurations for the bottom die 12b. Notably, in the configuration of FIG. 29 the first and second pads 92 and 90 (the VDD pad 92 and the VSS pad 90 on the bottom die 12b) are on a same side of the die 12b as one another (and accordingly on the same side of the interconnection region 11d as one another). In contrast, in the embodiment of FIG. 34 the pads 92 and 94 may be considered to be analogous first and second pads (VDD pad and VSS pad on the bottom die 12b), and are on opposite sides of the die 12b relative to one another (and accordingly on opposite sides of the interconnection region 11d relative to one another).

The packages and dies discussed above may be incorporated into electronic systems. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include an apparatus having a first chip and a second chip. Each of the first and second chips comprises: a multilevel wiring structure including a first level wiring layer, a second level wiring layer and an insulating film between the first level wiring layer and the second level wiring layer. A redistribution wiring layer is over the multilevel wiring structure. The redistribution wiring layer includes a redistribution wiring and a pad electrically coupled to the redistribution wiring. The first chip is mounted above the second chip so that the redistribution wiring layer of the first chip faces the redistribution wiring layer of the second chip. The pad of the first chip faces the pad of the second chip, and is vertically spaced from the pad of the second chip by an intervening insulative region. The redistribution wiring of the second chip is electrically coupled to the redistribution wiring of the first chip through a bonding region. The pad of the first chip is electrically coupled to the pad of the second chip through the redistribution wiring of the first chip and the redistribution wiring of the second chip.

Some embodiments include an apparatus having a first die bonded to a second die. The first die has first interconnection regions arranged in a first line extending along a face surface of the first die, and has first redistribution wiring electrically coupled with the first interconnection regions. The first redistribution wiring is comprised by a first redistribution wiring layer that has primary portions extending outwardly from the first interconnection regions in a first lateral direction, and has secondary portions extending outwardly from the first interconnection regions in a second lateral direction opposite to the first lateral direction. The second die has second interconnection regions arranged in a second line extending along a face surface of the second die, and has second redistribution wiring electrically coupled with the second interconnection regions. The second redistribution wiring is comprised by a second redistribution wiring layer which has primary portions extending outwardly from the second interconnection regions in the second lateral direction, and has secondary portions extending outwardly from the second interconnection regions in the first lateral direction. The first die is in face-to-face relationship with the second die. The first interconnection regions are vertically offset from the second interconnection regions. The secondary portions of the first redistribution wiring layers are electrically coupled to the primary regions of the second redistribution wiring layers.

Some embodiments include an apparatus having a first die bonded to a second die. The first die has first interconnection regions arranged in a first line extending along a face surface of the first die, and has first redistribution wiring electrically coupled with the first interconnection regions. The first redistribution wiring is comprised by a first redistribution wiring layer which has primary portions extending outwardly from the first interconnection regions in a first lateral direction, and has secondary portions extending outwardly from the first interconnection regions in a second lateral direction opposite to the first lateral direction. The second die has second interconnection regions arranged in a second line extending along a face surface of the second die, and has second redistribution wiring electrically coupled with the second interconnection regions. The second redistribution wiring is comprised by a second redistribution wiring layer which has primary portions extending outwardly from the second interconnection regions in the second lateral direction, and has secondary portions extending outwardly from the second interconnection regions in the first lateral direction. The first die is in face-to-face relationship with the second die. The first interconnection regions are directly over the second interconnection regions. The secondary portions of the first redistribution wiring layers are electrically coupled to the primary regions of the second redistribution wiring layers. The second redistribution wiring layers extend to bonding pads, with the bonding pads being laterally offset from the second interconnection regions along the second lateral direction, and being along the second die. The bonding pads are laterally outward of the first die along the second lateral direction. One of the first interconnection regions is utilized in a control trace circuit together with one of the second interconnection regions. The control trace circuit includes: a first wiring segment which extends along the first die to said one of the first interconnection regions; a second wiring segment which extends along the second die to said one of the second interconnection regions; and a third wiring segment which extends along the second die and is physically separate from the second wiring segment, the third wiring segment being electrically coupled with the first wiring segment through a first bonding region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An apparatus comprising a first die and a second die, each of the first and second dies including a face-side and a back-side, the face-side of the first die being defined by first and second edges substantially parallel to each other, and the face-side of the second die being defined by third and fourth edges substantially parallel to each other;
    wherein the first die comprises, on the face-side thereof:
        at least one first interconnection region between the first and second edges;
        a first coupling region between the at least one first interconnection region and the first edge;
        a second coupling region between the at least one first interconnection region and the second edge;
        a first redistribution wiring electrically coupling the at least one first interconnection region to the first coupling region;
        a second redistribution wiring electrically coupling the at least one first interconnection region to the second coupling region;
        a first supply circuit including a third coupling region and configured to provide a first voltage to the third coupling region, the third coupling region being between the at least one first interconnection region and the first edge; and
        a second supply circuit including a fourth coupling region and configured to provide a second voltage to the fourth coupling region, the fourth coupling region being between the at least one first interconnection region and the second edge;
    wherein the second die comprises, on the face-side thereof:
        at least one second interconnection region between the third and fourth edges;
        a fifth coupling region between the at least one second interconnection region and the third edge;
        a sixth coupling region between the at least one second interconnection region and the fourth edge;
        a third redistribution wiring electrically coupling the at least one second interconnection region to the fifth coupling region;
        a fourth redistribution wiring electrically coupling the at least one second interconnection region to the sixth coupling region;

a third supply circuit including a seventh coupling region and configured to provide the second voltage to the seventh coupling region, the seventh coupling region being between the at least one second interconnection region and the third edge; and
a fourth supply circuit including an eighth coupling region and configured to provide the first voltage to the eighth coupling region, the eighth coupling region being between the at least one second interconnection region and the fourth edge; and
wherein the first die is bonded to the second die in a face-to-face relationship such that the first, second, third and fourth coupling regions are vertically aligned with the seventh, eighth, fifth and sixth coupling regions, respectively.

2. The apparatus of claim 1, further comprising:
a first interconnect between the second coupling region and the eighth coupling region to electrically couple the second and eighth coupling regions with each other; and
a second interconnect between the third coupling region and the fifth coupling region to electrically couple the third and fifth coupling regions with each other.

3. The apparatus of claim 2, wherein each of the first and second interconnects comprises a solder bump.

4. The apparatus of claim 1, further comprising:
a first interconnect between the first coupling region and the seventh coupling region to electrically couple the first and seventh coupling regions with each other; and
a second interconnect between the fourth coupling region and the sixth coupling region to electrically couple the fourth and sixth coupling regions with each other.

5. The apparatus of claim 4, wherein each of the first and second interconnects comprises a solder bump.

6. The apparatus of claim 1, wherein the first voltage is one of VDD and VSS voltages and the second voltage is the other of the VDD and VSS voltages.

7. An apparatus comprising a first die and a second die, each of the first and second dies including a face-side and a back-side, the face-side of the first die being defined by first and second edges substantially parallel to each other, and the face-side of the second die being defined by third and fourth edges substantially parallel to each other;
wherein the first die comprises, on the face-side thereof:
at least one first interconnection region between the first and second edges;
a first supply circuit including first and second coupling regions and configured to provide a first voltage to each of the first and second coupling regions, the first coupling region being between the at least one first interconnection region and the first edge, and the second coupling region being between the at least one first interconnection region and the second edge;
a second supply circuit including third and fourth coupling regions and configured to provide a second voltage to each of the third and fourth coupling regions, the third coupling region being between the at least one first interconnection region and the first edge, and the fourth coupling region being between the at least one first interconnection region and the second edge; and
a first redistribution wiring including a first portion electrically coupling the at least one first interconnection region, the first coupling region and the third coupling region with each other, a second portion electrically coupling the first coupling region and the second coupling region with each other and a third portion electrically coupling the third coupling region and the fourth coupling regions with each other;
wherein the second die comprises, on the face-side thereof:
at least one second interconnection region between the third and fourth edges;
a third supply circuit including fifth and sixth coupling regions and configured to provide the first voltage to each of the fifth and sixth coupling regions, the fifth coupling region being between the at least one second interconnection region and the third edge, and the sixth coupling region being between the at least one second interconnection region and the fourth edge;
a fourth supply circuit including seventh and eighth coupling regions and configured to provide the second voltage to each of the seventh and eighth coupling regions, the seventh coupling region being between the at least one second interconnection region and the third edge, and the eighth coupling region being between the at least one second interconnection region and the fourth edge; and
a second redistribution wiring including a fourth portion electrically coupling the at least one second interconnection region, the sixth coupling region and the eighth coupling region with each other, a fifth portion electrically coupling the fifth coupling region and the sixth coupling region with each other and a third portion electrically coupling the seventh coupling region and the eighth coupling regions with each other; and
wherein the first die is bonded to the second die in a face-to-face relationship such that the first, second, third and fourth coupling regions are vertically aligned with the fifth, sixth, seventh and eighth coupling regions, respectively.

8. The apparatus of claim 7, further comprising:
a first interconnect between the first and fifth coupling regions to electrically couple the first and fifth coupling regions with each other; and
a second interconnect between the second and sixth coupling regions to electrically couple the second and fifth coupling regions with each other.

9. The apparatus of claim 7, further comprising:
a first interconnect between the third and seventh coupling regions to electrically couple the third and seventh coupling regions with each other; and
a second interconnect between the fourth and eighth coupling regions to electrically couple the fourth and eighth coupling regions with each other.

10. The apparatus of claim 7, further comprising:
a first interconnect between the third and seventh coupling regions to electrically couple the third and seventh coupling regions with each other; and
a second interconnect between the second and sixth coupling regions to electrically couple the second and sixth coupling regions with each other.

11. The apparatus of claim 7, further comprising:
a first interconnect between the first and fifth coupling regions to electrically couple the first and fifth coupling regions with each other; and
a second interconnect between the fourth and eighth coupling regions to electrically couple the fourth and eighth coupling regions with each other.

12. The apparatus of claim 7,
wherein the first supply circuit further includes a first bonding pad between the first coupling and the first edge;
wherein the second supply circuit further includes a second bonding pad between the third coupling and the first edge;
wherein the third supply circuit further includes a third bonding pad between the sixth coupling and the fourth edge; and
wherein the fourth supply circuit further includes a fourth bonding pad between the eighth coupling and the fourth edge.

* * * * *